(12) United States Patent
Benslimane et al.

(10) Patent No.: US 7,880,371 B2
(45) Date of Patent: Feb. 1, 2011

(54) DIELECTRIC COMPOSITE AND A METHOD OF MANUFACTURING A DIELECTRIC COMPOSITE

(75) Inventors: Mohamed Yahia Benslimane, Nordborg (DK); Peter Gravesen, Nordborg (DK)

(73) Assignee: Danfoss A/S, Nordborg (DK)

( * ) Notice: Subject to any disclaimer, the term of this patent is extended or adjusted under 35 U.S.C. 154(b) by 1 day.

(21) Appl. No.: 11/981,470

(22) Filed: Oct. 31, 2007

(65) Prior Publication Data

US 2008/0226878 A1    Sep. 18, 2008

Related U.S. Application Data

(60) Provisional application No. 60/856,532, filed on Nov. 3, 2006.

(51) Int. Cl.
*H01L 41/09* (2006.01)
*H01L 41/18* (2006.01)

(52) U.S. Cl. ..................... 310/367; 310/800

(58) Field of Classification Search ............... 310/363, 310/365, 367, 800
See application file for complete search history.

(56) References Cited

U.S. PATENT DOCUMENTS

| | | | |
|---|---|---|---|
| 2,130,532 A * | 9/1938 | Bailey ................. | 361/511 |
| 2,716,708 A | 8/1955 | Bradfield | |
| 3,109,202 A | 11/1963 | Beckadolph et al. | |
| 3,138,962 A | 6/1964 | Haines, Jr. et al. | |
| 3,544,733 A | 12/1970 | Reylek | |
| 3,565,195 A | 2/1971 | Miller et al. ............. | 177/210 |
| 3,753,294 A | 8/1973 | Attali et al. ............... | 33/133 |
| 3,831,629 A | 8/1974 | Mackal et al. | |
| 3,875,481 A | 4/1975 | Miller et al. ............. | 317/246 |
| 3,898,585 A * | 8/1975 | Heidrich et al. ........... | 372/96 |
| 3,912,830 A | 10/1975 | Murayama et al. | |
| 4,259,607 A | 3/1981 | Noguchi et al. | |
| 4,266,263 A | 5/1981 | Haberl et al. ............. | 361/283 |
| 4,322,877 A * | 4/1982 | Taylor ....................... | 29/25.35 |
| 4,330,730 A | 5/1982 | Kurz et al. ................ | 310/331 |
| 4,370,697 A | 1/1983 | Haberl et al. ............. | 361/283 |
| 4,376,302 A | 3/1983 | Miller ....................... | 367/157 |
| 4,384,394 A | 5/1983 | Lemmonon et al. ....... | 29/25.35 |
| 4,386,386 A | 5/1983 | Akita ....................... | 361/283 |

(Continued)

FOREIGN PATENT DOCUMENTS

DE    30 06 620 A1    9/1981

(Continued)

OTHER PUBLICATIONS

Publication "High-field electrostriction of elastomeric polymer dielectrics for actuation" by Roy Kornbluh, et al., SRI International; SPIE vol. 3669, pp. 149-161; Mar. 1999.

(Continued)

*Primary Examiner*—Thomas M Dougherty
(74) *Attorney, Agent, or Firm*—McCormick, Paulding & Huber LLP

(57) ABSTRACT

A composite for a transducer facilitates an increased actuation force as compared to similar prior art composites for transducers. The composite facilitates increased compliance of the transducer in one direction, an improved reaction time as compared to similar prior art composites for transducers, and provides an increased lifetime of the transducer in which it is applied.

43 Claims, 25 Drawing Sheets

U.S. PATENT DOCUMENTS

| | | | |
|---|---|---|---|
| 4,431,882 A | 2/1984 | Frame | 200/5 |
| 4,494,409 A | 1/1985 | Kondo et al. | 73/651 |
| 4,549,093 A | 10/1985 | Severwright | |
| 4,634,917 A | 1/1987 | Dvorsky et al. | 310/328 |
| 4,640,137 A | 2/1987 | Trull et al. | |
| 4,654,546 A | 3/1987 | Kirjavainen | 307/400 |
| 4,731,694 A | 3/1988 | Grabner et al. | 361/280 |
| 4,825,116 A | 4/1989 | Itoh et al. | 310/335 |
| 4,829,812 A | 5/1989 | Parks et al. | 73/12 |
| 4,836,033 A | 6/1989 | Seitz | 73/862.04 |
| 4,852,443 A | 8/1989 | Duncan et al. | 84/1.04 |
| 4,866,412 A | 9/1989 | Rzepczynski | 338/114 |
| 4,879,698 A | 11/1989 | Langberg | 367/140 |
| 4,986,136 A | 1/1991 | Brunner et al. | 73/862.04 |
| 5,060,527 A | 10/1991 | Burgess | 73/862.68 |
| 5,090,246 A | 2/1992 | Colla et al. | 73/718 |
| 5,090,248 A | 2/1992 | Cimmino et al. | 73/780 |
| 5,115,680 A | 5/1992 | Lew | 73/763 |
| 5,172,024 A | 12/1992 | Broussoux et al. | |
| 5,173,162 A | 12/1992 | Hagimura et al. | 204/299 |
| 5,255,972 A | 10/1993 | Shirasu | 60/528 |
| 5,259,099 A | 11/1993 | Banno et al. | |
| 5,300,813 A | 4/1994 | Joshi et al. | |
| 5,321,332 A | 6/1994 | Toda | 310/322 |
| 5,325,012 A | 6/1994 | Sato et al. | |
| 5,341,062 A * | 8/1994 | Cero et al. | 310/339 |
| 5,410,210 A | 4/1995 | Sato et al. | 310/363 |
| 5,425,275 A | 6/1995 | Lockshaw | 73/775 |
| 5,447,076 A | 9/1995 | Ziegler | 73/862.626 |
| 5,449,002 A | 9/1995 | Goldman | 128/779 |
| 5,515,341 A * | 5/1996 | Toda et al. | 367/140 |
| 5,528,452 A | 6/1996 | Ko | 361/283.4 |
| 5,548,564 A | 8/1996 | Smith | 367/140 |
| 5,559,387 A | 9/1996 | Beurrier | |
| 5,642,015 A | 6/1997 | Whitehead et al. | |
| 5,755,909 A | 5/1998 | Gailus | 156/229 |
| 5,817,099 A | 10/1998 | Skolik et al. | |
| 5,841,143 A | 11/1998 | Tuma et al. | 250/458.1 |
| 5,888,646 A * | 3/1999 | Takahashi et al. | 428/336 |
| 5,891,065 A | 4/1999 | Cariapa et al. | |
| 5,977,685 A | 11/1999 | Kurita et al. | 310/311 |
| 6,008,580 A | 12/1999 | Nakamura et al. | |
| 6,008,582 A | 12/1999 | Asano et al. | |
| 6,108,175 A * | 8/2000 | Hawwa et al. | 360/294.4 |
| RE37,065 E | 2/2001 | Grahn | 73/628 |
| 6,208,065 B1 | 3/2001 | Ueyama | |
| 6,210,514 B1 | 4/2001 | Cheung et al. | 156/241 |
| 6,255,758 B1 * | 7/2001 | Cabuz et al. | 310/309 |
| 6,282,956 B1 | 9/2001 | Okada | 73/504.12 |
| 6,343,129 B1 | 1/2002 | Pelrine et al. | 381/191 |
| 6,376,971 B1 | 4/2002 | Pelrine et al. | 310/363 |
| 6,411,015 B1 * | 6/2002 | Toda | 310/334 |
| 6,437,489 B1 | 8/2002 | Shinke et al. | 310/369 |
| 6,543,110 B1 | 4/2003 | Pelrine et al. | 29/25.35 |
| 6,545,384 B1 | 4/2003 | Pelrine et al. | 310/309 |
| 6,545,395 B2 | 4/2003 | Matsui et al. | 310/369 |
| 6,581,481 B1 | 6/2003 | Perusek | 73/862.337 |
| 6,583,533 B2 | 6/2003 | Pelrine et al. | 310/309 |
| 6,586,859 B2 | 7/2003 | Kornbluh et al. | 310/309 |
| 6,628,040 B2 | 9/2003 | Pelrine et al. | 310/307 |
| 6,662,658 B2 | 12/2003 | Foote | 73/514.29 |
| 6,664,718 B2 | 12/2003 | Pelrine et al. | 310/800 |
| 6,700,304 B1 * | 3/2004 | Fuller et al. | 310/321 |
| 6,700,312 B2 | 3/2004 | Iizuka et al. | |
| 6,707,236 B2 | 3/2004 | Pelrine et al. | 310/800 |
| 6,759,769 B2 * | 7/2004 | Kirjavainen | 307/400 |
| 6,768,246 B2 | 7/2004 | Pelrine et al. | 310/339 |
| 6,781,284 B1 | 8/2004 | Pelrine et al. | 310/330 |
| 6,806,621 B2 | 10/2004 | Heim et al. | 310/328 |
| 6,809,462 B2 | 10/2004 | Pelrine et al. | 310/800 |
| 6,812,624 B1 | 11/2004 | Pei et al. | 310/800 |
| 6,876,135 B2 | 4/2005 | Pelrine et al. | 310/339 |
| 6,882,086 B2 | 4/2005 | Kornbluh et al. | 310/328 |
| 6,891,317 B2 | 5/2005 | Pei et al. | 310/800 |
| 6,911,764 B2 | 6/2005 | Pelrine et al. | 310/328 |
| 6,940,211 B2 | 9/2005 | Pelrine et al. | 310/330 |
| 7,034,432 B1 | 4/2006 | Pelrine et al. | 310/309 |
| 7,049,732 B2 | 5/2006 | Pei et al. | 310/800 |
| 7,064,472 B2 | 6/2006 | Pelrine et al. | 310/324 |
| 7,104,146 B2 | 9/2006 | Benslimane | 73/862.626 |
| 7,211,937 B2 | 5/2007 | Kornbluh et al. | |
| 7,518,284 B2 | 4/2009 | Benslimane et al. | |
| 7,548,015 B2 * | 6/2009 | Benslimane et al. | 310/367 |
| 7,573,064 B2 * | 8/2009 | Benslimane et al. | 257/48 |
| 2001/0026165 A1 | 10/2001 | Pelrine et al. | 324/750 |
| 2001/0035723 A1 | 11/2001 | Pelrine et al. | 318/116 |
| 2002/0008445 A1 | 1/2002 | Pelrine et al. | 310/330 |
| 2002/0041017 A1 | 4/2002 | Hauser et al. | |
| 2002/0050768 A1 | 5/2002 | Beck et al. | 310/334 |
| 2002/0130673 A1 | 9/2002 | Pelrine et al. | 324/727 |
| 2002/0175594 A1 | 11/2002 | Kornbluh et al. | 310/317 |
| 2002/0175598 A1 | 11/2002 | Heim et al. | 310/328 |
| 2002/0185937 A1 | 12/2002 | Heim et al. | 310/339 |
| 2003/0006669 A1 | 1/2003 | Pei et al. | 310/309 |
| 2003/0066741 A1 | 4/2003 | Burgess et al. | 200/61.43 |
| 2003/0067245 A1 | 4/2003 | Pelrine et al. | 310/311 |
| 2003/0125781 A1 | 7/2003 | Dohno et al. | 607/75 |
| 2003/0141473 A1 | 7/2003 | Pelrine et al. | 251/129.06 |
| 2003/0141787 A1 | 7/2003 | Pelrine et al. | 310/365 |
| 2003/0213960 A1 | 11/2003 | Kitagawa et al. | |
| 2003/0214199 A1 | 11/2003 | Heim et al. | 310/309 |
| 2004/0008853 A1 | 1/2004 | Pelrine et al. | 381/191 |
| 2004/0012301 A1 | 1/2004 | Benslimane et al. | 310/311 |
| 2004/0056567 A1 | 3/2004 | Menzel | |
| 2004/0124738 A1 | 7/2004 | Pelrine et al. | 310/307 |
| 2004/0217671 A1 | 11/2004 | Rosenthal et al. | 310/328 |
| 2004/0232807 A1 | 11/2004 | Pelrine et al. | 310/800 |
| 2004/0263028 A1 | 12/2004 | Pei et al. | 310/800 |
| 2005/0040736 A1 | 2/2005 | Topliss et al. | 310/367 |
| 2005/0104145 A1 | 5/2005 | Benslimane et al. | 257/415 |
| 2005/0157893 A1 | 7/2005 | Pelrine et al. | 381/190 |
| 2006/0016275 A1 | 1/2006 | Gravesen et al. | 73/862.042 |
| 2006/0066183 A1 | 3/2006 | Benslimand et al. | 310/369 |
| 2006/0079824 A1 | 4/2006 | Munch-Fals et al. | |
| 2006/0113878 A1 | 6/2006 | Pei et al. | 310/363 |
| 2006/0113880 A1 | 6/2006 | Pei et al. | 310/800 |
| 2006/0119225 A1 | 6/2006 | Heim et al. | 310/339 |
| 2006/0158065 A1 | 7/2006 | Pelrine et al. | 310/328 |
| 2007/0114885 A1 | 5/2007 | Benslimane et al. | |
| 2007/0116858 A1 | 5/2007 | Benslimane et al. | |
| 2007/0269585 A1 | 11/2007 | Benslimane et al. | |
| 2007/0277356 A1 | 12/2007 | Benslimane et al. | |
| 2008/0038860 A1 | 2/2008 | Benslimane et al. | |
| 2008/0093954 A1 | 4/2008 | Benslimand et al. | |
| 2008/0226878 A1 | 9/2008 | Benslimane et al. | |
| 2008/0238258 A1 | 10/2008 | Ishiguro et al. | |
| 2008/0265709 A1 | 10/2008 | Clausen et al. | |
| 2009/0064476 A1 * | 3/2009 | Cross et al. | 29/25.35 |
| 2009/0072658 A1 | 3/2009 | Benslimane et al. | |
| 2009/0169829 A1 | 7/2009 | Benslimane et al. | |
| 2009/0239039 A1 | 9/2009 | Benslimane et al. | |

FOREIGN PATENT DOCUMENTS

| | | |
|---|---|---|
| DE | 30 23 218 A1 | 2/1982 |
| DE | 38 41 243 A1 | 6/1990 |
| DE | 198 26 391 A1 | 12/1999 |
| DE | 200 04 248 U1 | 8/2000 |
| DE | 100 54 247 A1 | 5/2002 |
| EP | 0 387 180 A1 | 9/1990 |
| EP | 0 855 307 B1 | 3/2003 |
| EP | 148 1738 A2 | 12/2004 |
| FR | 2 309 833 | 12/1976 |
| FR | 2 793 937 A1 | 11/2000 |

| | | | |
|---|---|---|---|
| GB | 2042256 A * | 9/1980 | |
| JP | 55-42474 | 3/1980 | |
| JP | 55-91299 | 7/1980 | |
| JP | 1-273372 | 11/1989 | |
| JP | 2002-237625 | 8/2003 | |
| JP | 2005-117103 | 4/2005 | |
| JP | 2007-11206 A * | 1/2007 | |
| JP | 2008-205180 A * | 9/2008 | |
| KR | 90-1465 | 3/1990 | |
| WO | WO 96/34701 | 11/1996 | |
| WO | WO 97/27822 | 8/1997 | |
| WO | WO 00/66970 | 11/2000 | |
| WO | WO 01/06575 A1 | 1/2001 | |
| WO | WO 01/06579 A2 | 1/2001 | |
| WO | WO 01/58973 A2 | 8/2001 | |
| WO | WO 01/59852 A3 | 8/2001 | |
| WO | WO 01/63738 A2 | 8/2001 | |
| WO | WO 01/65615 A3 | 9/2001 | |
| WO | WO 02/37660 A1 | 5/2002 | |
| WO | WO 2004/079832 A2 | 9/2004 | |
| WO | WO 2005/079187 A2 | 9/2005 | |
| WO | WO 2005/081676 A2 | 9/2005 | |

OTHER PUBLICATIONS

Publication Micro-Electro-Mechanical Systems (MEMS)—2000-; by R. Trujillo, et al.; Presented at 2000 ASIME International Mechanical Engineering Congress and Exposition, Nov. 5-10, 2000; Orland, FL; pp. 709-716.

International Search Report for Serial No. PCT/DK03/00603 dated Feb. 5, 2004.

PCT Search Report for Serial No. PCT/DK03/00848 dated Mar. 25, 2004.

Article entitled "Electrostrictive Polymer Artificial Muscle Actuators" by R. Kornbluh, et al., SRI International, Proceedings of the 1998 IEEE International Conference on Robotics & Automation, Belgium, May 1998; pp. 2147-2154.

Article entitled "Spontaneous formation of ordered structures in thin films of metals supported on an elastomeric polymer" by Ned Bowden, et al., Nature, vol. 393, May 14, 1998; pp. 146-149.

Article entitled "Silicone Elastomers with Controlled Surface Composition Using Argon or Hydrogen Plasma Treatment" by B. Orlander, et al., Journal of Applied Polymer Science, vol. 90, 2003 Wiley Periodicals, Inc.; pp. 1378-1383.

* cited by examiner

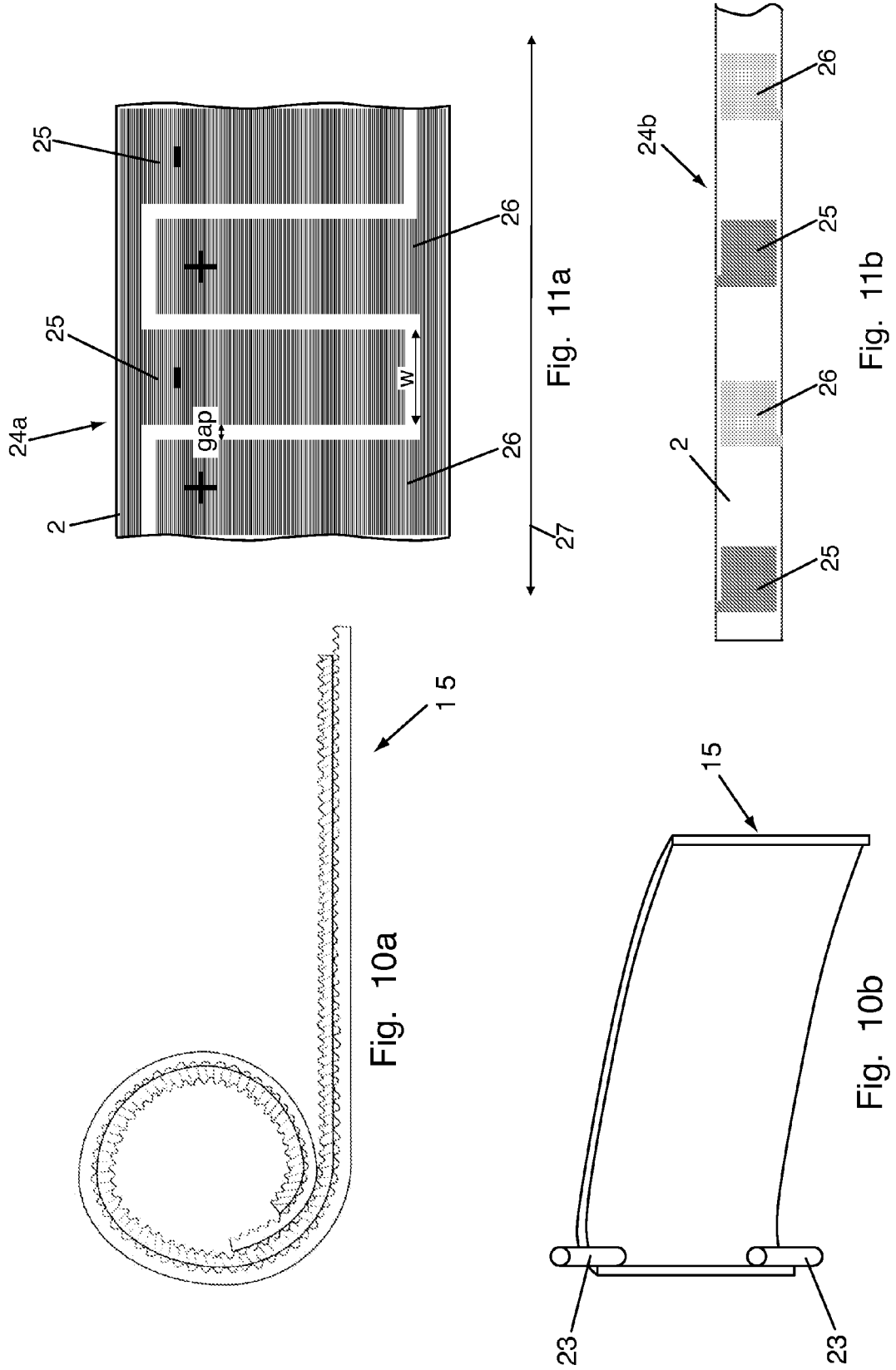

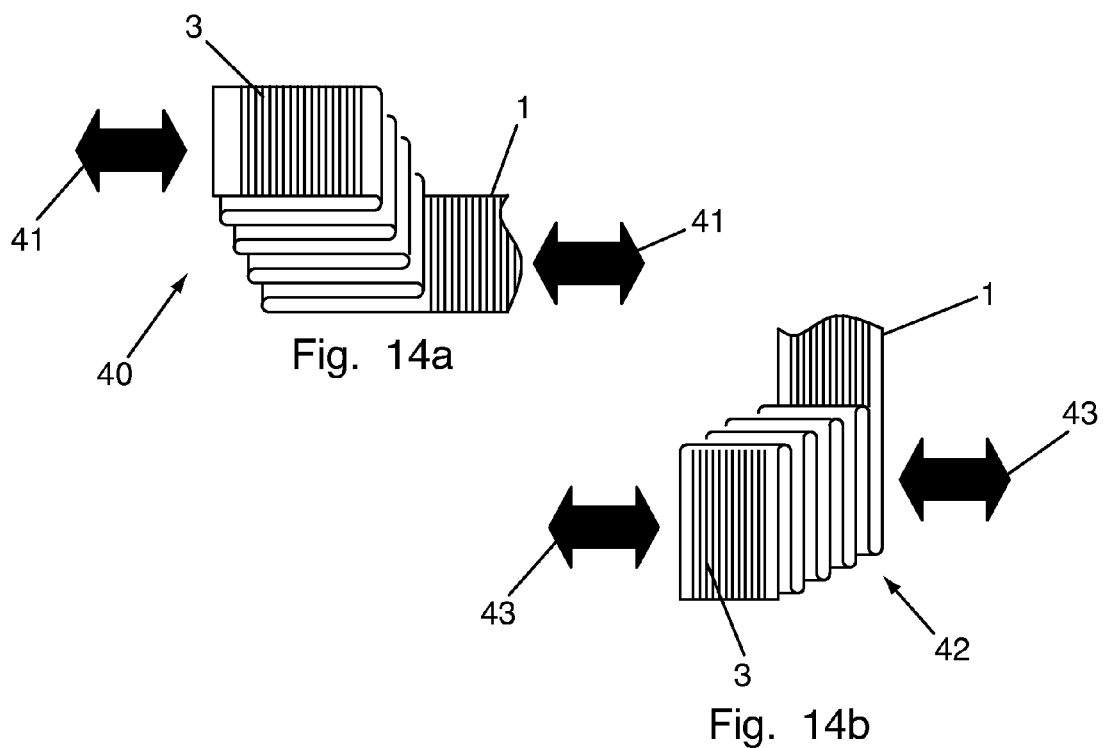
Fig. 14a
Fig. 14b
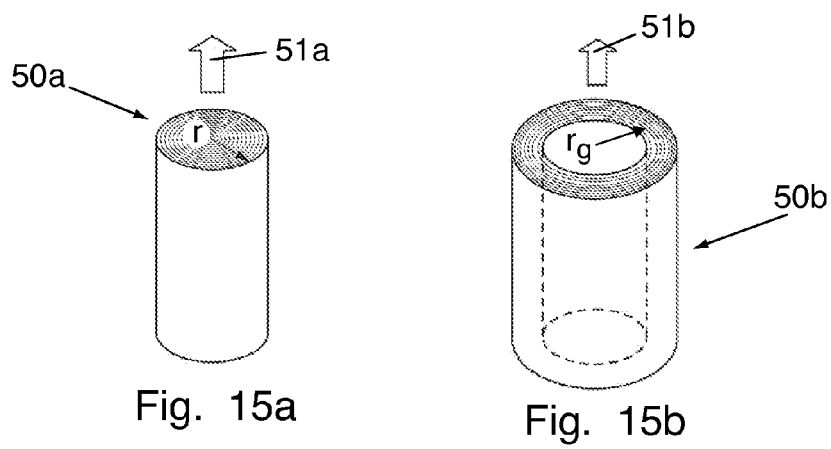
Fig. 15a
Fig. 15b
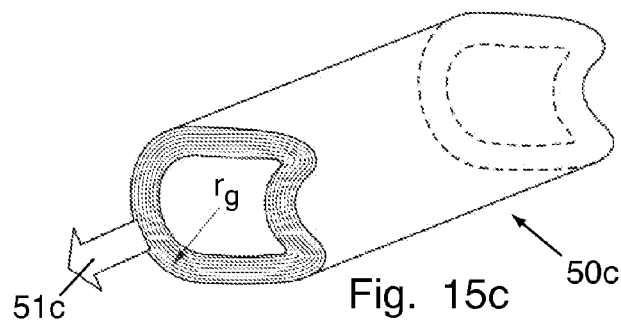
Fig. 15c

Actuation force versus stroke

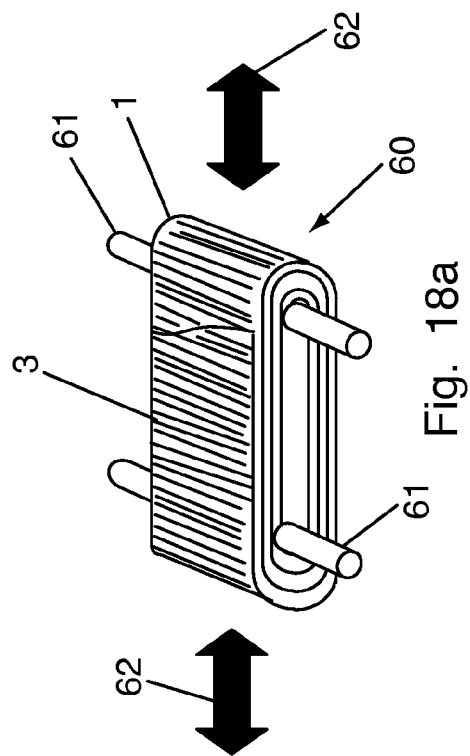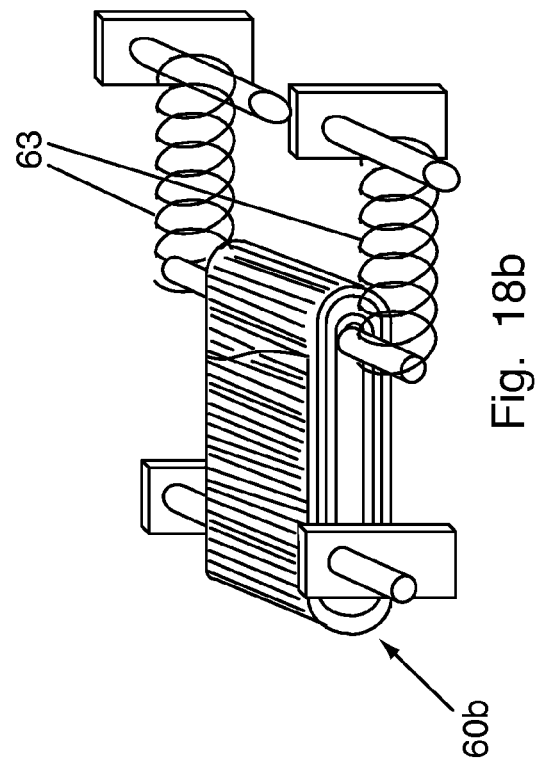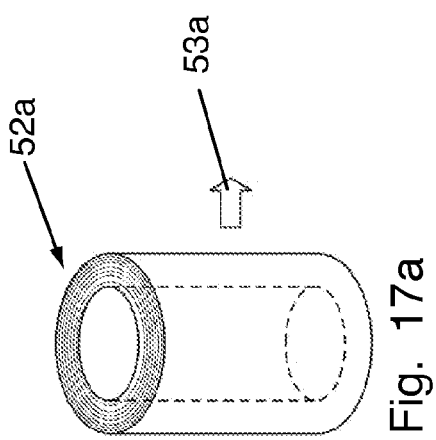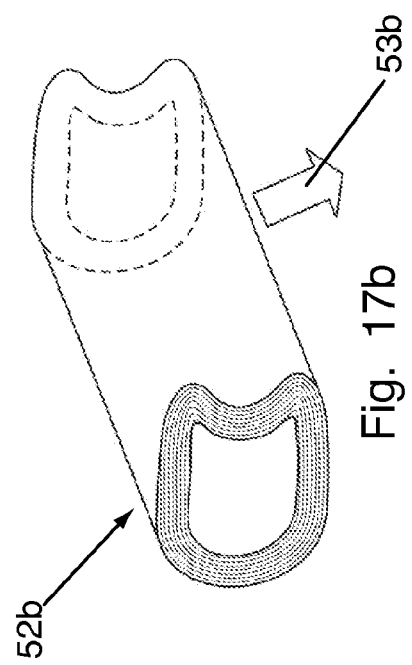

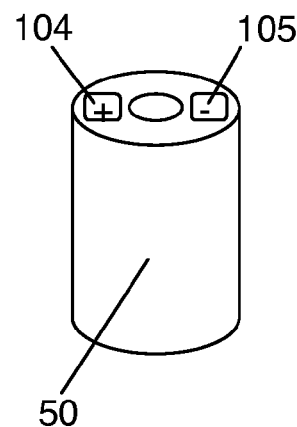
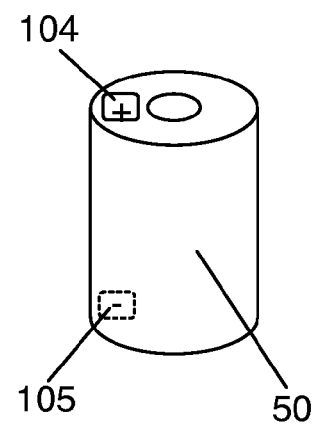
Fig. 26
Fig. 27
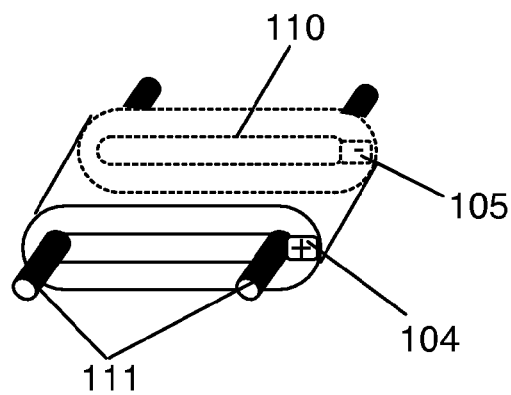
Fig. 28
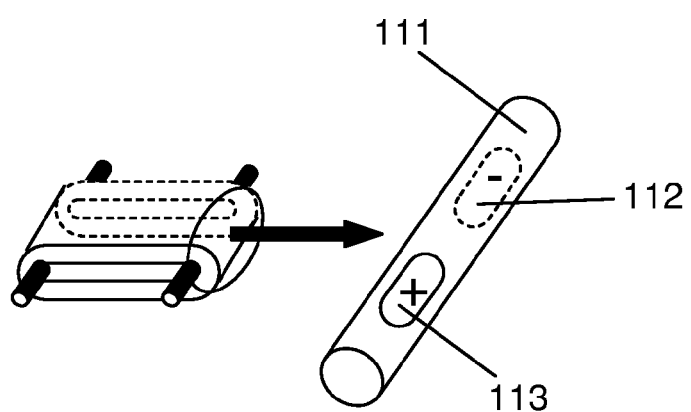
Fig. 29

DIELECTRIC COMPOSITE AND A METHOD OF MANUFACTURING A DIELECTRIC COMPOSITE

CROSS REFERENCE TO RELATED APPLICATIONS

This application is entitled to the benefit of and incorporates by reference essential subject matter disclosed in Provisional Patent Application Ser. No. 60/856,532 filed on Nov. 3, 2006.

FIELD OF THE INVENTION

The present invention relates generally to the field of micro-electro-mechanical systems (MEMS) and micromechanically designed structures. More specifically, the present invention relates to a micromechanical design of a mechanical structure which substantially modifies its macromechanical properties. Even more specifically, the invention relates to micromechanically shaping a dielectric film to give it unique mechanical properties, which reach through to the macroscopic mechanical properties of transducers made by the film.

BACKGROUND OF THE INVENTION

An electrical potential difference between two electrodes located on opposite surfaces of an elastomeric body generates an electric field leading to a force of attraction. As a result, the distance between the electrodes changes and the change leads to compression of the elastomeric material which is thereby deformed. Due to certain similarities with a muscle, an elastomer actuator is sometimes referred to as an artificial muscle.

U.S. Pat. No. 6,376,971 discloses a compliant electrode which is positioned in contact with a polymer in such a way, that when applying a potential difference across the electrodes, the electric field arising between the electrodes contracts the electrodes against each other, thereby deflecting the polymer. Since the electrodes are of a substantially rigid material, they must be made textured in order to make them compliant.

The electrodes are described as having an 'in the plane' or 'out of the plane' compliance. In U.S. Pat. No. 6,376,971 the out of the plane compliant electrodes may be provided by stretching a polymer more than it will normally be able to stretch during actuation and a layer of stiff material is deposited on the stretched polymer surface. For example, the stiff material may be a polymer that is cured while the electroactive polymer is stretched. After curing, the electroactive polymer is relaxed and the structure buckles to provide a textured surface. The thickness of the stiff material may be altered to provide texturing on any scale, including submicrometer levels. Alternatively, textured surfaces may be produced by reactive ion etching (RIE). By way of example, RIE may be performed on a pre-strained polymer comprising silicon with an RIE gas comprising 90 percent carbon tetrafluoride and 10 percent oxygen to form a surface with wave troughs and crests of 4 to 5 micrometers in depth. As another alternative, the electrodes may be adhered to a surface of the polymer. Electrodes adhering to the polymer are preferably compliant and conform to the changing shape of the polymer. Textured electrodes may provide compliance in more than one direction. A rough textured electrode may provide compliance in orthogonal planar directions.

Also in U.S. Pat. No. 6,376,971 there is disclosed a planar compliant electrode being structured and providing one-directional compliance, where metal traces are patterned in parallel lines over a charge distribution layer, both of which cover an active area of a polymer. The metal traces and charge distribution layer are applied to opposite surfaces of the polymer. The charge distribution layer facilitates distribution of charge between metal traces and is compliant. As a result, the structured electrode allows deflection in a compliant direction perpendicular to the parallel metal traces. In general, the charge distribution layer has a conductance greater than the electroactive polymer but less than the metal traces.

The polymer may be pre-strained in one or more directions. Pre-strain may be achieved by mechanically stretching a polymer in one or more directions and fixing it to one or more solid members (e.g., rigid plates) while strained. Another technique for maintaining pre-strain includes the use of one or more stiffeners. The stiffeners are long rigid structures placed on a polymer while it is in a pre-strained state, e.g. while it is stretched. The stiffeners maintain the pre-strain along their axis. The stiffeners may be arranged in parallel or according to other configurations in order to achieve directional compliance of the transducer.

Compliant electrodes disclosed in U.S. Pat. No. 6,376,971 may comprise conductive grease, such as carbon grease or silver grease, providing compliance in multiple directions, or the electrodes may comprise carbon fibrils, carbon nanotubes, mixtures of ionically conductive materials or colloidal suspensions. Colloidal suspensions contain submicrometer sized particles, such as graphite, silver and gold, in a liquid vehicle.

The polymer may be a commercially available product such as a commercially available acrylic elastomer film. It may be a film produced by casting, dipping, spin coating or spraying.

Textured electrodes known in the prior art may, alternatively, be patterned photolithographically. In this case, a photoresist is deposited on a pre-strained polymer and patterned using a mask. Plasma etching may remove portions of the electroactive polymer not protected by the mask in a desired pattern. The mask may be subsequently removed by a suitable wet etch. The active surfaces of the polymer may then be covered with the thin layer of gold deposited by sputtering, for example.

Producing electroactive polymers, and in particular rolled actuators, using the technique described in U.S. Pat. No. 6,376,971 and U.S. Pat. No. 6,891,317 has the disadvantage that direction of compliance of the corrugated electrodes is very difficult to control.

Finally, in order to obtain the necessary compliance using the prior art technology, it is necessary to use materials having a relatively high electrical resistance for the electrodes. Since a rolled actuator with a large number of windings will implicitly have very long electrodes, the total electrical resistance for the electrodes will be very high. The response time for an actuator of this kind is given by $\tau = R \cdot C$, where R is the total electrical resistance of the electrodes and C is the capacitance of the composite. Thus, a high total electrical resistance results in a very long response time for the actuator. Thus, in order to obtain an acceptable response time, the number of windings must be limited, and thereby the actuation force is also limited, i.e. response time and actuation force must be balanced when the actuator is designed.

SUMMARY OF THE INVENTION

It is an object of a preferred embodiment of the invention to provide a composite for a transducer, which composite facilitates an increased actuation force as compared to similar prior art composites for transducers. It is a further object of the invention to provide a composite which facilitates increased compliance of the transducer in one direction, facilitates an improved reaction time as compared to similar prior art composites for transducers, and which potentially provides an increased lifetime of the transducer in which it is applied. In this regards, compliance means that it is easy to stretch the composite in one direction.

According to a first aspect of the invention the above and other objects are fulfilled by a composite in which a film of a dielectric material has a first surface and second surface, at least the first surface comprising a surface pattern of raised and depressed surface portions. A first electrically conductive layer is deposited onto the surface pattern and forms an electrode layer thereon. To enable elongation of the composite in one well defined direction, i.e. to provide compliance, the electrically conductive layer has a corrugated shape which renders the length of the electrically conductive layer in a lengthwise direction, longer than the length of the composite as such in the lengthwise direction. The corrugated shape of the electrically conductive layer thereby facilitates that the composite can be stretched in the lengthwise direction without having to stretch the electrically conductive layer in that direction, but merely by evening out the corrugated shape of the electrically conductive layer. According to the invention, the corrugated shape of the electrically conductive layer is a replica of the surface pattern of the film.

Since the conductive layer is deposited onto the surface pattern of the film and is formed by the shape thereof, a very precise shape of the corrugation of the conductive layer can be defined, and an improved compliance towards deformation in a specific direction can be provided by a suitable design of the surface pattern on the film. Accordingly, the composite can facilitate increased actuation forces, or in general an increased rate of conversion between mechanical and electrical energies, increased lifetime and improved reaction time when the composite is used in a transducer.

In the prior art composites, the pattern of the film and electrode is provided by stretching the film prior to the application of the electrode on the surface of the film. When the stretch of the film is released, the electrode wrinkles, and since the electrode is bonded to the film, the surface of the film wrinkles with the electrode. Since the shape of the electrically conductive layer in accordance with the present invention is a replica of the shape of the surface pattern of the film, it may be provided that the shape of the composite as such is unaffected by the contact and bonding between the electrically conductive layer and the film. It may further be provided that the shape is essentially unaffected by elastic moduli of the electrically conductive layer and film. It may further be unaffected by the thickness of the electrically conductive layer and film. This provides a larger degree of freedom with respect to the selection of materials for the film and for the electrically conductive layer and thus enables improved performance of the composite when used in a transducer.

To restrict deformation of the composite in other directions than the direction of compliance, the electrically conductive layer may have a modulus of elasticity much higher than a modulus of elasticity of the film. Accordingly, the electrically conductive layer resists elongation and thus prevents deformation of the composite in directions in which the length of the electrically conductive layer corresponds to the length of the composite as such.

The composite is provided with at least one surface with an electrically conductive layer. One surface is not sufficient to create an active composite in which the film can be deformed by a potential difference between two electrically conductive layers on opposite surfaces. In the following, the abbreviation, inactive composite is used for a composite with a single surface electrically conductive layer and an active composite is used for a composite with a double surface electrically conductive layer.

The composite according to the invention can be made active by applying additional composites in a layered structure. A first electrically conductive layer of one layer becomes a second electrically conductive layer of an adjacent layer. This is described in further details later. Another way of making the composite active is to apply an additional electrically conductive layer onto an opposite surface of the film.

In order to benefit the most from the composite, e.g. in a transducer comprising a composite which is curled or wound to form a rolled structure with a larger number of layers or windings, it is preferred to provide the composite as a very long web. In this context, a web denotes something which is potentially unlimited in length and which can therefore be provided as a spooled product similar to cling-wrap, cling-film or household foil. In general, the web is at least 10 times longer in a lengthwise direction than in a perpendicular crosswise direction, but it may even be 100, 1000 or more times longer in the lengthwise direction.

The surface pattern and thus the corrugations define a compliance direction in which the composite is mostly compliant, and this direction could be anything from the lengthwise direction to the crosswise direction.

As mentioned above, the surface pattern leads to a designed anisotropic compliance. The anisotropic compliance is caused by the electrically conductive layer. Since the surface pattern creates an electrically conductive layer with a length in one direction being substantially longer than the length of the composite as such, the composite can be stretched in one direction without stretching the electrically conductive layer. This provides the compliance in this direction. Conversely, the lack of compliance in other directions is also provided by the same electrically conductive layer because it is substantially less elastically deformable than the film. Preferably, the ratio between a modulus of elasticity of the electrically conductive layer and a modulus of elasticity of the film is larger than 200.

The production of the film can be made in a moulding or coating process after which the electrically conductive layer is applied so that it follows the surface pattern of the film. The electrically conductive film is formed as a replica of the film's surface pattern when the electrically conductive layer is deposited onto the film. The film, on the other hand, could likewise be made by providing a liquid material onto a shape defining element, e.g. in a moulding, coating or painting process, and subsequently allowing the liquid material to cure to form a film.

In the present context the term 'dielectric material' should be interpreted to mean a material having a relative permittivity, $\in_r$, which is larger than or equal to 2.

The dielectric material may be a polymer, e.g. an elastomer, such as a silicone elastomer, such as a weak adhesive silicone. A suitable elastomer is Elastosil RT 625, manufactured by Wacker-Chemie. Alternatively, Elastosil RT 622 or Elastosil RT 601, also manufactured by Wacker-Chemie may be used. As an alternative, other kinds of polymers may be chosen.

In the case that a dielectric material which is not an elastomer is used, it should be noted that the dielectric material should have elastomer-like properties, e.g. in terms of elasticity. Thus, the dielectric material should be deformable to such an extent that the composite is capable of deflecting and thereby pushing and/or pulling due to deformations of the dielectric material.

The film and the electrically conductive layer may have a relatively uniform thickness, e.g. with a largest thickness which is less than 110 percent of an average thickness of the film, and a smallest thickness which is at least 90 percent of an average thickness of the film. Correspondingly the first electrically conductive layer may have a largest thickness which is less than 110 percent of an average thickness of the first electrically conductive layer, and a smallest thickness which is at least 90 percent of an average thickness of the first electrically conductive layer. In absolute terms, the electrically conductive layer may have a thickness in the range of 0.01 µm to 0.1 µm, such as in the range of 0.02 µm to 0.09 µm, such as in the range of 0.05 µm to 0.07 µm. Thus, the electrically conductive layer is preferably applied to the film in a very thin layer. This facilitates good performance and facilitates that the electrically conductive layer can follow the corrugated pattern of the surface of the film upon deflection.

The electrically conductive layer may have a thickness in the range of 0.01-0.1 µm, and the film may have a thickness between 10 µm and 200 µm, such as between 20 µm and 150 µm, such as between 30 µm and 100 µm, such as between 40 µm and 80 µm. In this context, the thickness of the film is defined as the shortest distance from a point on one surface of the film to an intermediate point located halfway between a crest and a trough on a corrugated surface of the film.

The electrically conductive layer may have a resistivity which is less than $10^{-4} \Omega \cdot cm$. By providing an electrically conductive layer having a very low resistivity the total resistance of the electrically conductive layer will not become excessive, even if a very long electrically conductive layer is used. Thereby, the response time for conversion between mechanical and electrical energy can be maintained at an acceptable level while allowing a large surface area of the composite, and thereby obtaining a large actuation force when the composite is used in an actuator. In the prior art, it has not been possible to provide corrugated electrically conductive layers with sufficiently low electrical resistance, mainly because it was necessary to select the material for the prior art electrically conductive layer with due consideration to other properties of the material in order to provide the compliance. By the present invention it is therefore made possible to provide compliant electrically conductive layers from a material with a very low resistivity. This allows a large actuation force to be obtained while an acceptable response time of the transducer is maintained.

The electrically conductive layer may preferably be made from a metal or an electrically conductive alloy, e.g. from a metal selected from a group consisting of silver, gold and nickel. Alternatively other suitable metals or electrically conductive alloys may be chosen. Since metals and electrically conductive alloys normally have a very low resistivity, the advantages mentioned above are obtained by making the electrically conductive layer from a metal or an electrically conductive alloy.

The dielectric material may have a resistivity which is larger than $10^{10} \Omega \cdot cm$. Preferably, the resistivity of the dielectric material is much higher than the resistivity of the electrically conductive layer, preferably at least $10^{14}$-$10^{18}$ times higher.

The corrugated pattern may comprise waves forming crests and troughs extending in one common direction, the waves defining an anisotropic characteristic facilitating movement in a direction which is perpendicular to the common direction. According to this embodiment, the crests and troughs resemble standing waves with essentially parallel wave fronts. However, the waves are not necessarily sinusoidal, but could have any suitable shape as long as crests and troughs are defined. According to this embodiment a crest (or a trough) will define substantially linear contour-lines, i.e. lines along a portion of the corrugation with equal height relative to the composite in general. This at least substantially linear line will be at least substantially parallel to similar contour lines formed by other crest and troughs, and the directions of the at least substantially linear lines define the common direction. The common direction defined in this manner has the consequence that anisotropy occurs, and that movement of the composite in a direction perpendicular to the common direction is facilitated, i.e. the composite, or at least an electrically conductive layer arranged on the corrugated surface, is compliant in a direction perpendicular to the common direction. In connection with the potentially unlimited web, the wave crests and troughs may extend e.g. in the lengthwise direction or in the crosswise direction.

Preferably, the compliance of the composite in the compliant direction is at least 50 times larger than its compliance in the common direction, i.e. perpendicularly to the compliant direction.

The waves may have a shape which is periodically repeated. In one embodiment, this could mean that each of the crests and each of the troughs are at least substantially identical. Alternatively, the periodicity may be obtained on a larger scale, i.e. the repeated pattern may be a sub-pattern several 'wavelengths' long. For instance, the wavelength, the amplitude the shape of the crests / troughs, etc. may be periodically repeated. As an alternative, the shape of the waves may be non-periodical.

Each wave may define a height being a shortest distance between a crest and neighbouring troughs. In this case each wave may define a largest wave having a height of at most 110 percent of an average wave height, and/or each wave may define a smallest wave having a height of at least 90 percent of an average wave height. According to this embodiment, variations in the height of the waves are very small, i.e. a very uniform pattern is obtained.

According to one embodiment, an average wave height of the waves may be between $\frac{1}{3}$ µm and 20 µm, such as between 1 µm and 15 µm, such as between 2 µm and 10 µm, such as between 4 µm and 8 µm.

Alternatively or additionally, the waves may have a wavelength defined as the shortest distance between two crests, and the ratio between an average height of the waves and an average wavelength may be between $\frac{1}{30}$ and 2, such as between $\frac{1}{20}$ and $\frac{3}{2}$, such as between $\frac{1}{10}$ and 1.

The waves may have an average wavelength in the range of 1 µm to 20 µm, such as in the range of 2 µm to 15 µm, such as in the range of 5 µm to 10 µm.

A ratio between an average height of the waves and an average thickness of the film may be between $\frac{1}{50}$ and $\frac{1}{2}$, such as between $\frac{1}{40}$ and $\frac{1}{3}$, such as between $\frac{1}{30}$ and $\frac{1}{4}$, such as between $\frac{1}{20}$ and $\frac{1}{5}$.

A ratio between an average thickness of the electrically conductive layers and an average height of the waves may be between $\frac{1}{1000}$ and $\frac{1}{50}$, such as between $\frac{1}{800}$ and $\frac{1}{100}$, such as between $\frac{1}{700}$ and $\frac{1}{200}$.

In a preferred embodiment of the invention the composite is designed by optimising the parameters defined above in such a manner that dielectric and mechanical properties of the film as well as of the electrically conductive layer material are taken into consideration, and in such a manner that a composite having desired properties is obtained. Thus, the average thickness of the film may be selected with due consideration to the relative permittivity and breakdown field of the film on the one hand, and electrical potential difference between the electrically conductive layers on the other hand.

Similarly, the height of the crests may be optimised with respect to the thickness of the film in order to obtain a relatively uniform electric field distribution across a film of dielectric material arranged between the electrically conductive layers. Furthermore, electrically conductive layer thickness, average wavelength, and wave height may be optimised in order to obtain a desired compliance. This will be described further below with reference to the drawings.

As previously mentioned, the composite could become electroactive by the provision of an additional, second, electrically conductive layer arranged opposite to the first electrically conductive layer relative to the film. The second electrically conductive layer may, like the first layer, have a corrugated shape which could be provided as a replica of a surface pattern of the film. Alternatively, the second electrically conductive layer is substantially flat. If the second electrically conductive layer is flat, the composite will only have compliance on one of its two surfaces while the second electrically conductive layer tends to prevent elongation of the other surface. This provides a composite which bends when an electrical potential is applied across the two electrically conductive layers.

Another way of making the composite electroactive is by combining several composites into a multilayer composite with a laminated structure. In a second aspect, the invention provides a multilayer composite comprising at least two layers of composite, each composite layer comprising:
 a film made of a dielectric material and having a front surface and rear surface, the front surface comprising a surface pattern of raised and depressed surface portions, and
 a first electrically conductive layer being deposited onto the surface pattern, the electrically conductive layer having a corrugated shape which is formed by the surface pattern of the film.

In this structure, an electrode group structure may be defined, such that every second electrically conductive layer becomes an electrode of a first group and every each intermediate electrically conductive layer becomes an electrode of a second group of electrodes. A potential difference between the electrodes of the two groups will cause a deformation of the film layers located there between, and the composite is therefore electroactive. In such a layered configuration, a last layer will remain inactive. Accordingly, a multilayer composite with three layers comprises 2 active layers, a multilayer composite with 10 layers comprises 9 active layers, etc.

If the electrically conductive layers are deposited on front surfaces of the films, it may be an advantage to arrange the layers with the rear surfaces towards each other. In this way, the multilayer composite becomes less vulnerable to faults in the film. If the film in one layer has a defect which enables short circuiting of electrodes on opposite surfaces thereof, it would be very unlikely if the layer which is arranged with its rear surface against the film in question has a defect at the same location. In other words, at least one of the two films provides electrical separation of the two electrically conductive layers.

The multilayer composite can be made by arranging the composite layers in a stack and by applying an electrical potential difference between each adjacent electrically conductive layer in the stack so that the layers are biased towards each other while they are simultaneously flattened out. Due to the physical or characteristic properties of the film, the above method may bond the layers together. As an alternative or in addition, the layers may be bonded by an adhesive arranged between each layer. The adhesive should preferably be selected not to dampen the compliance of the multilayer structure. Accordingly, it may be preferred to select the same material for the film and adhesive, or at least to select an adhesive with a modulus of elasticity being less than the modulus of elasticity of the film.

The composite layers in the multilayer composite should preferably be identical to ensure a homogeneous deformation of the multilayer composite throughout all layers, when an electrical field is applied. Furthermore, it may be an advantage to provide the corrugated pattern of each layer either in such a way that wave crests of one layer are adjacent to wave crests of the adjacent layer or in such a way that wave crests of one layer are adjacent to troughs of the adjacent layer.

In a third aspect, the invention provides a method of making a composite, the method comprising:
 providing a shape defining element having a surface pattern of raised and depressed surface portions,
 providing a liquid polymer composition onto the surface pattern
 curing the liquid polymer to form a polymeric film having a surface with a replicated pattern of raised and depressed surface portions, and
 depositing a first electrically conductive layer onto the replicated surface pattern so that the electrically conductive layer is shaped by the replicated pattern.

Since the shape of the electrically conductive layer is obtained from the pattern of the film, and the pattern of the film is obtained from a shape defining element e.g. by a moulding, coating, painting or by any similar process of shape replication, the shape of the electrically conductive layer can be designed specifically for a certain purpose. Accordingly, the composite may provide improved performance if used in a transducer.

The film could be made from a liquid dielectric material, e.g. a liquid polymer in a reverse roll process, a gravure roll process or a slot die coating process. The liquid polymer could be thinned with a solvent to facilitate films of very low thickness and to cross-link the polymer, the film could be exposed to heat or ultraviolet light.

To improve adhesion of the electrically conductive layer, the film may be treated with plasma. The treatment could be conducted with a glow discharge which is known to generate mild plasma. To this end argon plasma is preferred. Prior to the deposition of the electrically conductive layer on the film, an adhesion promoter could be applied to the film. The adhesion promoter is applied after the plasma treatment of the film. Examples of such promoters are a layer of chromium or a layer of titanium. The adhesion promoter could be applied to the film e.g. in a physical vapour deposition process.

Plasma cleaning is a critical step in the metallization process of elastomer films. It enhances adhesion of the deposited material. However, not any plasma is appropriate for treating the elastomer film, and the plasma should therefore be selected carefully. As mentioned above, argon plasma is preferred. Plasma treatments are known to form thin and very stiff silicate "glassy" layers at the elastomer interface. When an electrically conductive layer is subsequently applied, the result is corrugated electrodes with limited compliance and composites which cannot be stretched very much because of the risk of cracking the stiff electrodes. We have chosen the argon plasma treatment which is not reactive because argon is a noble gas. However, residues of oxygen and other reactive gases in the vacuum deposition chamber combined with the argon plasma, may be responsible for a little reactivity. We optimise the pressure of argon in the vacuum chamber and the parameters of the mild glow discharge, as well as the duration of the treatment in such a way that the deposited metal coating adheres very well to the elastomer film. The resulting corrugated electrode is very compliant and the composite can be stretched without damaging the electrode.

As mentioned above, the electrically conductive layer is very thin and the thickness of the electrically conductive layer is very small as compared to the thickness of the film. The electrically conductive layer could be deposited on the film in a physical vapour deposition process, e.g. a sputtering process or an electron beam process. Alternatively, a spray coating process may be applied. To obtain a precise thickness, the thickness is controlled by quartz crystal micro balance.

Quartz crystal micro balance is a thickness measurement technique that is commonly used in physical vapour deposition. It allows for controlling the thickness of the deposited coating, e.g. a metal coating or similar, with accuracies in the sub-nanometer range.

In a fourth aspect, the invention provides a transducer made at least partly from a composite or from a multilayer composite of the above-mentioned kind.

It is an object of a preferred embodiment of the invention to provide a dielectric structure which facilitates an increased ratio in the conversion between electrical and mechanical energies as compared to similar prior art dielectric structures.

According to a first aspect of the invention the above and other objects are fulfilled by a multilayer composite comprising at least two composites, each composite comprising:
    a film made of a dielectric material and having a front surface and rear surface, the front surface comprising a surface pattern of raised and depressed surface portions, and
    a first electrically conductive layer being deposited onto the surface pattern, the electrically conductive layer having a corrugated shape which is formed by the surface pattern of the film.

Due to the multilayer structure, several advantages are achieved over the known dielectric structures. The lamination of several composites provides an increased conversion between mechanical and electrical energies not only due to the multiplication of the effect of each layer, but also due to the fact that the multilayer structure itself renders the multilayer composite more rigid than a corresponding "one layer device" with the identical physical dimensions. In addition, the multilayer structure facilitates application of an electrical field over thinner portions of the structure, thereby requiring much less potential difference between electrodes than with a corresponding "one layer device" with identical physical dimensions.

The invention of multilayer structures of the corrugated electroactive composite also facilitates building of more powerful transducers as compared to prior art transducers. This being the case as the invention of lamination of efficient electroactive composites in an unlimited number of layers brings an unlimited area of cross section allowing for very powerful transducers.

The stacking of the mentioned composites also provides a simple and efficient way of arranging electrically conductive layers on both surfaces of a film since the electrically conductive layer of one film becomes adjacent a film of an adjacent composite. In a multilayer composite with 10 composites, the 9 composites become electroactive, i.e. they have electrically conductive layers on both surfaces whereby it can be deformed by application of an electrical potential difference between the electrically conductive layers.

The invention of multilayer structures with metallic electrodes having low surface resistivity also provides low response times when the multilayer composite is used in a transducer.

The dielectric material could be any material that can sustain an electric field without conducting an electric current, such as a material having a relative permittivity, $\in$, which is larger than or equal to 2. It could be a polymer, e.g. an elastomer, such as a silicone elastomer, such as a weak adhesive silicone or in general a material which has elatomer like characteristics with respect to elastic deformation. For example, Elastosil RT 625, Elastosil RT 622, Elastosil RT 601 all three from Wacker-Chemie could be used as a dielectric material.

In the case that a dielectric material which is not an elastomer is used, it should be noted that the dielectric material should have elastomer-like properties, e.g. in terms of elasticity. Thus, the dielectric material should be deformable to such an extent that the multilayer composite is capable of pushing and/or pulling due to deformations of the dielectric material.

The electrically conductive layer may comprise a metal such as silver, gold, or nickel, or an electrically conductive alloy.

The multilayer composite can be made by arranging the composite layers in a stack and by applying an electrical potential difference between each adjacent electrically conductive layer in the stack so that the layers are biased towards each other while they are simultaneously flattened out. Due to the physical or characteristic properties of the film, the above method may bond the layers together. As an alternative or in addition, the layers may be bonded by an adhesive arranged between each layer. The adhesive should preferably be selected not to dampen the compliance of the multilayer structure. Accordingly, it may be preferred to select the same material for the film and adhesive, or at least to select an adhesive with a modulus of elasticity being less than the modulus of elasticity of the film.

To enable elongation of the composite in one well defined direction, i.e. to provide compliance, the electrically conductive layers have corrugated shapes which render the length of the electrically conductive layers in a lengthwise direction, longer than the length of the composites as such in the lengthwise direction. The corrugated shapes of the electrically conductive layers thereby facilitate that the composite can be stretched in the lengthwise direction without having to stretch the electrically conductive layers in that direction, but merely by evening out the corrugated shape of the electrically conductive layer. According to the invention, the corrugated shape of the electrically conductive layer is a replica of the surface pattern of the film.

Since the conductive layer is deposited onto the surface pattern of the film and is formed by the shape thereof, a very precise shape of the corrugation of the conductive layer can be defined, and an improved compliance towards deformation in a specific direction can be provided by a suitable design of the surface pattern on the film. Accordingly, the composite can facilitate increased actuation forces, or in general an increased rate of conversion between mechanical and electrical energies, increased lifetime and improved reaction time when the composite is used in a transducer.

In the prior art composites, the pattern of the film and electrode is provided by stretching the film prior to the application of the electrode on the surface of the film. When the stretch of the film is released, the electrode wrinkles, and since the electrode is bonded to the film, the surface of the film wrinkles with the electrode. Since the shape of the electrically conductive layer in accordance with the present invention is a replica of the shape of the surface pattern of the film, it may be provided that the shape of the composite as such is unaffected by the contact and bonding between the electrically conductive layer and the film. It may further be provided that the shape is essentially unaffected by elastic moduli of the electrically conductive layer and film. It may further be unaffected by the thickness of the electrically conductive layer and film. This provides a larger degree of freedom with respect to the selection of materials for the film and for the electrically conductive layer and thus enables improved performance of the composite when used in a transducer.

To restrict deformation of the composite in other directions than the direction of compliance, the electrically conductive layer may have a modulus of elasticity much higher than a modulus of elasticity of the film. Accordingly, the electrically conductive layer resists elongation and thus prevents deformation of the composite in directions in which the length of the electrically conductive layer corresponds to the length of the composite as such.

The composite layers in the multilayer composite should preferably be identical to ensure a homogeneous deformation of the multilayer composite throughout all layers, when an electrical field is applied. Furthermore, it may be an advantage to provide the corrugated pattern of each layer either in such a manner that wave crests of one layer are adjacent to wave crests of the adjacent layer or in such a manner that wave crests of one layer are adjacent to troughs of the adjacent layer.

It may be an advantage to arrange the composites with the rear surfaces towards each other. In this way, the multilayer composite becomes less vulnerable to faults in the film. If the film in one layer has a defect which enables short circuiting of electrodes on opposite surfaces thereof, it would be very unlikely that the layer which is arranged with its rear surface against the film in question has a defect at the same location. In other words, at least one of the two films provides electrical separation of the two electrically conductive layers. This multilayer structure may be expanded by further composites whereby the composites become pair-wise rear to rear and front to front laminated. In this structure two adjacent films in contact with each other reduces the impact of defects in each film and two adjacent electrically conductive layers in contact with each other reduces the impact of defects in each electrically conductive layer.

As an alternative, the composites may be arranged so that the front surface of one composite is towards the rear surface of the adjacent composite.

A particular advantage of the multilayer composite is that the characteristics of a laminated structure can be used for making the multilayer composite far more rigid than each of the composites in number of composites sufficient to achieve an area moment of a cross section for bending of the multilayer composite which is at least 1.5-3 times, such as 2 times an average of area moment of inertia of a cross section of each composite individually.

The composites could be made with a film of a material, e.g. polymeric material which has adhesive characteristics. When the composites are stacked, the adhesive characteristics of the film may thus slightly bond the composites together, e.g. not stronger than what facilitates de-lamination without damaging each composite. To increase the rigidity of the multilayer composite, the composites could also be adhesively bonded to each other by use of an additional adhesive. In one embodiment, they are bonded to a degree where de-lamination is impossible without destroying the composites. If an additional adhesive is used, the adhesive may have elastic characteristics similar to those of the film. The adhesive could e.g. comprise or consist of the same material which constitutes at least a major portion of the film. In particular, the adhesive may have a hardness which is at most in the order of magnitude of that of the film of the composites.

The surface pattern and corrugated shape of composites should preferably be essentially identical to provide equal expansion characteristics of each layer in the multilayer composite, i.e. to enable that each layer expands equally for an applied electrical field across the films. In some cases, it may though be desired to establish different expansion characteristics of the layers, e.g. by different corrugated shapes of the electrically conductive layer of each composite.

The film and the electrically conductive layer may have a relatively uniform thickness, e.g. with a largest thickness which is less than 110 percent of an average thickness of the film, and a smallest thickness which is at least 90 percent of an average thickness of the film. Correspondingly the first electrically conductive layer may have a largest thickness which is less than 110 percent of an average thickness of the first electrically conductive layer, and a smallest thickness which is at least 90 percent of an average thickness of the first electrically conductive layer. In absolute terms, the electrically conductive layer may have a thickness in the range of 0.01 µm to 0.1 µm, such as in the range of 0.02 µm to 0.09 µm, such as in the range of 0.05 µm to 0.07 µm. Thus, the electrically conductive layer is preferably applied to the film in a very thin layer. This facilitates good performance and facilitates that the electrically conductive layer can follow the corrugated pattern of the surface of the film.

The electrically conductive layer may have a thickness in the range of 0.01-0.1 µm, and the film may have a thickness between 10 µm and 200 µm, such as between 20 µm and 150 µm, such as between 30 µm and 100 µm, such as between 40 µm and 80 µm. In this context, the thickness of the film is defined as the shortest distance from a point on one surface of the film to an intermediate point located halfway between a crest and a trough on a corrugated surface of the film.

The electrically conductive layer may each have a resistivity which is less than $10^{-4} \Omega \cdot cm$ or less than $10^{-4} \Omega \cdot cm$ per composite.

By providing an electrically conductive layer having a very low resistivity the total resistance of the electrically conductive layer will not become excessive, even if very long electrically conductive layer are used. Thereby, the response time for conversion between mechanical and electrical energy can be maintained at an acceptable level while allowing a large surface area of the composite, and thereby obtaining a large actuation force when the composite is used in an actuator. In the prior art, it has not been possible to provide corrugated electrically conductive layer with sufficiently low electrical resistance, mainly because it was necessary to select the material for the prior art electrically conductive layer with due consideration to other properties of the material in order to provide the compliance. By the present invention it is therefore made possible to provide compliant electrically conductive layers from a material with a very low resistivity, because this allows a large actuation force to be obtained while an acceptable response time of the transducer is maintained.

The electrically conductive layer may preferably be made from a metal or an electrically conductive alloy, e.g. from a metal selected from a group consisting of silver, gold and nickel. Alternatively other suitable metals or electrically conductive alloys may be chosen. Since metals and electrically conductive alloys normally have a very low resistivity, the advantages mentioned above are obtained by making the electrically conductive layer from a metal or an electrically conductive alloy.

The dielectric material may have a resistivity which is larger than 100' Ω·cm. or have a resistivity larger than $10^{10}$ Ω·cm per composite.

Preferably, the resistivity of the dielectric material is much higher than the resistivity of the electrically conductive layer, preferably at least $10^{10}$–$10^{18}$ times higher.

The corrugated pattern may comprise waves forming crests and troughs extending in one common direction, the waves defining an anisotropic characteristic facilitating movement in a direction which is perpendicular to the common direction. According to this embodiment, the crests and troughs resemble standing waves with essentially parallel wave fronts. However, the waves are not necessarily sinusoidal, but could have any suitable shape as long as crests and troughs are defined. According to this embodiment a crest (or a trough) will define substantially linear contour-lines, i.e. lines along a portion of the corrugation with equal height relative to the composite in general. This at least substantially linear line will be at least substantially parallel to similar contour lines formed by other crest and troughs, and the directions of the at least substantially linear lines defines the common direction. The common direction defined in this manner has the consequence that anisotropy occurs, and that movement of the composite in a direction perpendicular to the common direction is facilitated, i.e. the composite, or at least an electrically conductive layer arranged on the corrugated surface, is compliant in a direction perpendicular to the common direction. In connection with the potentially unlimited web, the wave crests and troughs may extend e.g. in the lengthwise direction or in the crosswise direction.

Preferably, the compliance of the composite in the compliant direction is at least 50 times larger than its compliance in the common direction, i.e. perpendicularly to the compliant direction.

The waves may have a shape which is periodically repeated. In one embodiment, this could mean that each of the crests and each of the troughs are at least substantially identical. Alternatively, the periodicity may be obtained on a larger scale, i.e. the repeated pattern may be a sub-pattern several 'wavelengths' long. For instance, the wavelength, the amplitude the shape of the crests / troughs, etc. may be periodically repeated. As an alternative, the shape of the waves may be non-periodically.

Each wave may define a height being a shortest distance between a crest and neighbouring troughs. In this case each wave may define a largest wave having a height of at most 110 percent of an average wave height, and/or each wave may define a smallest wave having a height of at least 90 percent of an average wave height. According to this embodiment, variations in the height of the waves are very small, i.e. a very uniform pattern is obtained.

According to one embodiment, an average wave height of the waves may be between $\frac{1}{3}$ μm and 20 μm, such as between 1 μm and 15 μm, such as between 2 μm and 10 μm, such as between 4 μm and 8 μm.

Alternatively or additionally, the waves may have a wavelength defined as the shortest distance between two crests, and the ratio between an average height of the waves and an average wavelength may be between $\frac{1}{30}$ and 2, such as between $\frac{1}{20}$ and 1.5, such as between $\frac{1}{10}$ and 1.

The waves may have an average wavelength in the range of 1 μm to 20 μm, such as in the range of 2 μm to 15 μm, such as in the range of 5 μm to 10 μm.

A ratio between an average height of the waves and an average thickness of the film may be between $\frac{1}{50}$ and $\frac{1}{2}$, such as between $\frac{1}{40}$ and $\frac{1}{3}$, such as between $\frac{1}{30}$ and $\frac{1}{4}$, such as between $\frac{1}{20}$ and $\frac{1}{5}$.

A ratio between an average thickness of the electrically conductive layers and an average height of the waves may be between $\frac{1}{1000}$ and $\frac{1}{50}$, such as between $\frac{1}{800}$ and $\frac{1}{100}$, such as between $\frac{1}{700}$ and $\frac{1}{200}$.

In a preferred embodiment of the invention the composite is designed by optimising the parameters defined above in such a manner that dielectric and mechanical properties of the film as well as of the electrically conductive layer material are taken into consideration, and in such a manner that a composite having desired properties is obtained. Thus, the average thickness of the film may be selected with due consideration to the relative permittivity and breakdown field of the film on the one hand, and electrical potential difference between the electrically conductive layers on the other hand. Similarly, the height of the crests may be optimised with respect to the thickness of the film in order to obtain a relatively uniform electric field distribution across a film of dielectric material arranged between the electrically conductive layers. Furthermore, electrically conductive layer thickness, average wavelength, and wave height may be optimised in order to obtain a desired compliance. This will be described further below with reference to the drawings.

The multilayer composite may comprise a peripheral edge which is covered with an electrically isolating layer, e.g. to prevent short-circuiting between the electrically conductive layers of the multilayer composite or in general to protect the edge of the multilayer composite.

In order to benefit mostly from the multilayer composite, e.g. in a transducer comprising a multilayer composite which is curled or winded to form a rolled structure with a larger number of layers or windings, it is preferred to provide the multilayer composite as a very long web. In this context, a web denotes something which is potentially unlimited in length and which can therefore be provided as a spooled product similar to cling-wrap, cling-film or household foil. In general, the web is at least 10 times longer in a lengthwise direction than in a perpendicular crosswise direction, but it may even be 100, 1000 or more times longer in the lengthwise direction. The corrugations may extend in any direction relative to the lengthwise and crosswise direction. It is, however, preferred that the corrugations of all the composites making up the multilayer composite extend in the same direction.

To form a transducer from a multilayer composite, the multilayer composite must be given a shape and rigidity by which it may interact with a surrounding system in an intended manner, e.g. as an actuator capable of exerting a pressure onto an adjacent object, a sensor capable of sensing a pressure, or as a transformer or generator.

To provide shape and structure, the multilayer composite may e.g. be pre-strained in at least one direction, e.g. by stretching the multilayer composite in a rigid frame—i.e. a frame which is rigid relative to the multilayer composite. In particular, it may be preferred to stretch the multilayer composite in its direction of compliance, i.e. perpendicular to the direction in which the wave crests and troughs extend. To stretch the multilayer composite, an elastic element could be located between the rigid frame and the multilayer composite, e.g. a spring or similar elastically deformable element. The multilayer composite could e.g. be arranged relative to a movable rigid beam or relative to another multilayer composite so that the composite remains pre-stretched and so that deformation of the multilayer composite can be sensed as a change in capacitance measured on two of the electrically conductive layers, or so that an electrical field can deform the films and thus elongate the stretched multilayer composite.

Another way of providing shape and structure is to fold, roll or otherwise stiffen the multilayer composite. This may provide sufficient rigidity for the multilayer composite to exert a force onto an adjacent object and thereby enable use of the multilayer composite as an actuator which is able to push or pull.

Multilayer composites may be applied as transducers for actuation, sensing and control of components such as valves, flaps, pumps, dosing pumps, etc. Such control components may be applied within industrial, domestic and defence applications such as in hydraulics, industrial automation and controls, heating and refrigeration, ventilation and air-conditioning, maritime, medical, automotive and off-highway equipments.

The capacitance of such multilayer composites changes as a function of the deflection of the composite. When multilayer composites are used in combination with an electronic control circuit, change in capacitance can be converted into a control signal for indicating the deflection of the transducer. Such control signals can be used as input for improving closed loop (feedback) control of transducer position, etc.

Multilayer composites used in combination with control electronics for transducer positioning can be applied in the above mentioned applications for accurate responsive control of above mentioned components.

In one specific embodiment, the multilayer composite is made from one single continuous film made of a dielectric material. The film is provided with a front surface with a surface pattern of raised and depressed surface portions. A first electrically conductive layer e.g. with a corrugated shape is deposited onto a first portion of the surface pattern, a second electrically conductive layer, e.g. with a corrugated shape is deposited onto a second portion of the surface pattern. The first and second electrically conductive layers are electrically isolated from each other e.g. by providing lines or strips in which no electrically conductive material is deposited onto the film. The film is then folded, rolled or otherwise formed into a multilayer composite structure in which the first and second electrically conductive layers are located alternately between layers of the film. In other words, the rolling or folding of this "single continuous film" version of the multilayer composite is done both to provide rigidity and to arrange the two electrically conductive layers relative to each other. It should be noted that when folding the "single continuous film" care should be taken to fold the film in such a manner that short-circuiting of the electrodes is prevented, while it is ensured that electrodes of opposing polarity are positioned opposite each other with a layer of dielectric film there between.

To form a transducer, electrical connectivity between the electrically conductive layers and an electronic circuit or power supply is necessary. The above-mentioned "single continuous film" may have only two such electrically conductive layers since it is one single layer which is folded or rolled. Other types of multilayer composites, however, comprise a plurality of individual electrically conductive layers—one for each composite in the multilayer composite. In this case, connection between every second electrically conductive layer and one connector of the electronic circuit or power supply, and connection between each intermediate electrically conductive layer and another connector of the electronic circuit or power supply, may be established by providing a multilayer composite wherein the electrically conductive layers are shifted relative to each other for every second layer. As an example, the film of the composites form dielectric layers having first and second surfaces towards the electrically conductive layers. The electrically conductive layers may define:

an active portion of the actuator wherein electrode portions of the electrically conductive layers cover both surfaces of the dielectric layers;

a first passive portion and a second passive portion in which portions only one surface of the dielectric layers is covered by one of the conductive layers;

The first passive portion is defined by a contact portion of the electrically conductive layer on the first surface, and the second passive portion is defined by a contact portion of the electrically conductive layer on the second surface.

An electrical connector can thereafter be attached to each contact portion to connect the contact portions to the power supply or electronic circuit. As an example, conductive rods, bolts, nails, screws or rivets may penetrate all layers of the multilayer composite through each contact portion and thus be used for electrically connecting the multilayer composite to a power supply or to an electronic circuit.

In a second aspect, the invention provides a method of providing a multilayer composite of layers of a dielectric film and an electrically conductive layer. The method comprises:

providing a first composite comprising a film of a dielectric material with a front surface and an opposite rear surface, the front surface comprising a surface pattern of raised and depressed surface portions, depositing an electrically conductive layer onto the surface pattern, providing a second composite comprising a film with a front surface and an opposite rear surface, the front surface comprising a surface pattern of raised and depressed surface portions, depositing an electrically conductive layer covering at least a portion of the surface pattern, arranging the first composite on the second composite, and fixating the position of the first composite relative to the second composite.

The last step of fixating the position could be done by use of adhesive characteristics of the film itself or by use of an additional adhesive provided between the composites. Alternatively, the layers could be fixed to one common fixation means, e.g. by attaching all layers to one common frame or flange or similar component which can keep the layers together.

Preferably the multilayer composite is made as a spooled product—potentially in unlimited length. For this purpose, the steps of providing the composites and arranging them in a stack could be performed in a continuous process, wherein a part of the multilayer composite is made while another part of that multilayer composite is finished and being rolled up.

The composites could e.g. be provided by providing a shape defining element having a surface pattern of raised and depressed surface portions and by providing a liquid polymer composition onto the surface pattern to form a first film having a surface with a replicated pattern of raised and depressed surface portions. This could be done e.g. in a coating, moulding, painting, spraying or in any similar process in which a liquid polymer can be brought onto a surface with a surface pattern. To provide identical layers in the multilayer composite, the same, or identical shape defining elements could be used throughout the process.

The electrically conductive layer could be deposited onto the replicated surface pattern by use of a physical vapour deposition process, in a sputtering process, or in an electron beam process. The electrically conductive layer is deposited onto the film in a thickness of 0.01-0.1 µm, and the thickness could be controlled by quartz crystal micro balance.

Quartz crystal micro balance is a thickness measurement technique that is commonly used in physical vapour deposition. It allows for controlling the thickness of the deposited coating, e.g. a metal coating or similar, with accuracies in the sub-nanometer range.

Prior to the application of the electrically conductive layer, the film may be treated with plasma since this may improve adhesion of the electrically conductive layer to the film. The plasma treatment could be conducted with a glow discharge which is known to generate mild plasma, and argon plasma is preferred.

Plasma cleaning is a critical step in the metallization process of elastomer films. It enhances adhesion of the deposited material. However, not any plasma is appropriate for treating the elastomer film, and the plasma should therefore be selected carefully. As mentioned above, argon plasma is preferred. Plasma treatments are known to form thin and very stiff silicate "glassy" layers at the elastomer interface. When an electrically conductive layer is subsequently applied, the result is corrugated electrodes with limited compliance and composites which cannot be stretched very much because of the risk of cracking the stiff electrodes. We have chosen the argon plasma treatment which is not reactive because argon is a noble gas. However, residues of oxygen and other reactive gases in the vacuum deposition chamber combined with the argon plasma, are responsible for a little reactivity. We optimise the pressure of argon in the vacuum chamber and the parameters of the mild glow discharge, as well as the duration of the treatment in such a way that the deposited metal coating adheres very well to the elastomer film. The resulting corrugated electrode is very compliant and the composite can be stretched as much as allowed without damaging the electrode according to the design rules described in previous paragraphs.

An adhesion promoter could be applied to the film after the plasma treatment. The adhesion promoter may comprise a layer of chromium or titanium, and the adhesion promoter could be applied to the film in a physical vapour deposition process.

In an alternative process, a liquid polymer composition is provided directly onto the first film or onto the electrically conductive layer to provide a second film by moulding or coating directly onto the first film. The replicated pattern could in this case be provided by simultaneous embossing with a stamping tool into the not yet cured or partly cured polymer. When the polymer is cured, at least a portion of its pattern could be coated with a second electrically conductive layer. The process could be repeated to provide a multilayer composite with a large number of layers.

BRIEF DESCRIPTION OF THE DRAWINGS

The invention will now be described in further detail with reference to the accompanying drawings in which:

FIGS. 10a and 10b illustrate examples of rolled electroactive composites, FIG. 11a illustrates an example of a portion of a composite according to an embodiment of the invention, the composite being particularly suitable for a composite having a rolled structure, FIG. 11b illustrates an example of a portion of a composite according to an embodiment of the invention, the composite being particularly suitable for a composite having a folded structure, FIGS. 14a and 14b illustrate lamination of the composite shown FIG. 11 by folding of the composite, FIGS. 15a-15c are perspective views of direct axially actuating transducers according to embodiments of the invention, FIGS. 17a and 17b are perspective views of direct radially actuating transducers according to embodiments of the invention, FIG. 18a illustrates lamination of a composite to form a flat tubular structure, FIG. 18b illustrate the flat tubular structure of FIG. 18a being pre-strained, FIGS. 26-29 illustrate examples of transducers provided with electrical contact portions.

DETAILED DESCRIPTION OF THE DRAWINGS

Figure 1A:
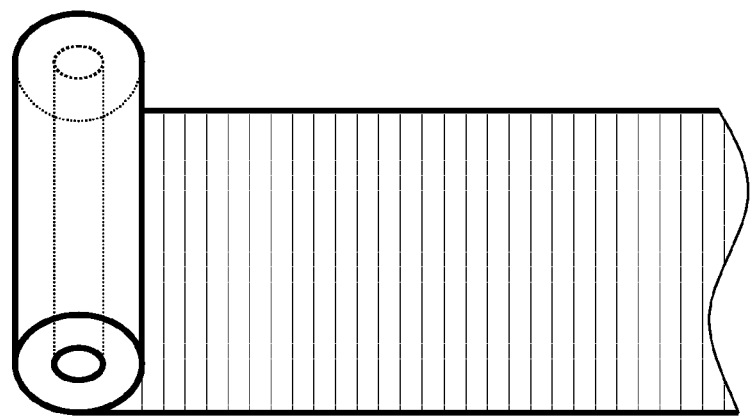
FIGS. 1a and 1b illustrate continuous rolls of spooled composites according to embodiments of the invention.
Figure 1B:
Figure 1C:
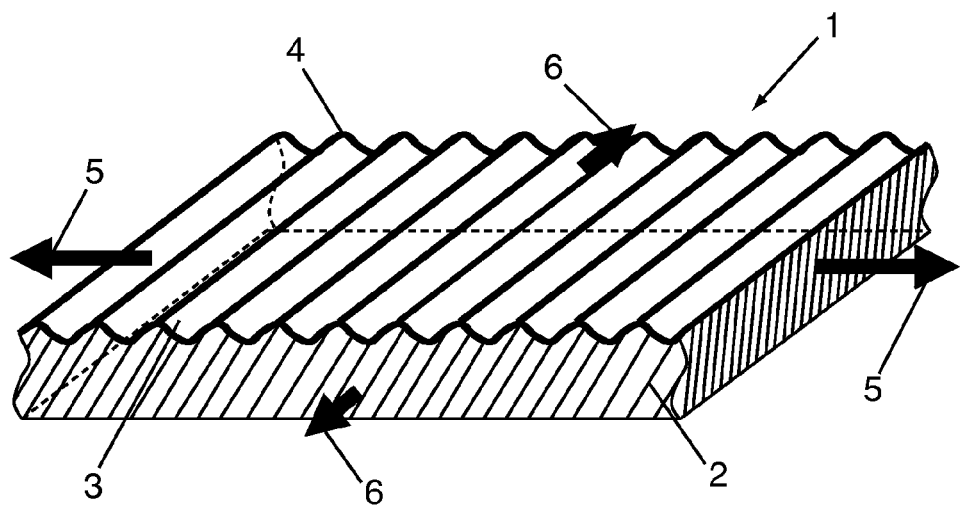
FIG. 1c is a perspective view of a portion of a composite according to an embodiment of the invention.

FIGS. 1a and 1b illustrate continuous rolls of spooled composites 1 according to embodiments of the invention, and FIG. 1c is a perspective view of a portion of a composite 1. The proportions of the composite are distorted in order to illustrate different elements of the composite 1. The composite 1 comprises a film 2 made of a dielectric material having a surface 3 provided with a pattern of raised and depressed surface portions, thereby forming a designed corrugated profile of the surface 3. An electrically conductive layer 4 has been applied to the surface 3, the electrically conductive material being deposited so that the electrically conductive layer is formed according to the pattern of raised and depressed surface portions. In terms of everyday physical things, the film 2 resembles in some aspects household wrapping film. It has a similar thickness and is comparably pliable and soft. However, it is more elastic than such a film, and has a marked mechanical anisotropy as will be explained in the following.

The dielectric material may be an elastomer or another material having similar characteristics.

Due to the pattern of raised and depressed surface portions, the electrically conductive layer 4 may even out as the film 2 expands, and recover its original shape as the film 2 contracts along the direction defined by arrows 5 without causing damage to the electrically conductive layer 4, this direction thereby defining a direction of compliance. Accordingly, the composite 1 is adapted to form part of a compliant structure capable of withstanding large strains.

As described above, the corrugated surface profile is directly impressed or moulded into the dielectric film 2 before the electrically conductive layer is deposited. The corrugation allows the manufacturing of a compliant composite using electrode materials of high elastic modulii, e.g. metal electrode. This can be obtained without having to apply pre-stretch or pre-strain to the dielectric film 2 while applying the electrically conductive layer 4, and the corrugated profile of the finished composite 1 does not depend on strain in the dielectric film 2, nor on the elasticity or other characteristics of the electrically conductive layer 4. Accordingly, the corrugation profile is replicated over substantially the entire surface 3 of the dielectric film 2 in a consistent manner, and it is possible to control this replication. Furthermore, this approach provides the possibility of using standard replication and reel-to-reel coating, thereby making the process suitable for large-scale production. For instance, the electrically conductive layer 4 may be applied to the surface 3 of the dielectric film 2 using standard commercial physical vapour deposition (PVD) techniques. An advantage of this approach is that the anisotropy is determined by design, and that the actual anisotropy is obtained as a consequence of characteristics of the corrugated profile which is provided on the surface 3 of the dielectric film 2 and the electrically conductive layer 4 which follows the corrugated profile.

The composite 1 shown in FIG. 1c is designed to have a compliance in the range of the compliance of the dielectric film 2 in the direction defined by arrows 5, and a stiffness in the range of the stiffness of the electrically conductive layer 4 in a direction defined by arrows 6. In FIG. 1a, the compliance direction is along the length of the composite 1, whereas the compliance direction of FIG. 1b is across the composite 1. This is indicated by the thin lines across the composite 1 in FIG. 1a and along the composite 1 in FIG. 1b, which thin lines represents the pattern of raised and depressed surface portions forming the corrugated profile. The composite 1 may be produced in very long lengths, so called "endless" composites which may be stored as spools as shown in FIGS. 1a and 1b. Such semi finished goods may be used for the production of transducers and the like, e.g. actuators.

FIGS. 2a-2f illustrate a portion of a sectional view of composites 1 according to embodiments of the invention, with hatchings omitted for the sake of clarity. As indicated by the symmetry line 10 at the bottom of each portion, each portion only shows half a composite 1. Furthermore, an electrically conductive layer 4 may be deposited on the lower surface of the dielectric film 2, which lower surface may also define a corrugated surface, thereby forming an electroactive composite, i.e. at least two electrically conductive layers being separated by a dielectric film. Furthermore, each portion only shows a small portion lengthwise of each composite. For illustration purposes the proportions of FIGS. 2a-2g are out of order. FIG. 2g illustrates an enlarged section of FIGS. 2a/2b/2c/2d/2e/2f. The composite 1 shown in FIGS. 2a-2g could, e.g., be the composite 1 of FIG. 1a. Thus, the composite 1 comprises a dielectric film 2 made of a dielectric material having a surface 3 provided with a pattern of raised and depressed surface portions, thereby forming a corrugated profile of the surface 3. The surface 3 is provided with an electrically conductive layer (shown in FIG. 2g) forming a directionally compliant composite as described above. As shown in FIGS. 2a-2f, the pattern of raised and depressed surface portions may be designed having various shapes.

The corrugated profile may be represented by a series of well defined and periodical sinusoidal-like three dimensional microstructures. Alternatively, the corrugated profile may have a triangular or a square profile. The mechanical compliance factor, Q, of the corrugated electrode is determined by the scaling ratio between the depth d of the corrugation and the thickness h (see FIG. 2g) of the electrically conductive layer 4, and by the scaling ratio between the depth d of the corrugation and its period P. The most dominating factor is the scaling ratio between the height d of the corrugation and the thickness h of the electrically conductive layer 4. The larger the compliance factor, the more compliant the structure is. It has been found by the inventors of the present invention, that if perfect compliance is assumed, for a scaling ratio between the depth d of the corrugation and its period P, a sinus profile could theoretically elongate approximately 32%, a triangular profile approximately 28% and a square profile approximately 80% compared to the original length. However, in reality this will not be the case since the square profile comprises vertical and horizontal beams, which will result in different compliances, because the vertical beams will bend and thereby generate a very compliant movement in the displacement direction, while the horizontal beams will be much stiffer, since they extent in the displacement direction. It is therefore often desirable to choose the sinus profile.

In the composite 1 shown in FIGS. 2a-2f, the corrugated pattern impressed or moulded into the dielectric film 2 can be represented by a series of well defined and periodical sinusoidal-like three dimensional microstructures. The corrugation profile is formed at the upper surface 3 of the film 2 as shown in FIGS. 2a-2f. As indicated by the symmetry line 10, a second corrugation profile is formed at the lower surface (not shown) of the film. In FIGS. 2a-2f, the section runs along the direction of compliance. Perpendicularly to the direction of compliance parallel straight lines represent tops and bottoms of the raised and depressed surface portions, i.e. wave crests or troughs of the sinusoidal-like microstructure. This appears more clearly from FIGS. 1a and 1c. Along these parallel straight lines, the compliancy is very low, i.e. for all practical purposes the composite 1 is not compliant in this direction. In other words, this design represents a one dimensional corrugation which, upon application of the electrically conductive layers, transforms the dielectric film 2 into an electrocative composite 1 with anisotropic compliance, wherein the film is free to contract or elongate, while a perpendicularly arranged cross-plane direction is 'frozen' due to the built-in boundary conditions given by the mechanical resistance of the electrically conductive layers 4.

Figure 2A:
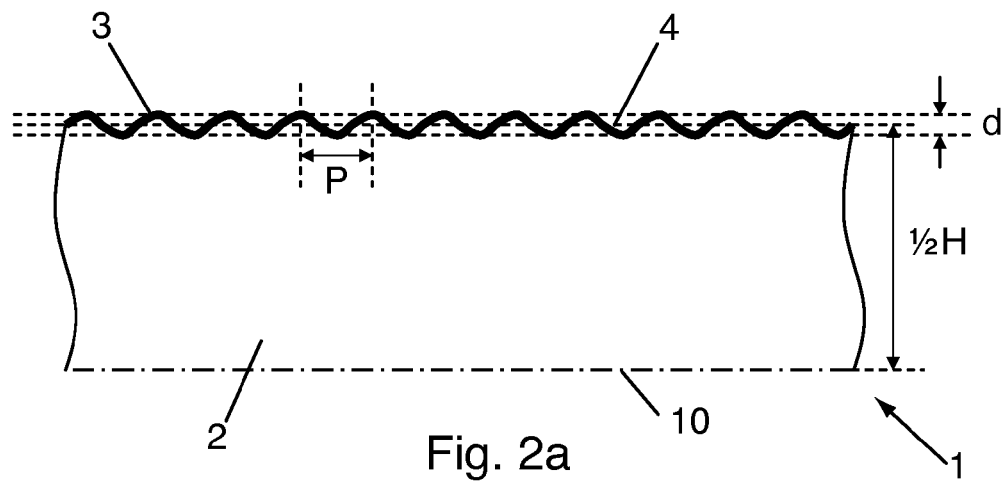
FIGS. 2a-2f are cross sectional views of a portion of composites according to embodiments of the invention.
Figure 2B:
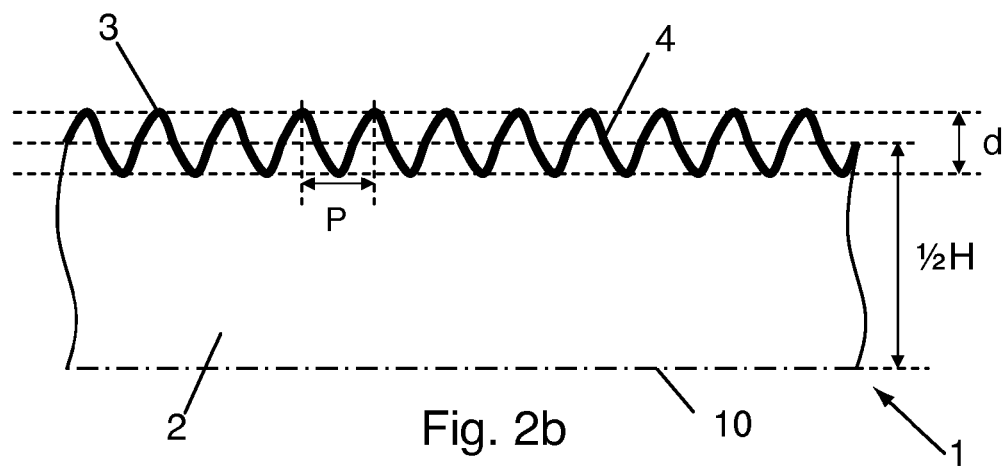
Figure 2C:
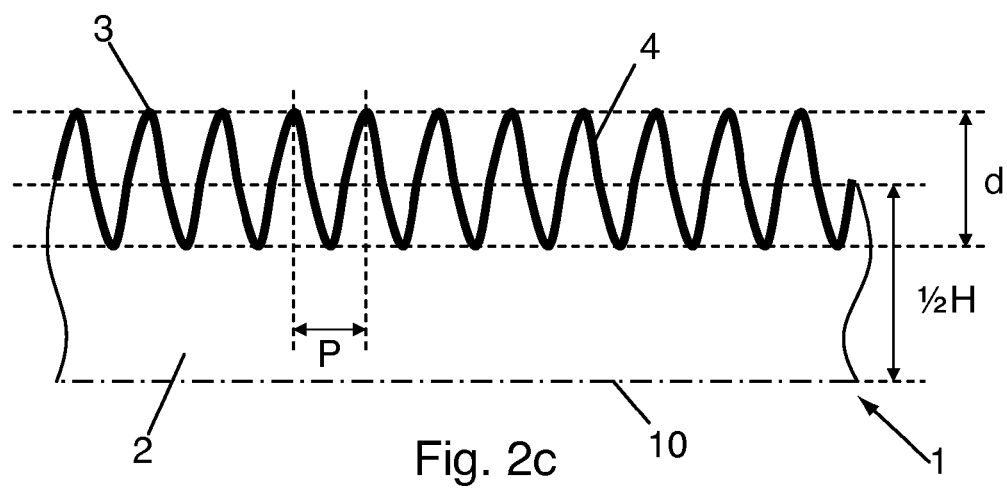
Figure 2D:
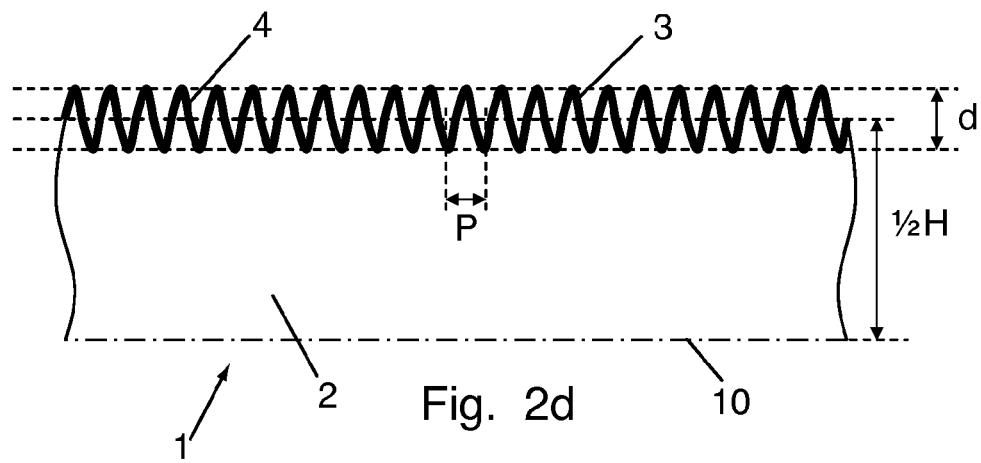
Figure 2E:
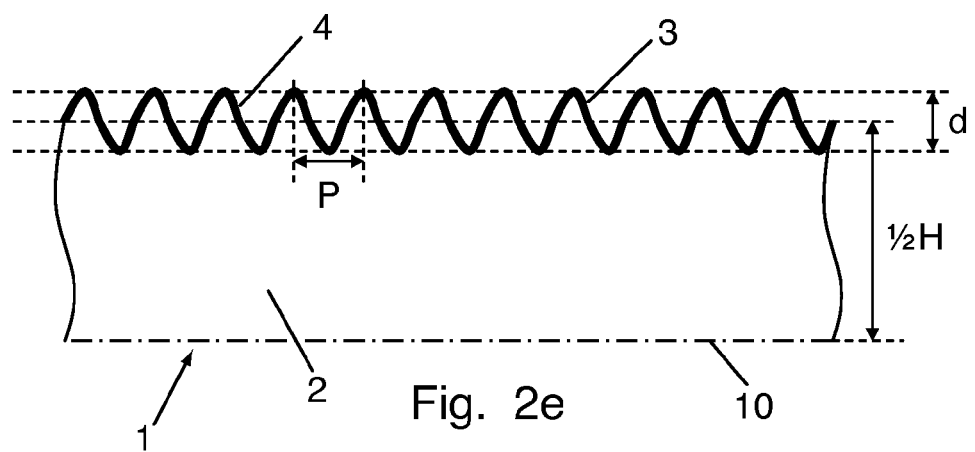
Figure 2F:
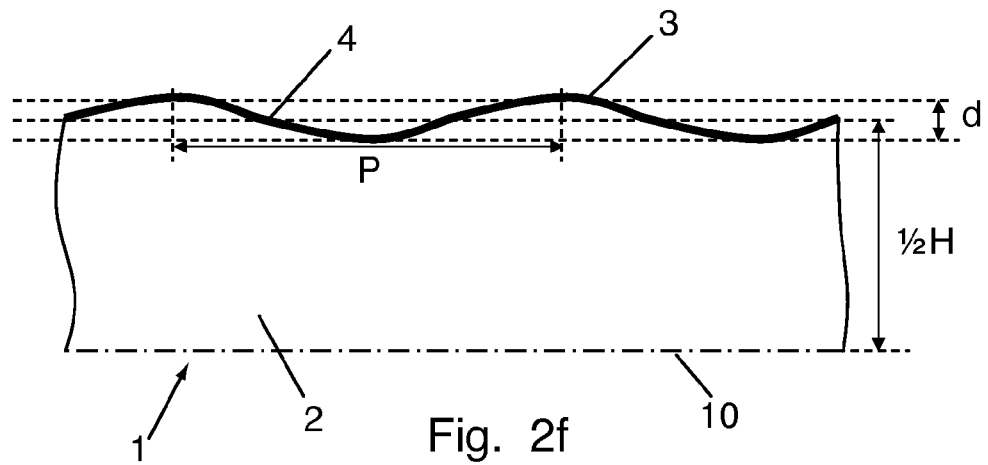
Figure 2G:
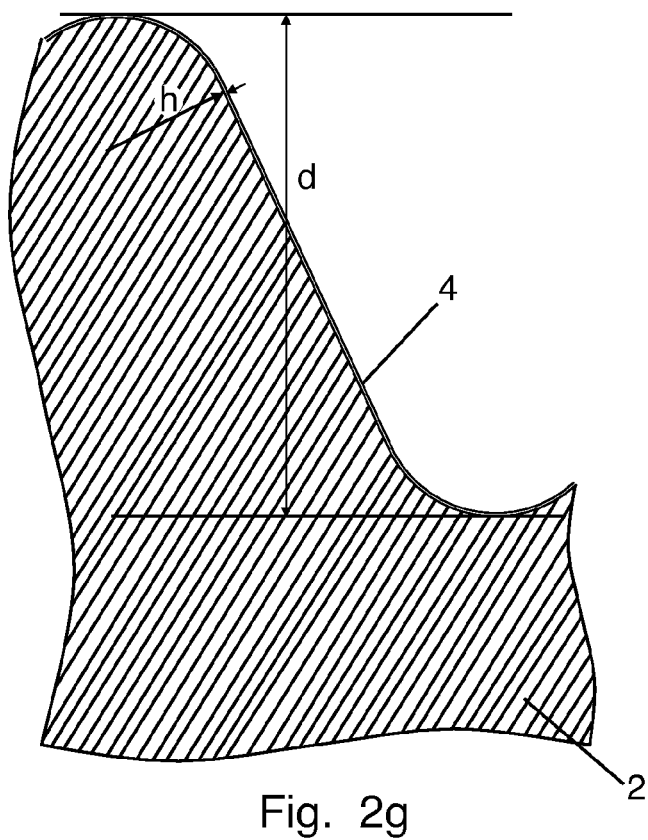
FIG. 2g is an enlarged section of FIGS. 2a/2b/2c/2d/2e/2f.

In FIGS. 2a-2g, d denotes an average or representative corrugation depth, i.e. an average or representative distance between a raised portion and a neighbouring depressed portion of the pattern. H denotes an average thickness of the dielectric film 2, and h denotes an average thickness of the electrically conductive layer 4. In a preferred embodiment, the average thickness H of the dielectric film 2 is in the range of 10 µm-100 µm. FIGS. 2a-2c show composites 1 having different corrugation depth d, whereas the corrugation period P is substantially identical for the three composites shown. Comparing the composites 1 of FIGS. 2d and 2e, the corrugation depth d is substantially identical, whereas the corrugation period P of the composite 1 in FIG. 2e is larger than the corrugation period P of the composite 1 shown in FIG. 2d. Compared hereto, the composite 1 of FIG. 2f has a smaller corrugation depth d and a larger corrugation period P.

The properties of the dielectric films 2 with anisotropic corrugated compliant metallic electrodes in the form of electrically conductive layers 4 as described in accordance with the present invention are optimised by design according to design rules developed by the inventors. These design rules take into consideration the dielectric and mechanical properties of the dielectric material and of the material of the electrically conductive layer.

The relative permittivity and breakdown field of the dielectric material on the one hand and electrical potential difference between electrodes on the other hand are the design parameters that determine the range of the average thickness, H of the dielectric film 2. The characteristic properties of the dielectric material are typically supplied by dielectric material manufacturers like Wacker-Chemie and Dow Corning.

Corrugation depth, d, is optimised with respect to the dielectric film thickness, H, in order to obtain a relatively uniform electric field distribution across the dielectric film situated between the electrodes. Such optimisation step is done using finite element simulations. A high d/H ratio corresponds to a non uniform electric field distribution and a low d/H ratio corresponds to a relatively uniform electric field distribution.

Anisotropy and compliance properties are the combined result of the shape and topology given to the surface of the dielectric film, e.g. an elastomer film, by a moulding process on one hand and the electrically conductive layer that takes up the corrugation shape on the other hand. Electrode layer thickness, h, and corrugation period, P, are optimised with respect to the corrugation depth, d, in order to obtain a dielectric film with metallic electrodes that is compliant in one 'in the plane' direction and almost not compliant in the transverse 'in the plane' direction. A film that is very compliant in one direction is a film that can be stretched or elongated very much in this direction by applying a relatively low level of forces in this direction without the risk of damaging the electrodes, and a film that will have very limited elongation in the transverse direction when a force is applied in this transverse direction. In order to optimise electrode compliance, the d/P and h/d ratios have to be optimized. High d/P ratios result in very compliant electrodes and low d/P ratios result in less compliant electrodes. High h/d ratios result in less compliant electrodes and low h/d ratios result in very compliant electrodes. The degree of anisotropy of the dielectric film with corrugated electrodes is determined by the compliance ratio between the direction in which the composite is compliant and the transverse direction in which the composite is almost not compliant. High compliance ratios result in very anisotropic structures and low ratios result in isotropic-like structures.

Once the ranges for the design parameters (H, d, h and P) are specified according to the above description, it is possible to predict the performance of the dielectric film with metallic electrodes in the form of electrically conductive layers in terms of how compliant and what maximum elongation in the compliant direction it can undergo and what the actuation forces will be. Stiffness in the transverse direction can be predicted as well. A refinement process for these parameters can be done if necessary.

It should be noted that for a given actuation force, actuators manufactured in accordance with the present invention, i.e. made from a dielectric material with electrodes deposited thereon, has a much lower weight, i.e. at least a factor five smaller, than conventional actuators, such as magnetic actuators, capable of providing a comparable actuation force. This is very important for applications where actuator volume and weight are of relevance.

Once all design parameters are optimised, a mould is designed according to the exact specifications for the corrugation topology.

Based on finite element electrostatic simulations, the inventors of the present invention have found that the ratio d/H should be in the range of 1/30-1/2. For example, having a ratio of 1/5 and a corrugation depth of approximately 4 µm, the thickness of the dielectric film 2 will be approximately 20 µm. Furthermore, the ratio between the corrugation depth d and the period P of the corrugations, d/P, and the ratio between the thickness h of the electrically conductive layer and the corrugation depth d, h/d, are important ratios directly affecting the compliance of the electrode. In preferred embodiments, the ratio d/P is in the range of 1/50-2, whereas the ratio h/d is in the range of 1/1000-1/50.

Another issue to take into consideration when defining the average thickness H of the dielectric film 2 is the so-called breakdown electric field related to dielectric materials. When an electrically conductive layer 4 is deposited on each surface of the dielectric film 2 thereby forming an electroactive composite, there is a maximum value for the voltage, V between these electrically conductive layers, for a given material thickness, H, i.e. a distance corresponding to the thickness, H, of the dielectric film 2, in order not to exceed the breakdown electric field, V/H, of the material. When the dielectric film 2 presents large variations in thickness across a surface area 3, then, for a given voltage between the electrically conductive layers, electric field and thickness variations will be of the same order of magnitude. As a consequence, parts of the dielectric film 2 having a higher local electric field will elongate more than those with a smaller local electric field. Furthermore, in situations where a transducer in which the composite 1 is operated close to a breakdown field, such variations may be damaging to the transducer, because parts of the dielectric film 2 will be subjected to electric fields which are larger than the breakdown field. Accordingly, it is very important to reduce the average thickness variations to the greatest possible extent when processing the dielectric film 2. For processing reasons a 10% average thickness variation is considered acceptable. When processing transducers with corrugated electrodes by design, i.e. in accordance with the present invention, these values can be controlled in a relatively accurate manner.

Figure 3A:
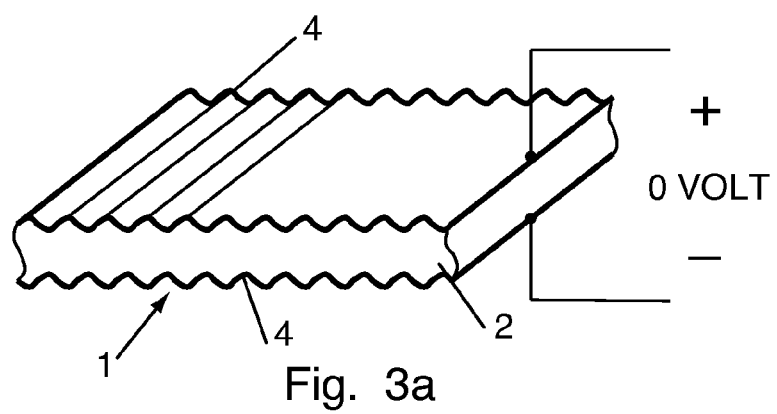
FIGS. 3a and 3b show an electroactive composite being exposed to zero electrical potential difference and being exposed to a high electrical potential difference.
Figure 3B:
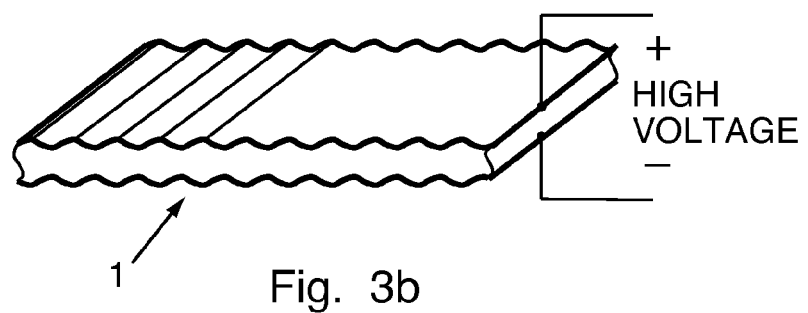
Figure 4A:
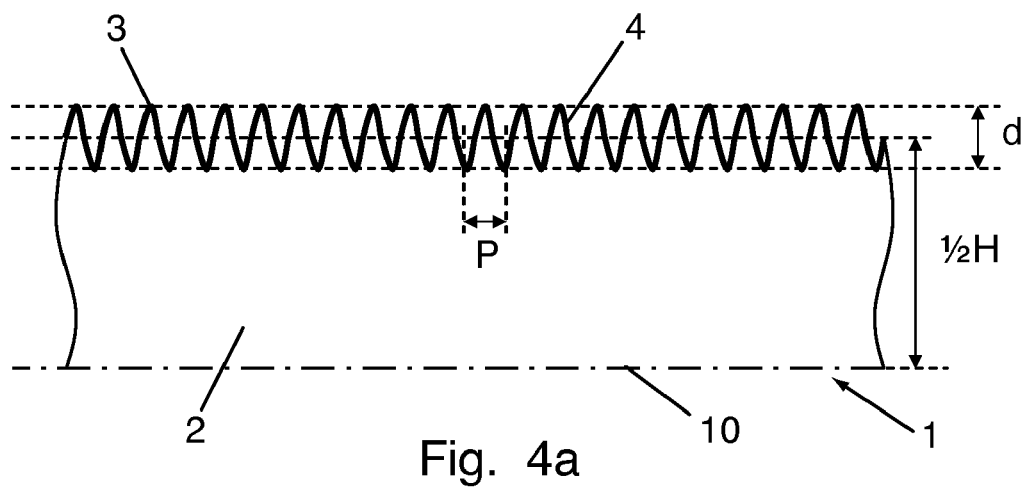
FIGS. 4a-4c illustrate the effect of exposing the electroactive composite of FIG. 3a to a high electrical potential difference as shown in FIG. 3b, FIGS. 5a and 5b illustrate an example of lamination of composites according to an embodiment of the invention, thereby forming an electroactive multilayer composite.
Figure 4B:
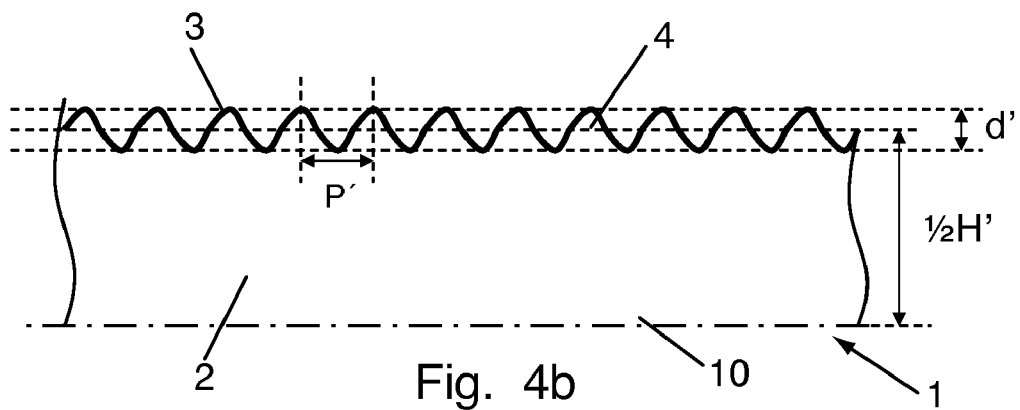
Figure 4C:
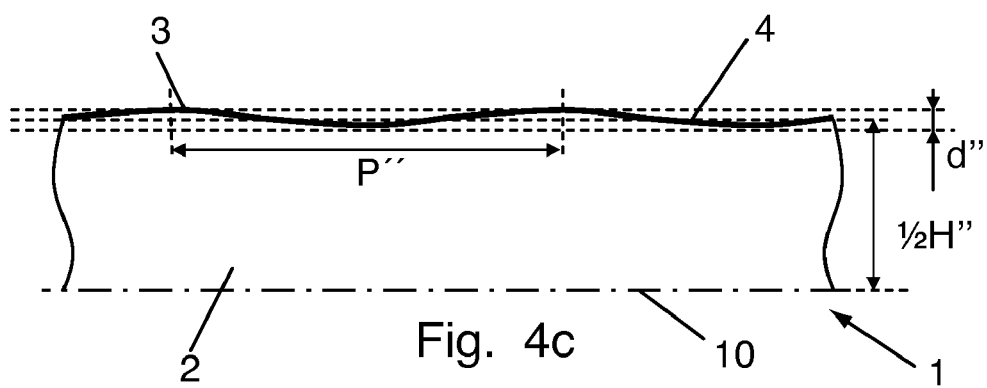

FIGS. 3a and 3b illustrate an electroactive composite 1 comprising two electrically conductive layers 4 separated by a dielectric film 2 being exposed to zero electrical potential difference (FIG. 3a) and being exposed to a high electrical potential difference (FIG. 3b). As illustrated in FIG. 3b the dielectric film 2 is expanded, while the electrically conductive layers 4 are evened out, when exposed to an electrical potential difference. This is shown in detail in FIGS. 4a-4c which illustrate portions of a section of the electroactive composite 1 at different steps in time, with hatchings omitted for the sake of clarity. A line of symmetry 10 is indicated at the bottom of each figure, illustrating that the composite 1 is an electroactive composite having an electrically conductive layer 4 deposited on each surface. FIG. 4a illustrate the electroactive composite 1 being exposed to zero electrical potential difference, the corrugation depth being the designed depth d and the corrugation period being the designed period P. In FIG. 4b it is illustrated that the dielectric film 2 is expanded in the compliance direction resulting in a reduced thickness H' of the film. Furthermore, the electrically conductive layer 4 is evened out resulting in a smaller corrugation depth d' and a larger corrugation period P'. FIG. 4c illustrate the electroactive composite 1 at a later time step, the thickness H" of the film 2 being even more reduced, the corrugation depth d" being even smaller and the corrugation period P" being larger.

It should be noted that capacitors produced in accordance with the present invention exhibit a 'self-healing' mechanism. A self-healing mechanism is characteristic of capacitors with very thin electrodes. It occurs when the dielectric material of the capacitor presents defects such as inclusions, pinholes, etc. For such a capacitor with a given thickness, when the applied potential difference between electrodes approaches the so-called breakdown voltage defined above, the average electric field approaches the critical breakdown field. However, in regions with defects, it will indeed exceed this critical breakdown field, and a cascading effect due to accelerated and colliding charges across dielectric film thickness at the positions of the defects occurs, thereby inducing a high inrush transient current across the dielectric material. This results in a local transient over-heating with characteristic times in the microseconds range or much below, which is enough to "deplete/evaporate" the material of the very thin opposite electrodes at the positions of the defects and their close vicinity. This results in areas around defects where there is no more electrode material. Moreover the dimension of the areas with depleted electrode material increases with the local field. However, the capacitor as such is not damaged and continues to operate. Thus, the reference to 'self-healing'. As long as the depleted areas represent in total a very negligible fraction of the entire area of the capacitor, this will have very little consequence on the performance of the capacitor. Self-healing does not take place if the capacitor is made with thick electrodes, because the level of local over-heating is not sufficient to deplete the thick electrode material at the defects. In that case, when the critical breakdown is reached, consequent and instant damage of the capacitor occurs. In practice, the inventors of the present invention have made metallic electrodes with thickness up to 0.2 µm and always observed self-healing, even when operating the capacitor above breakdown. This does not cause any substantial damage to the capacitor, and the capacitor therefore continues to operate.

FIGS. 5-9 illustrate examples of lamination of composites 1 thereby creating multilayer composites. As shown in FIGS. 5a and 6a, an electroactive multilayer composite 15, 16 comprises at least two composites 1, each composite 1 comprising a dielectric film 2 having a front surface 20 and a rear surface 21, the rear surface 21 being opposite to the front surface 20. The front surface 20 comprises a surface pattern 3 of raised and depressed portions and a first electrically conductive layer (not shown) covering at least a portion of the surface portion 3. FIGS. 5a and 6a only show a portion of a multilayer composite 15 and 16, which portions having proportions out of order for illustration purposes.

Figure 5A:
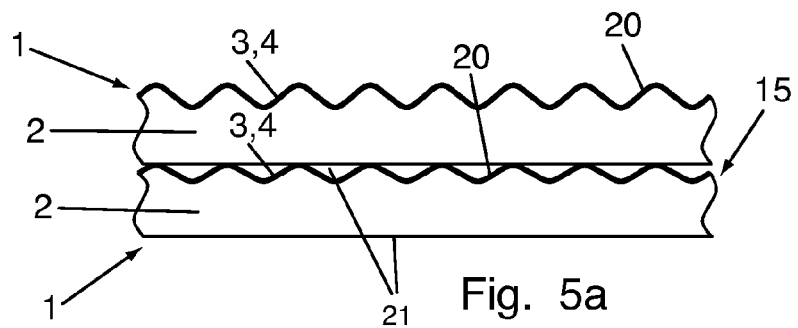
FIGS. 5c and 5d illustrate an electroactive multilayer composite being exposed to zero electrical potential difference and being exposed to a high electrical potential difference.
Figure 5B:
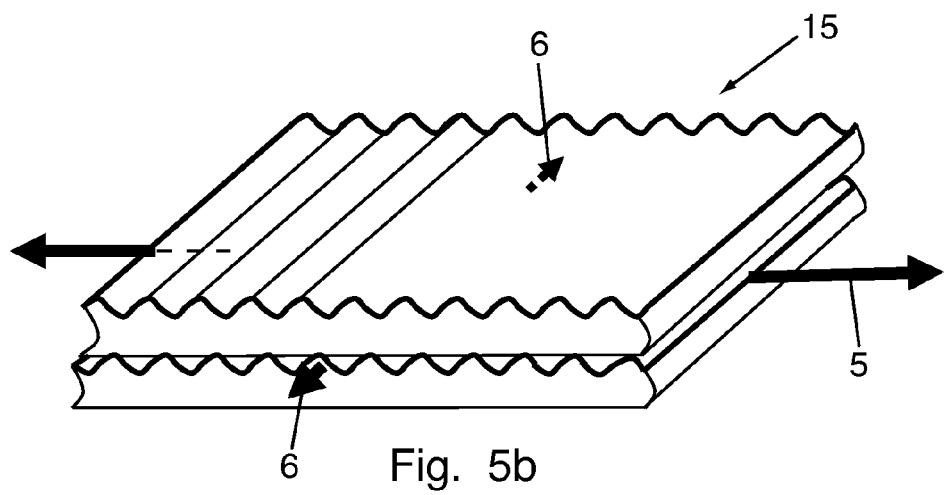

FIGS. 5a and 5b show an electroactive multilayer composite 15 having the first composite 1 arranged with its front surface 20 facing the rear surface 21 of the adjacent composite 1, in the following referred to in general as a Front-to-Back multilayer composite 15. In this type of lamination process, the electrically conductive layer of the first composite 1 is in direct contact with the rear surface of the second composite 1. The composites 1 are laminated either by the use of an elastomer of the same type as used for producing the dielectric film 2 or alternatively, the two composites 1 are stacked without use of an adhesive. For some purposes it is preferred that the multilayer composite is made of stacked composites without the use of an adhesive. In these cases, the wave troughs are simply filled with air.

Due to the pattern of raised and depressed surface portions 3, the electrically conductive layer of each of the composites may even out as the film expands, and recover its original shape as the film contracts along the direction defined by arrows 5 (see FIG. 5b) without causing damage to the electrically conductive layers, this direction thereby defining a direction of compliance. Thus, the multilayer composite 15 shown in FIG. 5b is designed to be very compliant in the direction defined by arrows 5 and designed to be very stiff in the transverse direction defined by arrows 6.

Figure 5C:
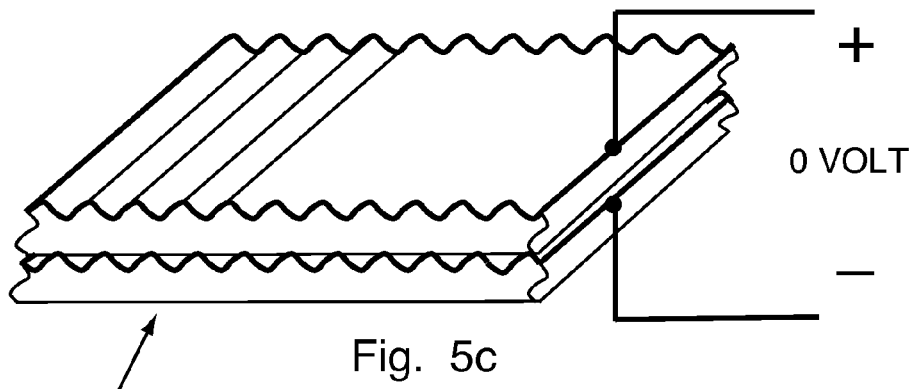
Figure 5D:
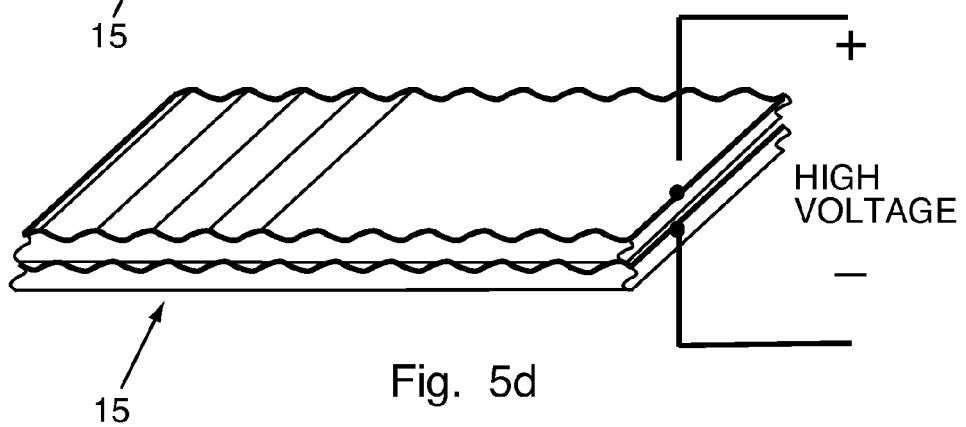

FIGS. 5c and 5d illustrate the electroactive multilayer composite 15 being exposed to zero electrical potential difference and being exposed to a high electrical potential difference. As can be seen from FIG. 5d the dielectric film is expanded, while the electrically conductive layers are evened out, when exposed to an electrical potential difference. It can further be seen that the depth of the wave troughs (the corrugation depth d) is reduced when the multilayer composite is exposed to an electrical potential difference. The composites can be bonded by applying a high electrical potential difference to the stacked composites, whereby the film of one composite and the electrically conductive layer of an adjacent composite adhere to each other without the use of an additional adhesive. Thus, they may be brought into intimate contact by electrostatic forces. Alternatively, they may adhere to each other by pressing them together, e.g. by the use of rollers, due to the characteristics of the dielectric film which may be slightly tacky when made of an elastomer.

Figure 6A:
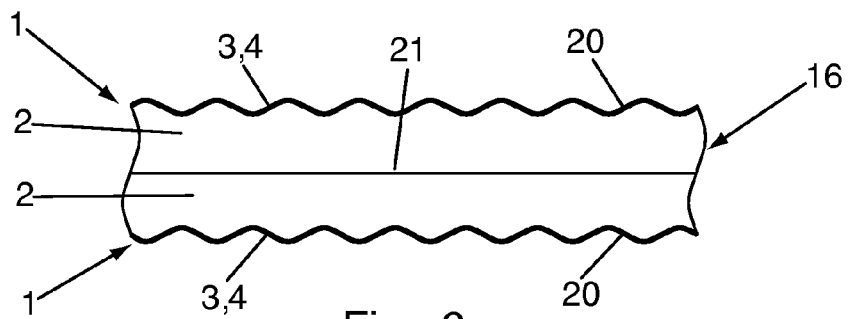
FIGS. 6a and 6b illustrate another example of lamination of composites according to an embodiment of the invention, thereby forming an electroactive multilayer composite.
Figure 6B:
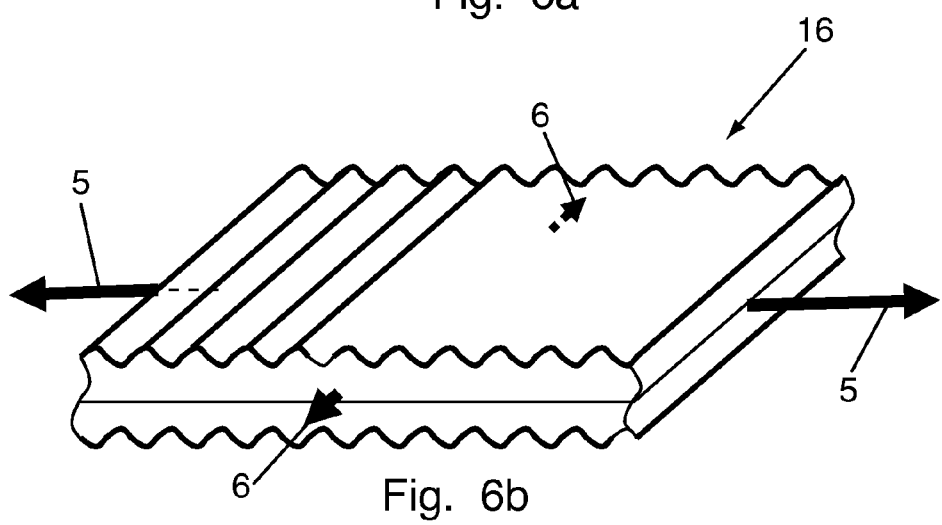

As an alternative hereto, FIGS. 6a and 6b show an electroactive multilayer composite 16 having the first composite 1 arranged with its rear surface 21 facing the rear surface 21 of the adjacent composite 1, in the following referred to in general as a Back-to-Back multilayer composite 16. The composites 1 are adhesively bonded either by the use of an elastomer adhesive with characteristics similar to the dielectric film 2 of the composites 1. Alternatively, the two composites 1 are stacked without use of an adhesive.

In the electroactive multilayer composite 16 illustrated in FIG. 6a, the corrugated surfaces 3 can be coated with the electrically conductive layer before or after laminating the composites 1. The Back-to-Back multilayer composite 16 has the advantage that the impact of defects in the dielectric film 2, pin-holes in the electrically conductive layer etc. may become less critical if the adjacent layer does not have similar errors in close vicinity.

If the individual composites 1 are made in identical production steps, there may be an increased risk that identical errors exist on the same location of each composite 1. To reduce the impact of such errors, it may be an advantage to shift the location of one composite 1 relative to an adjacent composite 1, or to rotate the composites 1 relative to each other.

The lamination process represents a critical step in the production process. Thus, precise lamination machines equipped with tension control are to be used.

Similar to the multilayer composite 15 the multilayer composite 16 shown in FIG. 6b is designed to be very compliant in the direction defined by arrows 5 and designed to be very stiff in the transverse direction defined by arrows 6.

Figure 6C:
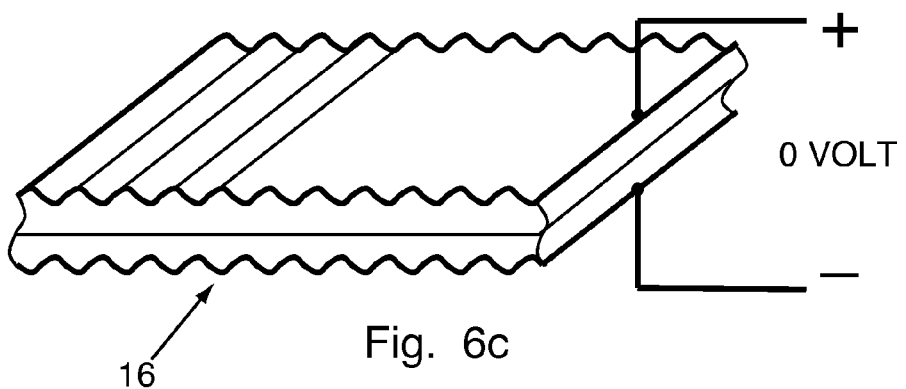
FIGS. 6c and 6d illustrate another electroactive multilayer composite being exposed to zero electrical potential difference and being exposed to a high electrical potential difference.
Figure 6D:
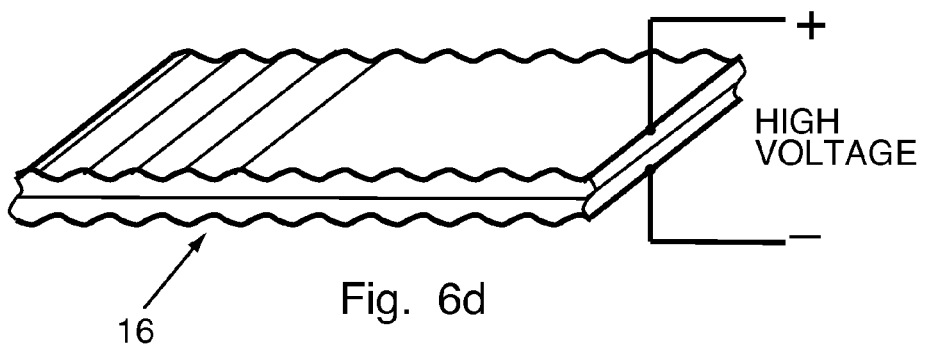

FIGS. 6c and 6d illustrate the electroactive multilayer composite 16 being exposed to zero electrical potential difference and being exposed to a high electrical potential difference. As can be seen from FIG. 6d the dielectric film is expanded, while the electrically conductive layers are evened out, when exposed to an electrical potential difference.

Figure 7A:
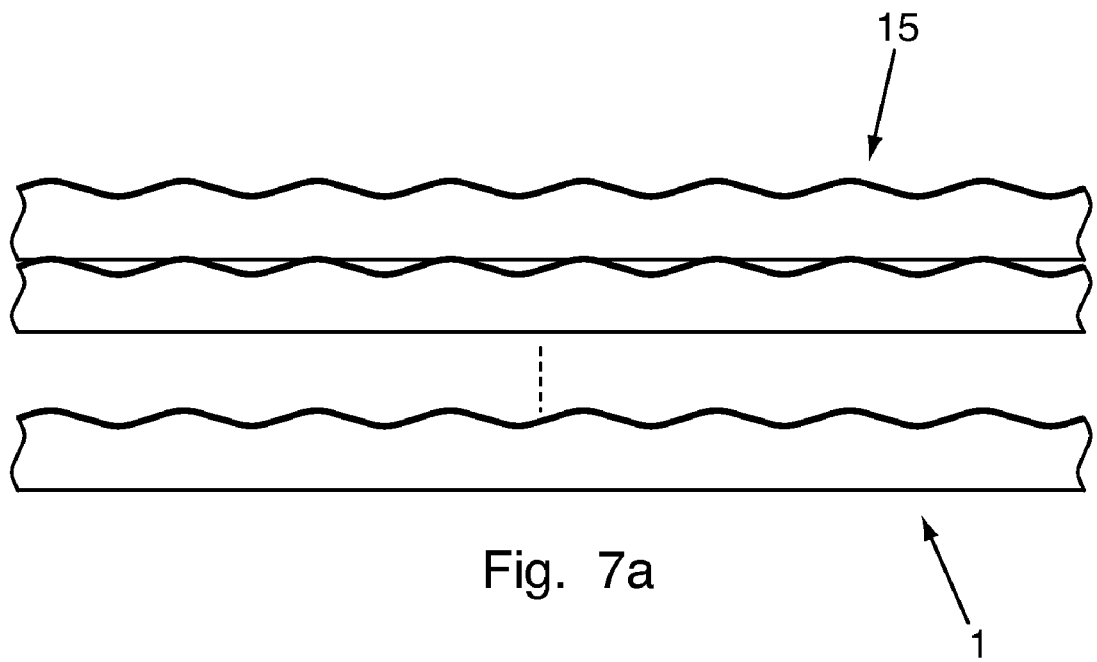
FIGS. 7-9 illustrate examples of lamination principles of composites according to embodiments of the invention.

FIG. 7a illustrates that an electroactive multilayer composite 15 of the kind illustrated in FIG. 5a may further contain an endless number of composites 1 depending on the specific need. The multilayer composite in FIG. 5a contains one dielectric film 2 out of two dielectric films 2 which is inactive, i.e. only one of the two dielectric films 2 is located between two electrically conductive layers (not shown). FIG. 7a illustrates that a larger number of composites decreases the impact of the inactive layers on the electroactive multilayer composite 15 as such, since all but the lowermost composite 15 are located between electrodes.

Figure 7B:
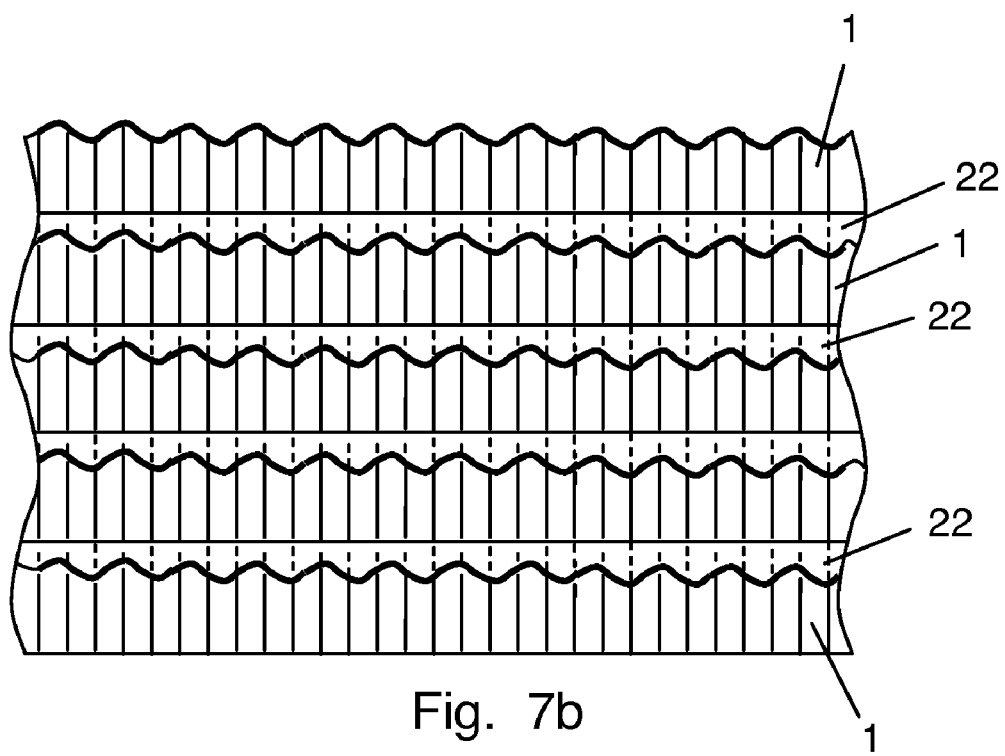

FIG. 7b illustrates an alternative way of forming an electroactive multilayer structure 15 containing an endless number of composites 1. The composites 1 have been laminated by means of adhesive layers 22 arranged between the composites 1 in such a manner that the composites 1 are not in direct contact with each other. The material of the adhesive layers 22 has properties similar to those of the dielectric material of the composites 1, in terms of ability to stretch. This is in order to allow the adhesive layers 22 to stretch along with the dielectric material when the multilayer structure 15 is working. Thus, the adhesive layers 22 may advantageously be made from an elastomer, or from a material with elastomer-like properties.

Figure 8:
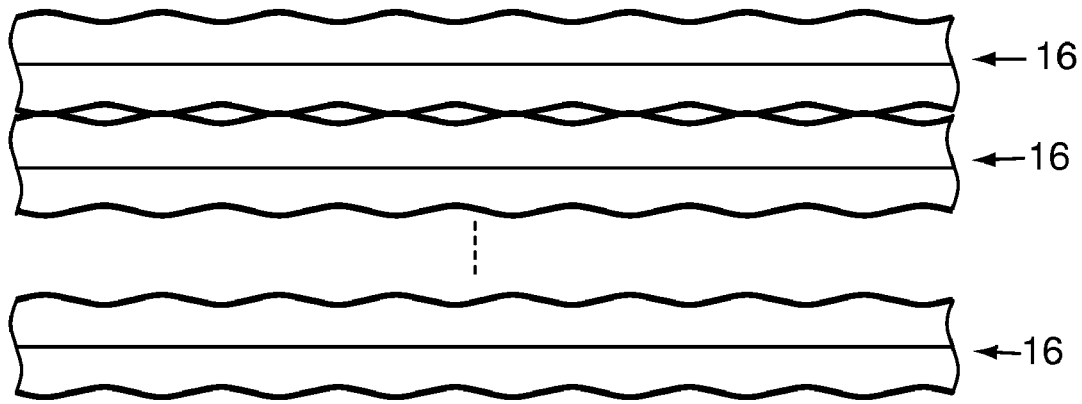

In FIG. 8, two electroactive multilayer composite 16 of the kind also shown in FIG. 6a, i.e. Back-to-Back composites, are stacked on top of each other. In this electroactive multilayer composite, the electrically conductive layers are pair-wise in contact with each other. Two dielectric films 2 are located between two of such sets of two electrically conductive layers. The laminate offers a reduced impact of production defects in the individual layers. Furthermore, it is illustrated that a third or even further electroactive multilayer composite (s) 16 may be added to this multilayer composite.

Figure 9:
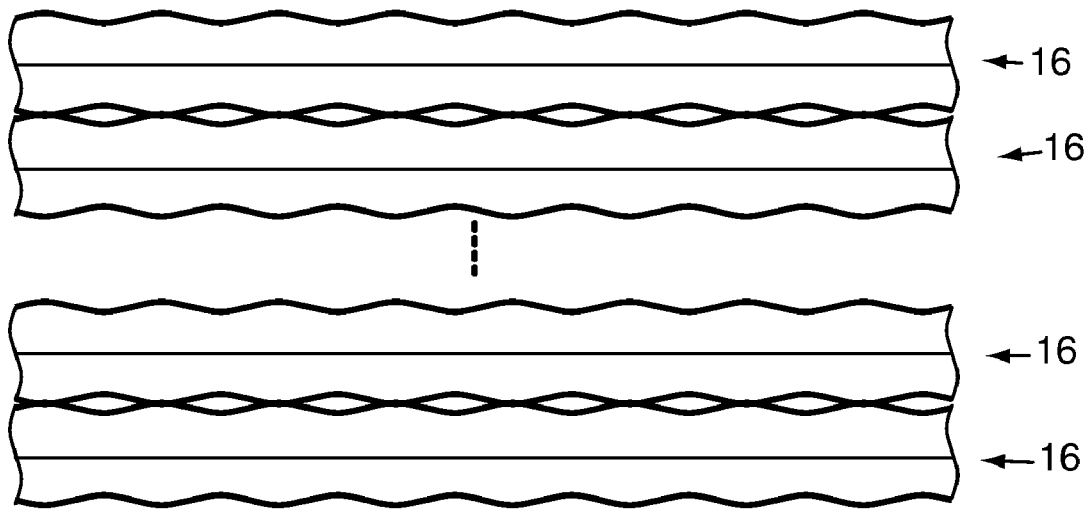

FIG. 9 illustrates a stack of multilayer composites 16 similar to the stack shown in FIG. 8. However, in the situation illustrated in FIG. 9, the Back-to-Back multilayer composites 16 are stacked pair-wise, and the pair-wise stacked multilayer composites 16 are then stacked together. In the stack illustrated in FIG. 9 it is ensured that the electrically conductive layers of adjacent pair-wise stacks facing each other has the same polarity. Accordingly, such a stack can be rolled without risking short-circuiting of the electrodes, and the stack is therefore suitable for being rolled, e.g. to form a tubular transducer.

FIG. 10a illustrates a Front-to-Back electroactive multilayer composite 15 as shown in FIG. 5a being rolled. Since the composite 1 may be produced in very long lengths, so called "endless" composites, the multilayer composite 15 may also be produced in very long lengths, thereby allowing for the producing for rolled multilayer composites comprising numerous windings.

FIG. 10b illustrates rolling of a multilayer composite 15 around rods 23. The rods 23 are positioned at an end of the multilayer composite 15, and the composite 15 is then rolled around the rods 23 as indicated. Thereby the multilayer composite 15 obtains a rolled tubular shape.

FIGS. 11a and 11b show a portion of a composite 24 which is suitable for forming a rolled or otherwise laminated transducer. The composite 24 comprises a film 2 made of a dielectric material having a surface provided with a pattern of raised and depressed surface portions, thereby forming a designed corrugated profile of the surface, i.e. the film 2 is similar to the film 2 of the composite 1 of FIG. 1c. In this case the film 2 is provided with an electrically conductive layer comprising negative electrode portions 25 and positive electrode portions 26 arranged in an interleaved pattern, i.e. the negative electrode portions 25 and the positive electrode portions 26 appear alternating with a gap in between. In the gap an electrically conductive layer is not deposited on the dielectric film. The arrow 27 indicates that the composite 24 may be a very long, an "endless", composite as shown in FIG. 13a, and as a folded composite as shown in FIG. 13b.

Figure 12A:
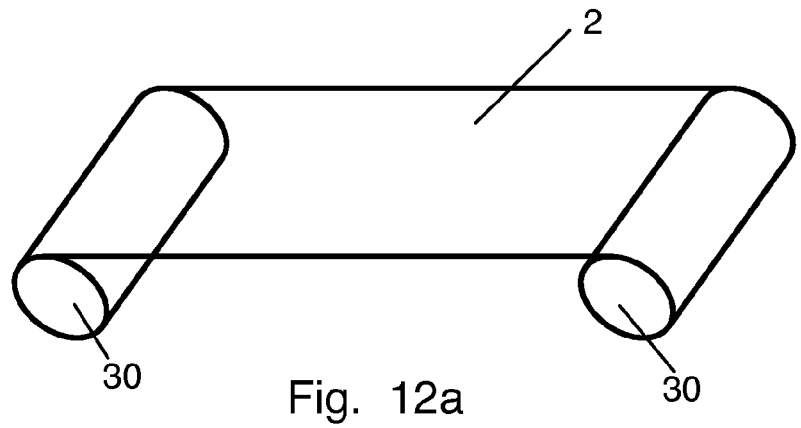
FIGS. 12a-12c illustrate a process of making the composite of FIG. 11 and some of the tools needed for the production.
Figure 12B:
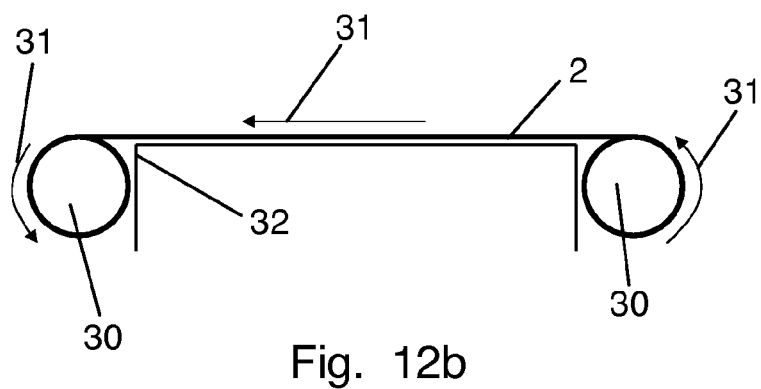
Figure 12C:
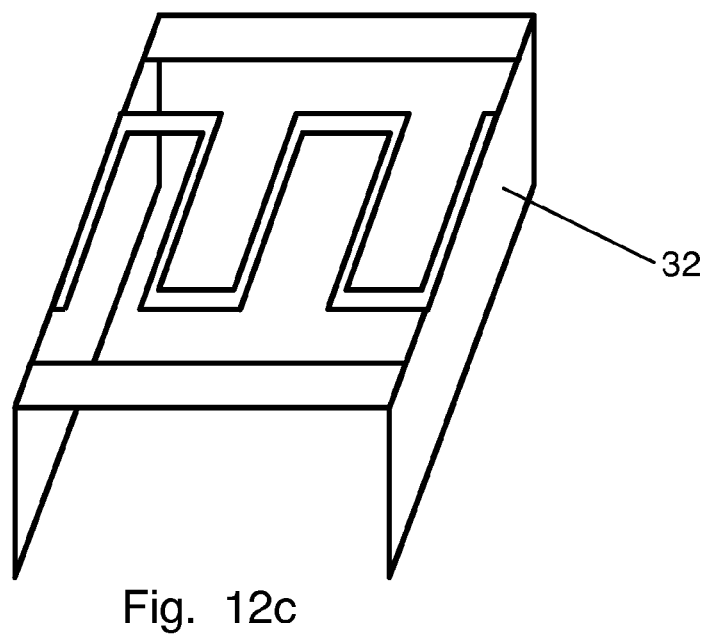

FIGS. 12a-12c illustrate one possible method of making the composite 24 of FIG. 11. FIG. 12a illustrates the film 2 being a very long film on two rolls 30. The electrically conductive layer (not shown) is deposited on the film 2 using a non-continuous vapour deposition roll to roll method. The arrows 31 indicate the process direction. The electrically conductive layer is deposited through a shadow mask 32 in order to provide gaps in between the electrode portions 25, 26. When the electrically conductive layer is deposited on an area of the film 2, the film 2 is rolled in the direction of the arrows 31 and stopped. A shutter (not shown) is opened and the electrically conductive layer is deposited on the next area of the film 2, this area being adjacent to the previous area, and ensuring a continuous transition contact between electrodes with the same polarity. The shutter is closed when the required thickness of the electrically conductive layer is achieved. The electrode deposition principle where electrodes are deposited through a shadow mask is, for practical reasons, more appropriate for production of electrodes with constant width and gap. As an alternative, the gap may be made by means of laser ablation. In fact, it is preferred to make the gap by means of laser ablation, since when using such a technique it is very easy to provide a variable distance between each gap and thus a variable width of each portion of the electrically conductive layer. This will be explained in further detail below.

Figure 13A:
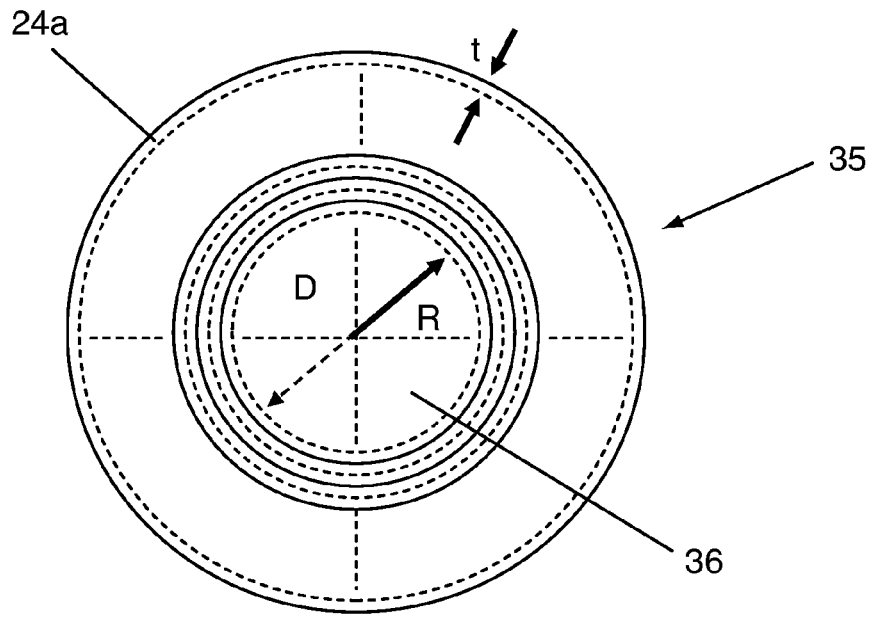
FIG. 13a illustrates the composite of FIG. 11a formed as a rolled composite.

FIG. 13a illustrates the composite 24a of FIG. 11a and FIGS. 12a-12b formed as a rolled composite 35. D and R denote diameter and radius of a roll 36 onto which the composite 24 is rolled. The solid lines denote positive electrodes while the dotted lines denote negative electrodes. It should be noted that for the sake of clarity, the rolled composite is shown by means of concentric circles. However, it should be understood that in reality the rolled composite forms a spiral pattern. The width, w, of the electrode portions 25 and 26 and the width of the gap between these electrode portions are determined based on the cross section of the roll 36 as follows: $2\pi(R)=w+gap$, where the gap is very small as compared to w. Furthermore, it is preferred that the thickness t of the composite 24a is smaller than the gap. Otherwise, the efficiency of the transducer which is formed by this roll process becomes low. When a winding n is made by rolling the composite 24a, the gap is tangentially shifted by a film thickness order, $2\pi t \cdot n$ with respect to the previous winding. Thus if the gap shift exceeds the gap width, electrodes with same polarity will tend to overlap, and this renders the corresponding portions of the capacitor inactive. This method is preferred for building actuators with limited number of windings and operating in a pre-strained configuration or flat tubular actuator configurations where electrode portions and gaps are deposited in the portions of dielectric web that correspond to flat portions of the flat tubular actuator. An alternative method where laser ablation is used to design the electrodes with variable width but constant gap width is more appropriate for the rolled tubular actuator. In this case, the width of the gap and depleted regions is determined by the traveling laser spot size, and the width of a given electrode associated to a given winding of the growing circumference of the actuator is such that width and gap match the winding circumference.

Figure 13B:
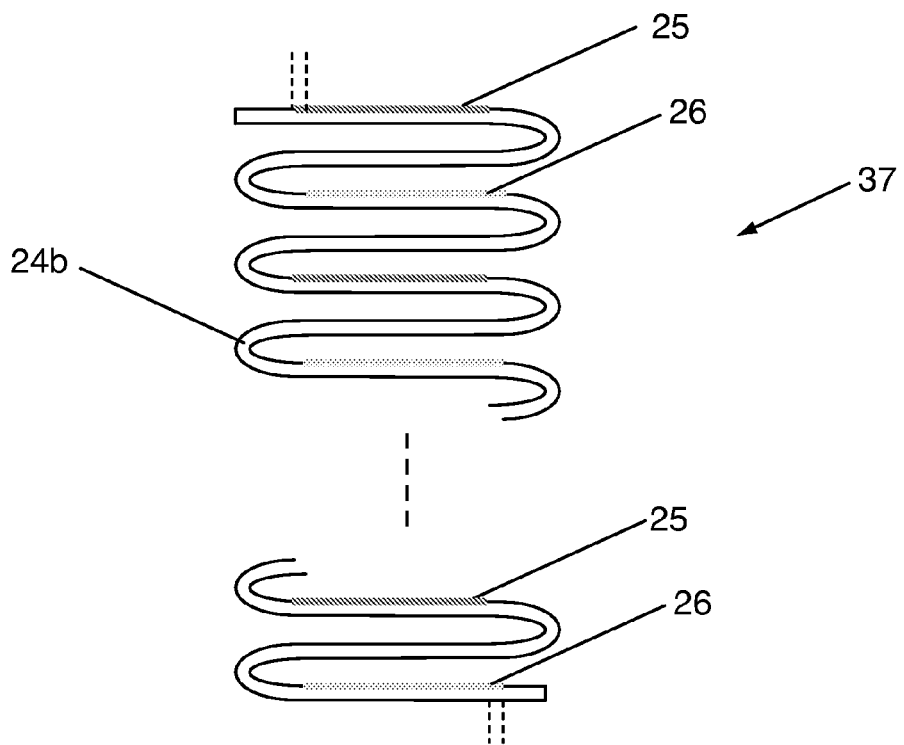
FIG. 13b illustrates the composite of FIG. 11b formed as a folded composite.

Similarly, FIG. 13b illustrates the composite 24b of FIG. 11b as a folded composite 37. It is clear from FIG. 13b that the composite 24b is folded carefully in such a manner that it is ensured that electrodes 25, 26 of opposite polarity do not come into direct contact.

FIGS. 14a and 14b illustrate lamination of the composite shown FIG. 11 by folding of the composite 24. Alternatively, the composite could be of the kind shown in FIGS. 1a and 2. The composite 1, 24 is manufactured in a long structure, thereby defining a length and a width of the composite 1, 24, and has a surface 3 with a pattern of raised and depressed surface portions. The pattern defines waves of crests and troughs, extending in a common direction, and the common direction is arranged substantially along the width of the long structure. Accordingly, the composite 1, 24 is compliant in a direction perpendicular to the common direction, i.e. along the length of the long structure.

The composite 1, 24 of FIG. 14a is laminated by folding the long structure along the length, i.e. in such a manner that the width of the resulting electroactive multilayer composite 40 is identical to the width of the composite 1, 24. Due to the orientation of the compliant direction of the composite 1, 24 the electroactive multilayer composite 40 will be compliant in a direction indicated by arrows 41.

FIG. 14b illustrates lamination of a composite 1, 24 according to another embodiment of the invention. This is very similar to the embodiment shown in FIG. 14a. However, in this case the common direction is arranged substantially along the length of the long structure, and the composite 1, 24 is therefore compliant in a direction along the width of the long structure, as the composite of FIG. 1b. Accordingly, the resulting electroactive laminate 42 will be compliant in a direction indicated by arrows 43.

Thus, the laminated composite shown in FIG. 14a is compliant along the length of the laminated composite. This means that the structure of FIG. 14a can be made to be of any length, and thus of any desired stroke length. Similarly, the laminated composite of FIG. 14b is compliant along the width of the laminated composite. This means that the structure of FIG. 14b can be made to be of any width. Thus, it is possible to design a transducer with any appropriate dimensions in accordance with geometrical requirements of the intended application.

FIGS. 15a-15c are perspective views of direct actuating transducers 50 according to embodiments of the invention. The direct actuating transducer 50 of FIGS. 15a-15c have been manufactured by rolling a multilayer composite, e.g. of the kind shown in FIG. 1a or in FIG. 5. The transducer 50a of FIG. 15a is solid, whereas the transducer 50b of FIG. 15b is hollow. The transducers 50 may have any elongated form, e.g. substantially cylindrical with a cross section which is substantially circular, elliptical or curve formed as illustrated in FIG. 15c.

In FIGS. 15a-15c the composite, which has been rolled to form the columnar shaped transducers 50, has a direction of compliance which is parallel to the directions indicated by arrows 51. Accordingly, when electrical energy is applied to the electrodes of the direct actuating transducers 50, the transducers 50 will elongate axially in the direction of the arrows 51. It has now been found that if the transducers 50 are properly made and dimensioned in accordance with certain aspects of the invention, they are able to exert significant force against an axial load which tends to resist the axial elongation.

As indicated earlier in this specification, the electroactive composite of the present invention is quite supple and pliable, resembling ordinary household cling film or polyethylene shopping bag sheet material in pliability. The composite differs from those materials by its higher elasticity and its mechanical anisotropy, as previously explained, being very stretchy in one direction and much less stretchy in the perpendicular direction.

The inventors now have realised that despite of the suppleness, pliability and elasticity of the composite, a roll formed by winding up a sufficient length of the composite will be quite stiff. If the roll is properly wound with respect to the mechanical anisotropy of the film, it will have axial compliance brought about by the mechanical anisotropy, and yet it can be quite resistant to buckling under axial load.

Accordingly, a composite of corrugated anisotropic dielectric film layers with electrically conductive electrode layers can be rolled into a tubular shape with a number of windings sufficient to make the resulting structure of the tubular element sufficiently stiff to avoid buckling. In the present context, the term 'buckling' means a situation where an elongated structure deforms by bending due to an applied axial load. It has been found that no additional component such as any stiffening rod or spring inside the elongated structure is necessary to obtain sufficient stiffness to avoid buckling under technically useful levels of axial load. The required stiffness is obtained merely by winding up a sufficient number of windings of the composite material.

The rolled structures illustrated in FIGS. 15a-15c are designed to withstand a specified maximum level of load at which the stiffness is sufficient to avoid buckling. This specified maximum level may, e.g., be a certain level of force at a certain level of elongation, or it may be a maximum level of actuation force, a blocking force, or a higher level of force occurring when the transducer is compressed to a shorter length against the direction of the arrows 51.

Design parameters for the direct actuating transducer as described in the present application are optimised according to design rules developed by the inventors. These design rules allow for determining the optimum dimensions of a rolled actuator (transducer) based on the actuator performance specifications.

The mechanical and electrostatic properties of an electroactive composite are used as a basis to estimate actuator force per unit area and stroke. Rolled actuators as described in accordance with the present invention are made by rolling/ spooling very thin electro-active composites, e.g. as shown in FIGS. 1a and 1b, having a thickness in the micrometers range. A typical actuator of this type can be made of thousands of windings and can contain as many as 100 windings per millimetre of actuator wall thickness.

When activated, direct/push actuators convert electrical energy into mechanical energy. Part of this energy is stored in the form of potential energy in the actuator material and is available again for use when the actuator is discharged. The remaining part of mechanical energy is effectively available for actuation. Complete conversion of this remaining part of the mechanical energy into actuation energy is only possible if the actuator structure is not mechanically unstable, like the well-known buckling mode of failure due to axial compression. This can be achieved by properly dimensioning the cross-sectional area of the actuator in relation to actuator length. Mathematically this corresponds to Euler's theory of column stability; in accordance with the invention, this theory also applies to an actuator column formed by rolling up a sufficient number of windings of electroactive multilayer composite.

The optimisation process starts by defining the level of force required for a given application. Then based on the actuator force per unit area, it is possible to estimate the necessary cross sectional area to reach that level of force.

For a cylindrical structure, the critical axial load or force $F_c$ for a given ratio between length and radius of the cylinder is given by:

$$F_C = \frac{c \cdot \pi^2 \cdot E \cdot A}{(L/R)^2},$$

where c is a boundary condition dependent constant,
E is the modulus of elasticity,
A is the cross sectional area of the cylinder,
L is the length of the cylinder, and
R is the radius of the cylinder.

Consider now an electro-active polymer transducer of cylindrical shape which is actuated by applying a voltage, V, to its electrodes. In the unloaded state, the transducer will simply elongate. If restrained by an axial load, the transducer will exert a force upon the load which increases with the voltage, V. The maximum force, $F_{max}$, which the transducer can be actuated to depends on the construction of the transducer.

For a given length L and cross section A, this means that the voltage needs to be controlled in such a manner that forces higher than $F_{max} < F_c$ are not allowed. For a given cross section, this means that the length of the cylinder must be smaller than a critical length, $L_C$, i.e. $L < L_C$, with $L_C$ defined as follows.

For a transducer 50 with a given cross section and a chosen maximum force level, the maximum force level being related to the maximum voltage level, the critical length, $L_C$, can be derived from the formula:

$$L_C \leq \sqrt{\frac{c \cdot r^2 \cdot \pi^2 \cdot E}{F_{max}/A}},$$

and the design criteria is $L < L_C$.

For a selected voltage level a transducer 50 with a given cross section is able to actuate with a given maximum force, the so-called blocking force, $F_{bl}$, at 0% elongation. In this situation the design criterion is:

$$L_C = \sqrt{\frac{c \cdot r^2 \cdot \pi^2 \cdot E}{F_{bl}/A}}.$$

Applying these design criteria for a transducer 50 made of an elastomer with E=1 MPa, $F_{bl}/A$=20 N/cm² and c=2, the design rule for $F_{max}=F_{bl}$ will be $L_{bl}$=10·r, i.e. the so-called slenderness ratio, $\lambda$, must fulfil the following condition in order to obtain a non-buckling structure at the load being equal to the blocking force:

$$\lambda \leq L/r = 10.$$

For alternatively chosen lower levels for the actuating force for the same transducer 50, i.e. for a cylindrically symmetric transducer 50 with the same radius, r, the design criteria for length L can be derived from the following formula:

$$L \leq L_{bl} \cdot \sqrt{F_{bl}/F}.$$

This may, e.g., mean that if the actuation level at 10% elongation is $\frac{1}{4} \cdot F_{bl}$, then the length, L, of that transducer at 10% elongation is:

$$L \leq L_{bl} \cdot \sqrt{1/\tfrac{1}{4}} = L_{bl} \cdot 2.$$

The theory of Euler can be applied to designing a transducer 50 with a specific need for transducer stroke and a chosen percentage of elongation of the dielectric film. Since there is no limitation to increase in cross sectional area, A, of the cylindrical symmetric transducer 50a and 50b due to an increased number of windings, and because the design rules derived from the theory of Euler are fulfilled, it is possible to simply provide the necessary number of windings to obtain a required level of actuation force. Accordingly, the technology described above makes it possible to build dielectric transducers having non-buckling characteristics at a given force level and a given stroke for direct actuation.

When designing a direct acting capacitive transducer, it is necessary to dimension its mechanical structure against buckling. This is done typically by increasing the area moment of inertia of its cross section, known as I. As an example, a piece of paper with a given thickness (h), width (w) and length (L) will bend when a little force is applied to the paper in a direction parallel to its length. However, by rolling it in the width direction, a much larger force will be necessary to make it buckle. Rolled-to-flat bending stiffness ratio is then given by $$\frac{3}{2} \cdot \left(1 + \left(\frac{w}{h/\pi}\right)^2\right).$$

An example of such is to take w=40 mm and h=1 mm, then the ratio is about 245.

Stabilisation of the actuator against any mechanical instability requires dimensioning its cross section by increasing its area moment of inertia of the cross section I. Low values of I result in less stable structures and high values of I result in very stable structures against buckling. The design parameter for dimensioning the structure is the radius of gyration $r_g$ which relates cross section A and area moment I. Low values of $r_g$ result in less stable actuator structures and high values of $r_g$ result in very stable actuator structures. After having defined optimum ranges for both area A and radius of gyration $r_g$, it is possible to define the optimum range for the rolled actuator wall thickness, t, with respect to $r_g$ in the form of $t/r_g$. Area A, radius $r_g$ and wall thickness t are the design parameters for dimensioning the actuator cross-section for maximum stability. Low values of $t/r_g$ result in very stable actuator structures and high values of $t/r_g$ result in less stable actuator structures.

Once the ranges of the cross section parameters have been determined, it is necessary to estimate the maximum length L of the actuator for which buckling by axial compression does not occur for the required level of force. Slenderness ratio defined as the length L to radius of gyration $r_g$ ratio is the commonly used parameter in relation with Euler's theory. Low values of $L/r_g$ result in very stable actuator structures and high values of $L/r_g$ result in less stable actuator structures against buckling.

Once all design parameters for the optimum working direct actuator have been determined, it is possible to estimate the total number of windings that are necessary to build the actuator based on the actuator wall thickness t and the number of windings per millimetre n for a given electro-active composite with a specific thickness in the micrometer range.

In a preferred embodiment, the ratio between the number n of windings and the wall thickness t of the transducer, n/t, should be in the range of 10 windings/mm–50 windings/mm. Furthermore, the slenderness ratio, being the ratio between the length L of the transducer and the gyration radius $r_g$ of the transducer should be less than 20. The gyration radius $r_g$ is defined as $r_g = \sqrt{I/A}$, where I is the area moment of a cross section and A is the cross sectional area of the transducer.

Thus, by carefully designing transducers in accordance with the present invention, it is possible to obtain large actuation forces, even though a very soft dielectric material is used. Actuation forces may even reach levels comparable to conventional transducers made from harder materials, e.g. magnetic transducers. This is a great advantage.

Figure 16A:
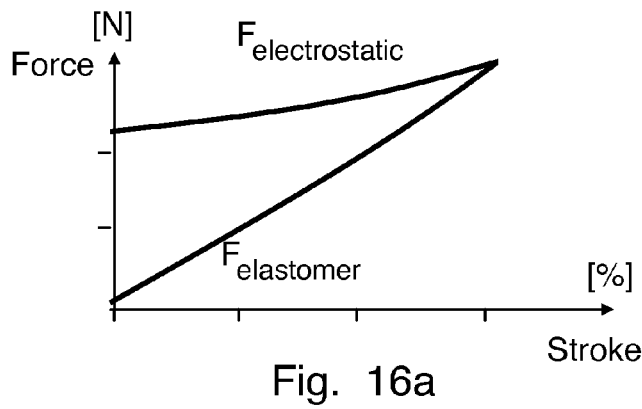
FIGS. 16a-16c are graphs illustrating force as a function of stroke in a direct actuating transducer according to an embodiment of the invention.

FIG. 16a is a graph illustrating force as a function of stroke in a direct actuating transducer according to an embodiment of the invention. When voltage is applied to the anisotropic compliant electrically conductive layers of the transducer, electric field induced compression across film thickness is converted into elongation/stroke along the compliant direction of the transducer. The corresponding stress is referred to as Maxwell stress, P, and the corresponding actuation force is referred to as electrostatic force $F_{electrostatic}$. Upon elongation, the dielectric material exerts a counterforce $F_{elastomer}$ which increases with transducer stroke as shown in FIG. 16a.

Figure 16B:
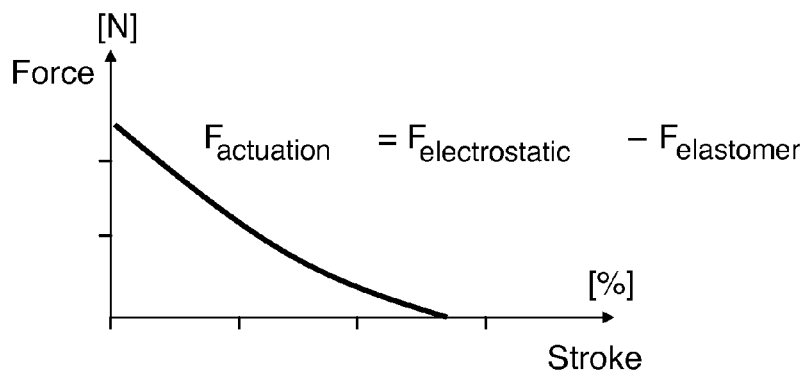

Consequently, the effective force available for direct actuation $F_{act}$ is a result of the two described forces, and $F_{act} = F_{electrostatic} - F_{elastomer}$, as shown in FIG. 16b. The characteristic curve representing force versus stroke of the direct actuating transducer is typical for force transducers, where actuation force decreases as a function of increasing stroke, until a maximum value of the stroke is reached corresponding to "zero" actuation force as depicted in FIG. 16b.

Figure 16C:
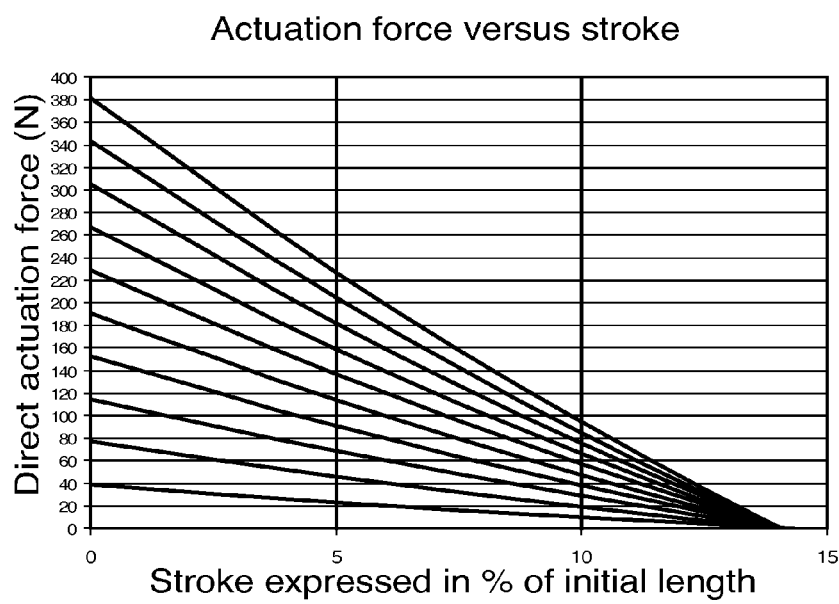

FIG. 16c illustrates the range of calculated direct actuation forces as a function of transducer stroke for different outer diameters of a direct acting capacitive transducer, a rolled transducer. Large actuation forces in the range of hundreds to thousands of Newtons can be generated. Blocking forces are typically 4 orders of magnitude larger than nominal actuations forces defined at 10% transducer stroke. A direct acting capacitive transducer made of a 40 micrometer thick dielectric material with elastic modulus in the range of 0.5-1 MPa will generate a force per unit area in the range of 0.1-0.2 $N/mm^2$, for a typical actuation voltage of 3000 volts. When considering large transducer cross sections, this corresponds to large actuation forces as shown in FIG. 16c.

FIGS. 17a and 17b are perspective views of direct actuating transducers 52 according to alternative embodiments of the invention. The transducers 52 of FIGS. 17a and 17b have a direction of compliance along the tangent of the cylinder. Accordingly, the elongation of the transducers 52 takes place on a perimeter of the tubular structure, illustrated by the arrows 53, i.e. the transducer 52 is caused to expand and contract in a radial direction.

FIG. 18a illustrates lamination of a composite 1 to form a flat tubular structure 60. The composite 1 may advantageously be of the kind shown in FIGS. 1a and 2. The transducer 60 is a laminate of a sufficiently high number of adhesively bonded composites to ensure a rigidity of the transducer, which rigidity is sufficient to enable that the transducer can work as an actuator without being pre-strained. The transducer 60 is manufactured by winding a continuous composite, e.g. of the kind shown in FIGS. 1a and 2, in a very flat tubular structure. Using this design the limitations regarding number of layers described above are eliminated. Thereby, the transducer 60 can be made as powerful as necessary, similarly to what is described above with reference to FIGS. 15a-15c.

The flat tubular structure of the transducer 60 shown in FIG. 18a is obtained by rolling the composite 1 around two spaced apart rods 61 to form a coiled pattern of composite 1. Due to the orientation of the compliant direction of the composite 1, the flat tubular structure 60 will be compliant in a direction indicated by arrows 62. FIG. 18b illustrate the transducer of FIG. 18a being pre-strained by two springs 63.

Figure 19A:
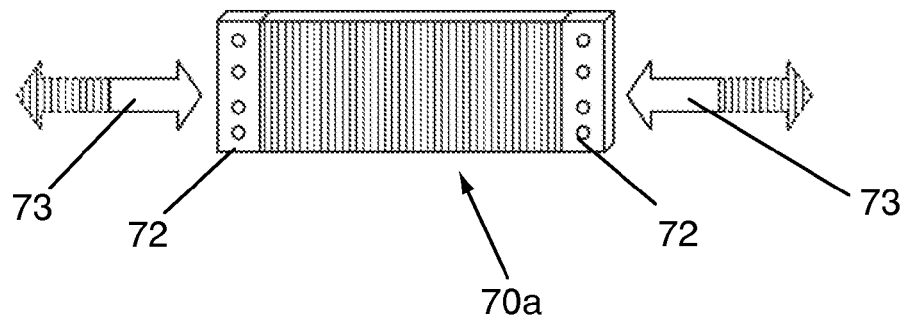
FIGS. 19a-19c are perspective views of an actuating transducer having a flat structure.
Figure 19B:
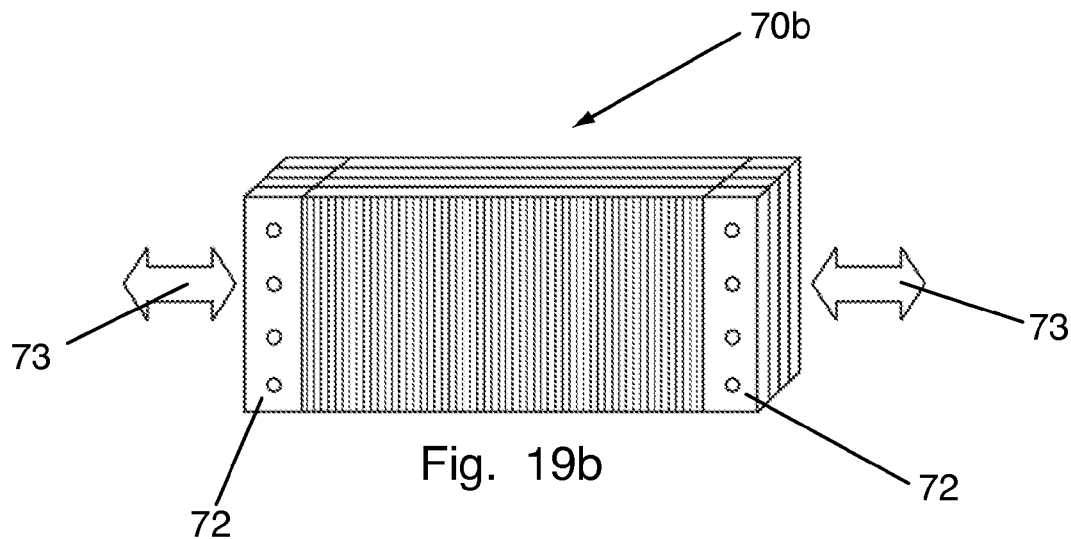
Figure 19C:
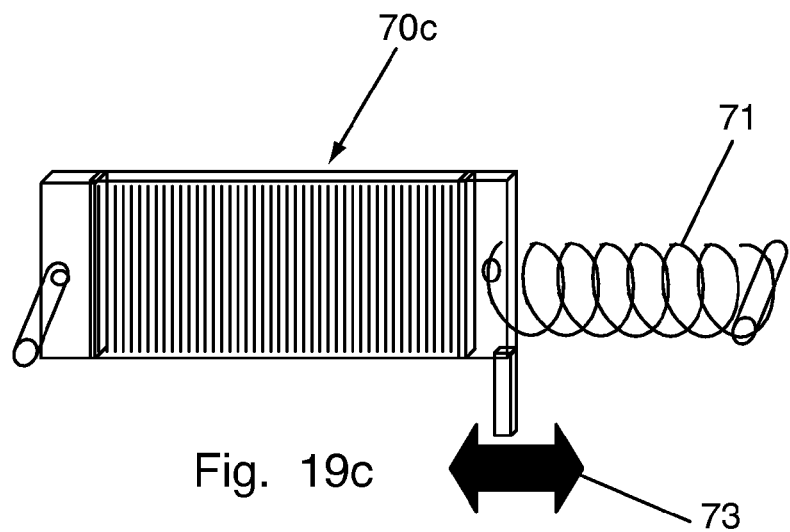

FIGS. 19a-19c are perspective views of transducers 70 having a flat structure. The transducer 70 is a multilayer composite of a sufficiently high number of adhesively bonded composites to ensure a rigidity of the transducer, which rigidity is sufficient to enable that the transducer can work as an actuator without being pre-strained. The transducer 70 is manufactured by laminating a continuous composite, e.g. of the kind shown in FIGS. 1a and 2, in a flat structure. Using this design the limitations regarding number of layers described above are eliminated. Thereby, the transducer 70 can be made as powerful as necessary, similarly to what is described above with reference to FIGS. 15a-15c. The transducer 70a is a multilayer composite of a sufficiently high number of adhesively bonded composites to ensure a rigidity of the transducer, which rigidity is sufficient to enable that the transducer can work as an actuator without being pre-strained. The transducer 70b is dimensioned by stacking a number of transducers 70a. As an alternative hereto, the transducer 70c may be pre-strained by a spring 71 or by other elastically deformable elements.

The transducer 70a and 70b is provided with fixation flanges 72 in order to attach the transducer in an application, e.g. in order for the transducer to work as an actuator. The arrows 73 indicate the direction of compliance.

Figure 20A:
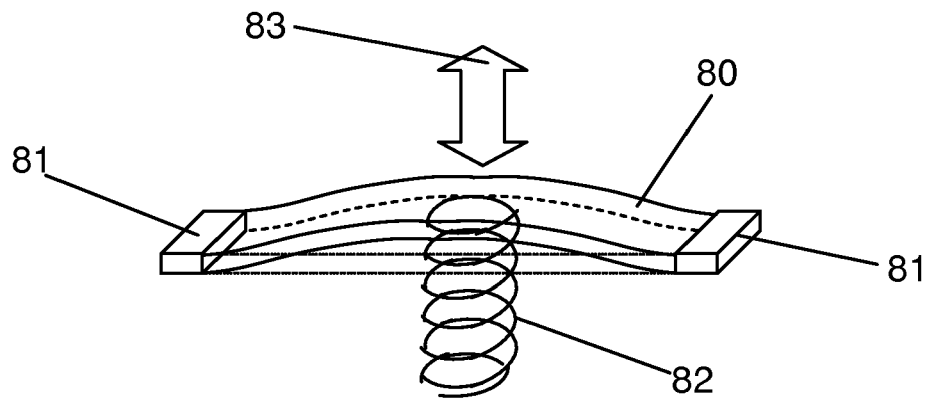
FIGS. 20a-20e illustrate actuating transducers provided with a preload.
Figure 20B:
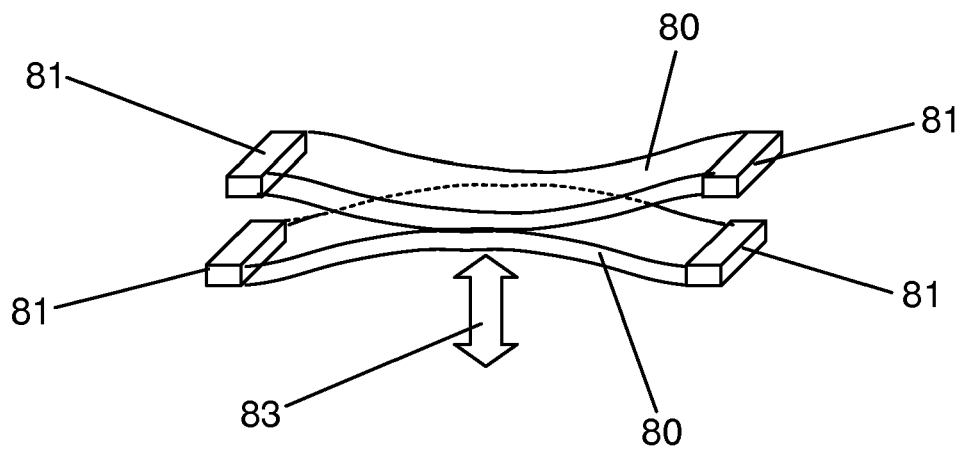
Figure 20C:
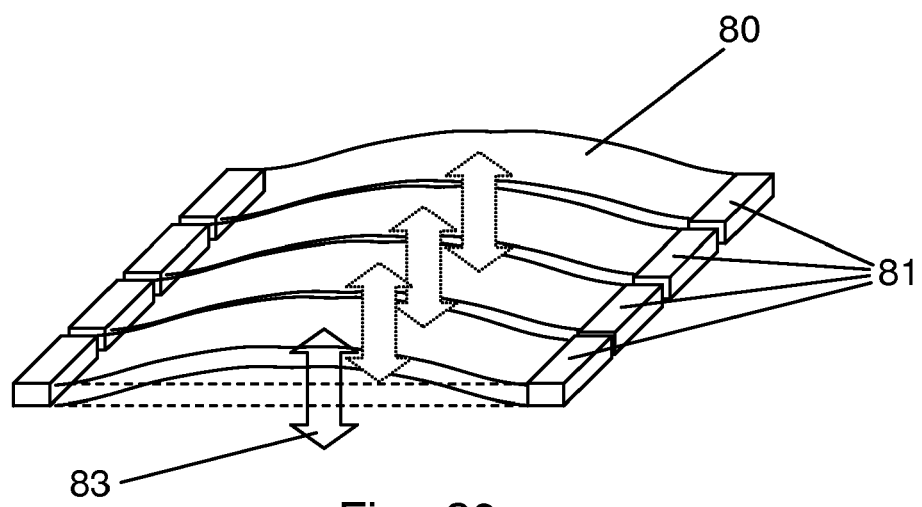
Figure 20D:
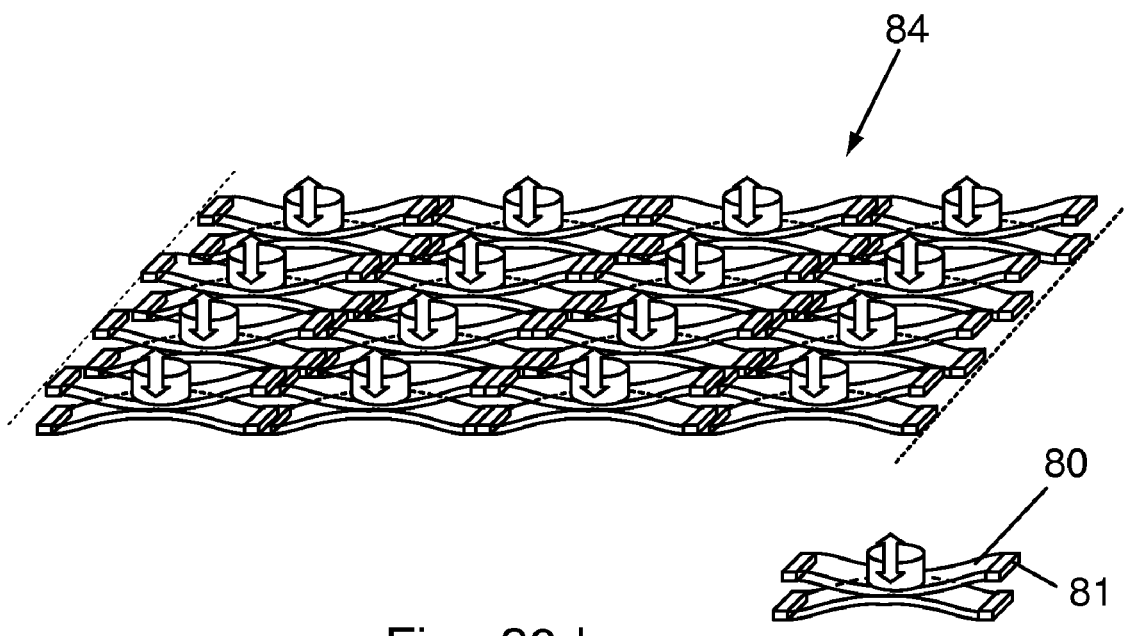
Figure 20E:
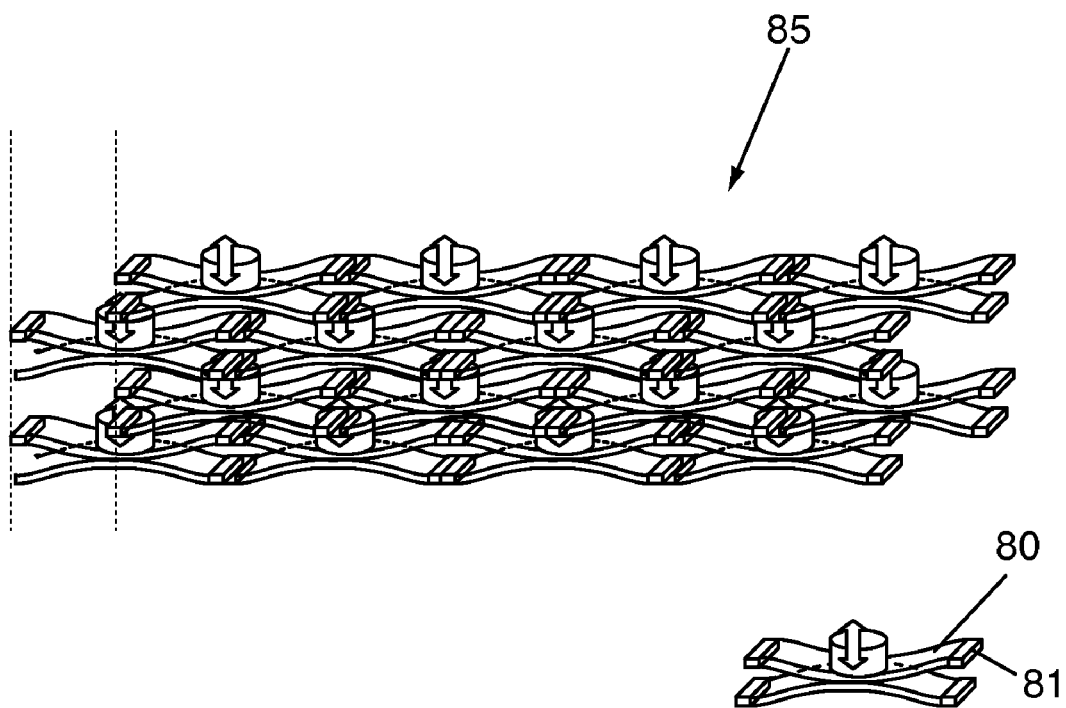

FIGS. 20a-20e illustrate actuating transducers 80 provided with a preload. FIG. 20a is a perspective view of a flat transducer 80 provided with fixation flanges 81. The flat transducer 80 of FIG. 20a is pre-strained by a spring 82. Accordingly, the flat transducer 80 has a direction of actuation indicated by arrows 83. FIG. 20b illustrates a similar flat transducer 80 in which the spring is replaced by a similar second flat transducer 80. FIG. 20c illustrates half of a transducer, the transducer being similar to the transducer of FIG. 20b and dimensioned by the use of a number of identical transducers (only half of them are shown). FIGS. 20d and 20e illustrate two alternative transducers 84 and 85 each comprising a number of flat transducers 80 being pre-strained by adjacent transducers similar to the transducer of FIG. 18b.

The transducers 84 and 85 actuate cross directional, in FIG. 20d in a carpet-like structure and in FIG. 20e in a wall-like structure.

It should be noted that the transducers of FIGS. 18-20 only require pre-strain along one direction, i.e. in the direction of compliance. Thus, a pre-strain in a direction transverse to the direction of compliance, which is necessary in prior art transducers, is not required in transducers according to the present invention.

Figure 21A:
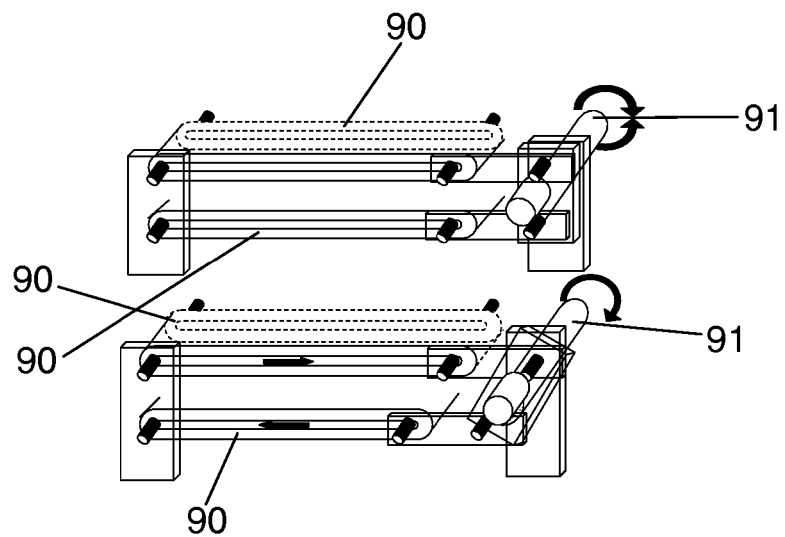
FIGS. 21a and 21b illustrate two actuating transducers having a flat tubular structure, the transducers being provided with mechanical connection.

FIG. 21a illustrates two pre-strained transducers 90 having a flat tubular structure, the transducers 90 actuating in the longitudinal direction and thereby rotating an actuating shaft 91.

Figure 21B:
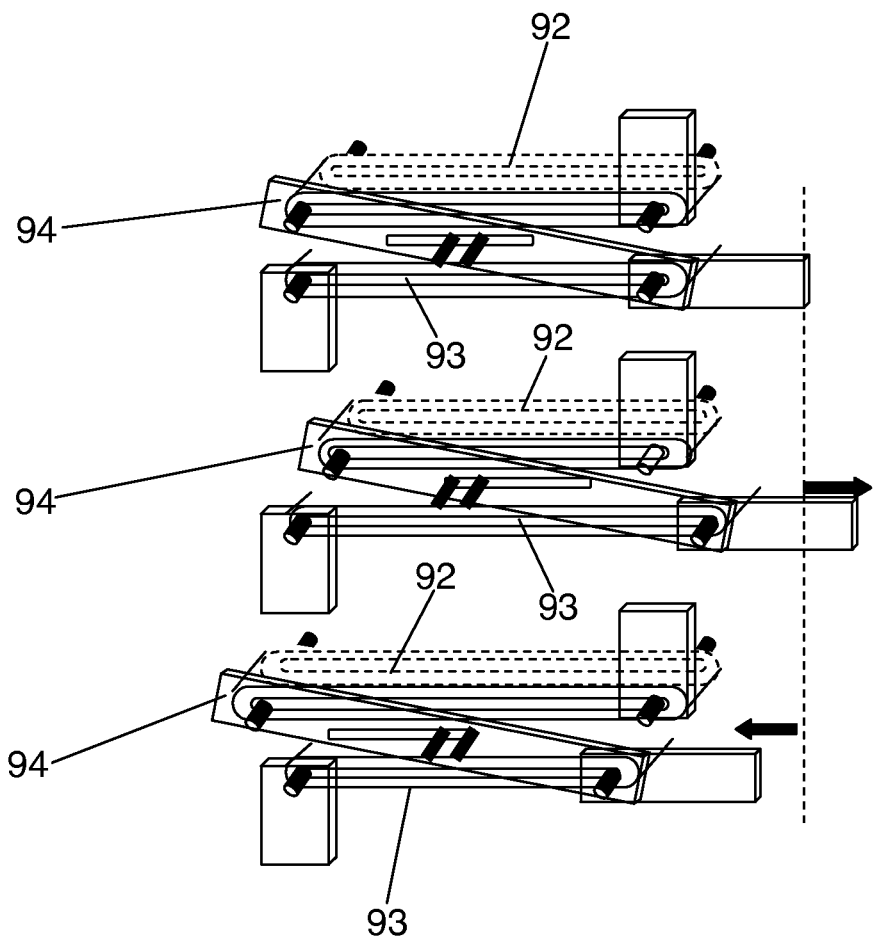

FIG. 21b illustrates two mechanically pre-strained flat transducers 92, 93 provided with mechanical connection 94, which is supported by a guiding element for sliding purposes. The transducers 92, 93 are shown in three situations. In the first situation neither of the transducers 92, 93 are active. However, they are both mechanically pre-strained. In the second situation, transducer 93 is active. Since the transducer 92 is inactive, the transducer 93 causes transducer 92 to relax, thereby releasing some of the mechanical pre-strain of transducer 92. In the third situation transducer 92 is active while transducer 93 is inactive. Transducer 92 thereby causes transducer 93 to relax, thereby releasing some of the mechanical pre-strain of transducer 93. Thus, the transducers 92, 93 in combination with the mechanical connection 94 form a double-acting transducer in which one of the transducers causes the other transducer to relax and release mechanical pre-strain.

Figure 22:
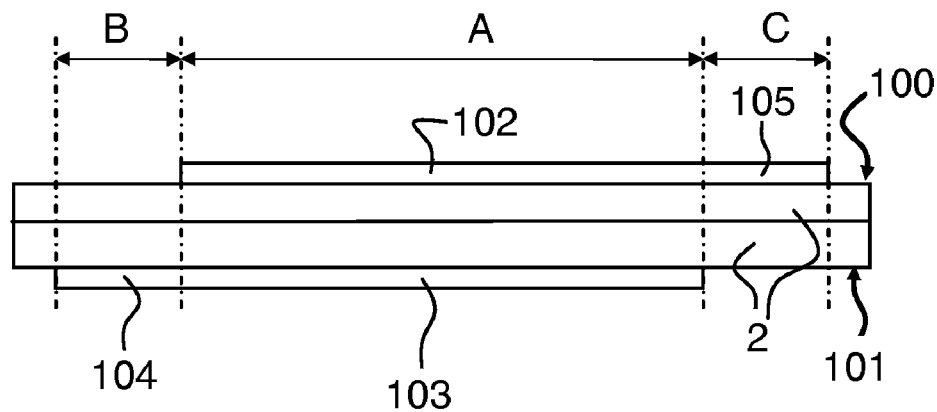
FIG. 22 illustrates the principle of space-shifted laminated layers of composites.

FIG. 22 illustrates an electroactive composite comprising a dielectric film 2 with a first surface 100 and a second surface 101 being opposite to the first surface 100. Both surfaces of the dielectric film 2 are partly covered with an electrically conductive layer. Due to the shape and location of the electrically conductive layers, an active portion A exists, in which electrode portions 102, 103 of the electrically conductive layers cover both surfaces 100, 101 of the dielectric film 2. The electrically conductive layers further define a first passive portion B in which only the second surface 101 of the dielectric film 2 is covered by a contact portion 104 of one of the conductive layers and a second passive portion C in which only the first surface 100 of the dielectric film 2 is covered by a contact portion 105 of the other conductive layer. As it appears, the electroactive composite can be electrically connected to a power supply or connected to control means for controlling actuation of the composite by bonding conductors to the contact portions 104, 105. Even if the illustrated composite is laminated, rolled, or folded to form a transducer with a large number of layers, the electrode portions 102, 103 may easily be connected to a power supply e.g. by penetrating the layers in each contact portion 104, 105 with an electrically conductive wire or rod and by connecting the wire or rod to the power supply. The ratio between the thickness of the dielectric film 2 and the thickness of the electrically conductive layers is merely for illustration purposes. The process illustrated in FIG. 22 may be referred to as 'off-set', since the contact portions 104, 105 are provided by applying the electrode portions 102, 103 on the surfaces 100, 101 of the dielectric film 2 'off-set' relatively to each other.

Figure 23:
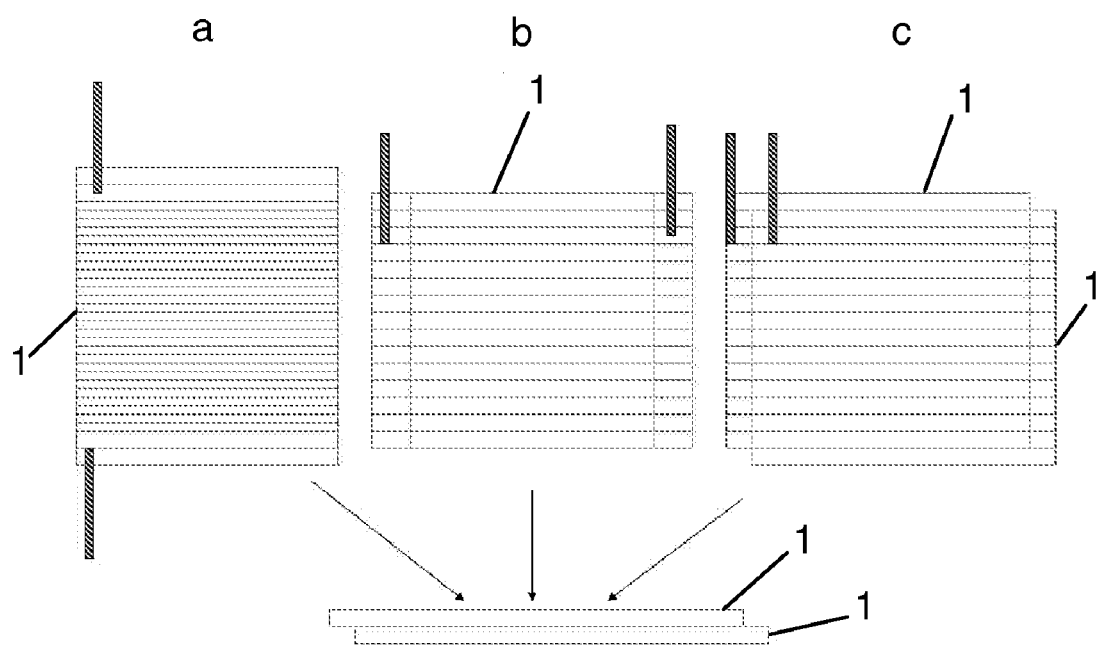
FIG. 23 illustrates laminated electroactive multilayer composites provided with electrical contact portions and electrical connectors.

FIGS. 23a-23c illustrate three different ways of space shifting two composites 1 of a multilayer composite forming a transducer where each composite 1 comprises an electrically conductive layer on a dielectric film. The illustrated composites 1 have a compliance direction in which they expand or contract when the transducer is activated. In FIG. 23a, the contact portions are space shifted along the compliance direction, in FIG. 23b, the contact portions are space shifted perpendicular to the compliance direction, and in FIG. 23c, the contact portions are space shifted both in the compliance direction and in a direction being perpendicular to the compliance direction. In any of the configurations, it is desired to keep the region where the physical contact is made between the multilayer composite and the connecting wire, rod or similar conductor away from any source of stress or moving parts. FIG. 23d illustrates the multilayer composite in a side view.

Thus, FIGS. 22 and 23a-23c illustrate two different principles for providing contact portions 104, 105, i.e. the 'off-set' principle in FIG. 22 and the 'space shifting' principle in FIGS. 23a-23c. These principles may be combined with various lamination processes, and a principle which is appropriate for the intended application may accordingly be chosen.

Figure 24:
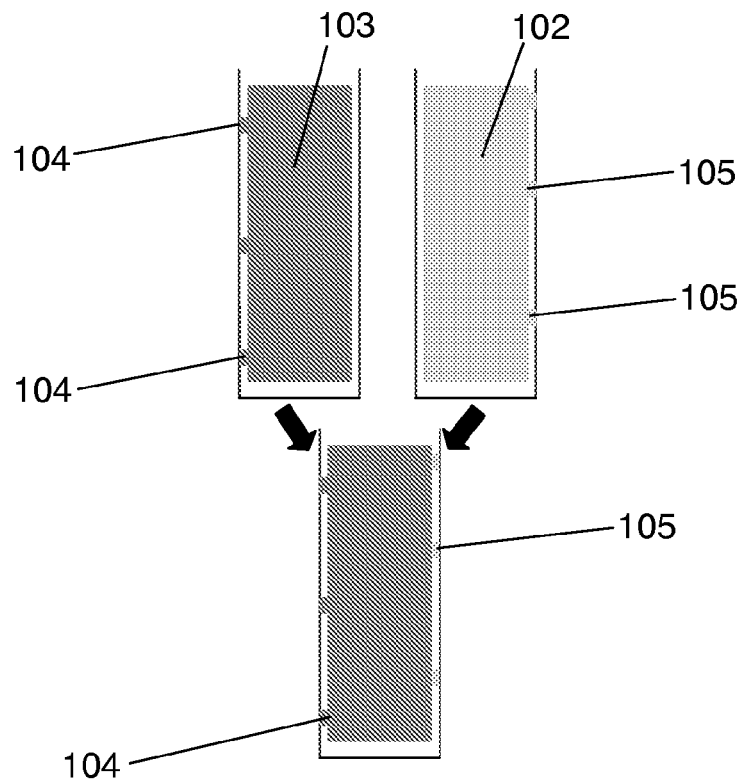
FIGS. 24 and 25 illustrate two examples of electroactive multilayer composites provided with electrical contact portions.

FIG. 24 illustrates that contact portions 104, 105 form part of electrically conductive layers and form extension islands on one side of the electrode portions 102 and 103. The islands of two adjacent composites in a multilayer composite are located differently so that the contact portions 104, 105 of adjacent composites are distant from each other.

Figure 25:
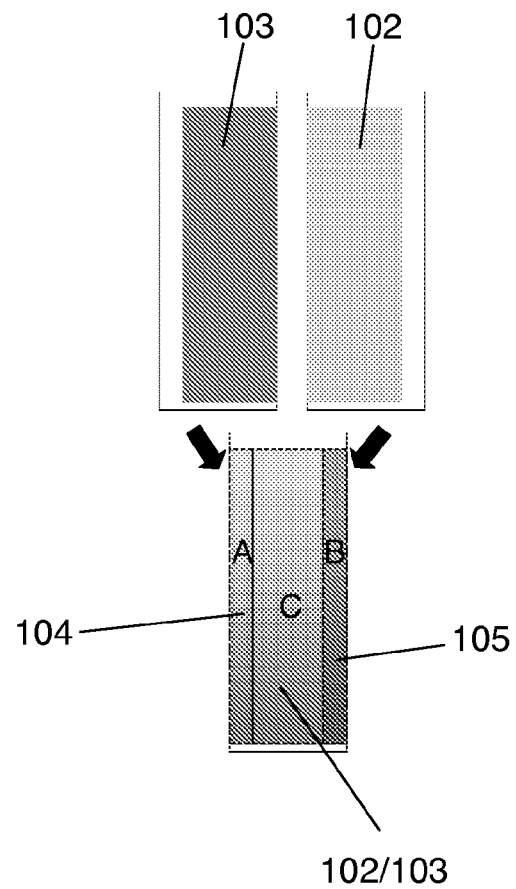

FIG. 25 illustrates two composites each provided with an electrically conductive layer. When the composites are joined in a multilayer structure, they are offset relative to each other so that a portion of the electrically conductive layer on each composite forms a contact portion 104 being distant from the corresponding contact portion 105 on the other composite.

FIGS. 26 and 27 illustrate tubular transducers 50 as shown also in FIGS. 15a and 15b. The tubular transducers are connected to a power supply at the indicated contact portions 104, 105.

FIG. 28 illustrates a transducer 110 with a flat tubular structure. The transducer comprises contact portions 104, 105 on an inner surface. The contact portions may be connected to a power supply e.g. via one of the elongated rods 111 with electrically conductive contact portions. The rod 111 is shown in an enlarged view in FIG. 29 in which it can be seen that the rod 111 comprises two contact portions 112, 113 which come into contact with the contact portions 104, 105 of the flat tubular structure when the rod 111 is inserted into the tubular structure. The rods 111 could form part of a device on which the transducer operates. Both space-shifted and off-set electrode principles can be applied in contacting the above described transducer structure.

Figure 30:
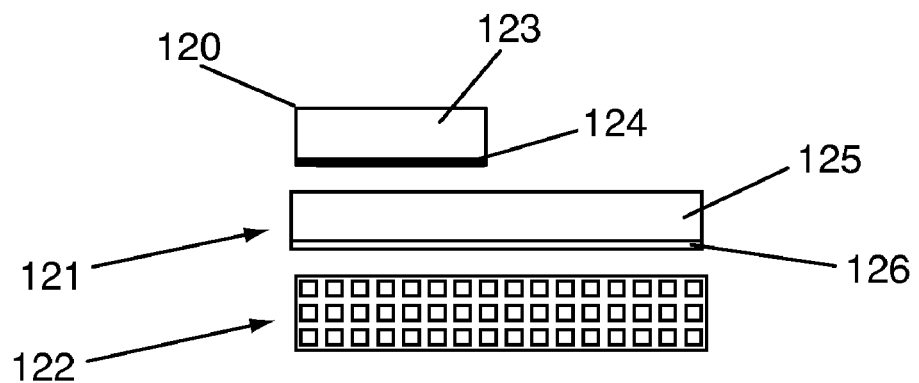
FIG. 30 illustrates different electrical connectors.

FIG. 30 shows three different kinds of connectors, i.e. a soft connector 120, a metal coated plastic connector 121, and a metal or metal coated grid strip connector 122. The soft connector 120 comprises an elastomer film 123 coated with a layer of electrically conductive material 124. Similarly, the metal coated plastic connector 121 comprises a plastic portion 125 coated with a metal layer 126.

FIGS. 31-35 illustrate composites 1 provided with electrical contacts. Since the composite 1 of the present invention is very soft, it is a challenge to join the composite 1 to a somewhat stiffer normal electrical connector, such as a wire, a strip, a grid, etc.

Figure 31:
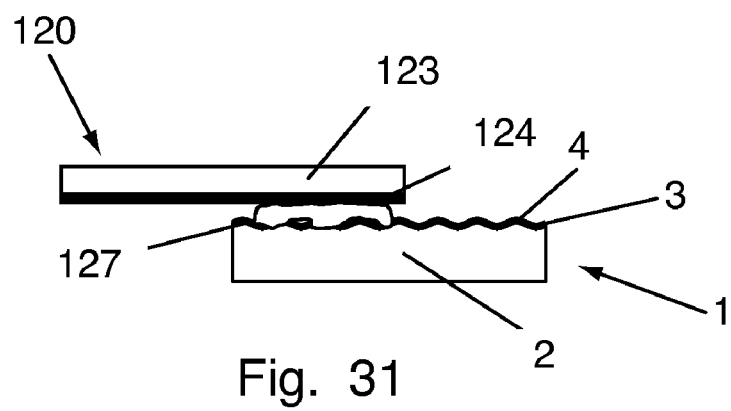
FIGS. 31-35 illustrate electroactive composites provided with contact electrodes.

FIG. 31 shows a soft connector 120 connected to a composite 1 comprising a dielectric film 2 with a corrugated surface 3 provided with a layer of electrically conductive material 4. The electrically conductive parts 124, 4 of the soft connector 120 and the composite 1, respectively, have been joined via a layer of electrically conductive adhesive 127, thereby electrically connecting the composite 1 and the soft connector 120.

Figure 32:
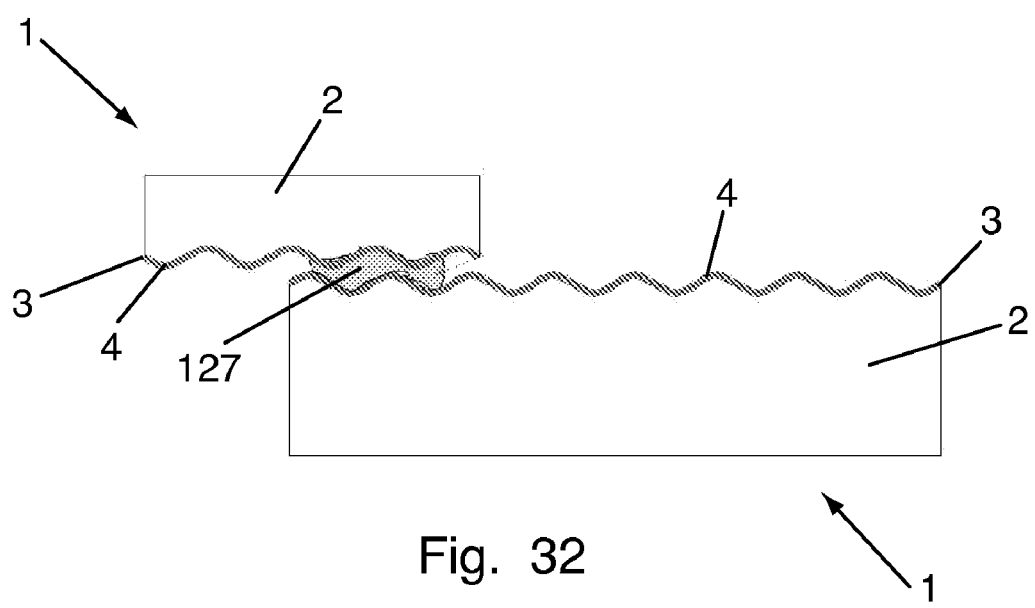

FIG. 32 shows two composites 1 having been joined as described above, i.e. via a layer of electrically conductive adhesive 127, and the composite 1 positioned on top is used as main electrode to a power supply.

Figure 33:
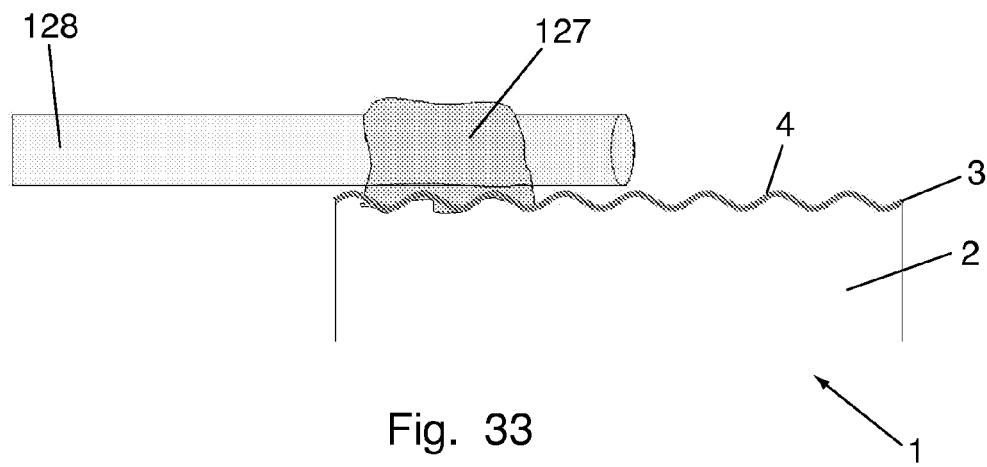

FIG. 33 shows a metal or metal coated wire or strip 128 connected to a composite 1. The metal or metal coated wire or strip 128 is adapted to be connected to a main power supply. Similarly to what is described above, the metal or metal coated wire or strip 128 is joined to the electrically conductive layer 4 of the composite 1 by means of an electrically conductive adhesive 127. However, in this case the electrically conductive adhesive 127 is arranged in such a manner that it surrounds a periphery of the metal or metal coated wire or strip 128, thereby providing a very efficient electrical contact between the metal or metal coated wire or strip 128 and the electrically conductive layer 4 of the composite 1.

Figure 34:
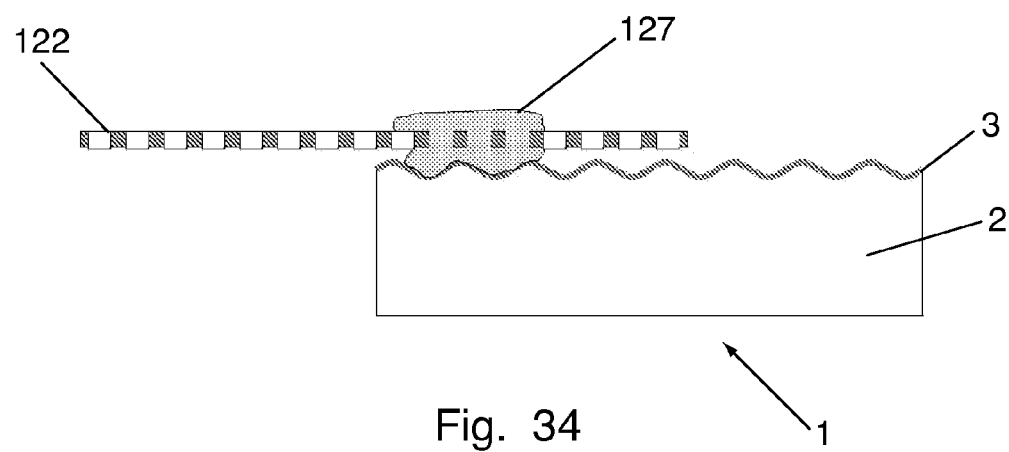

FIG. 34 shows a metal or metal coated grid strip connector 122 connected to a composite 1 via an electrically conductive adhesive 127. As described above with reference to FIG. 33, the electrically conductive adhesive 127 is arranged in such a manner that a part of the metal or metal coated grid strip connector 122 is completely surrounded, thereby providing a very good electrical contact.

Figure 35:
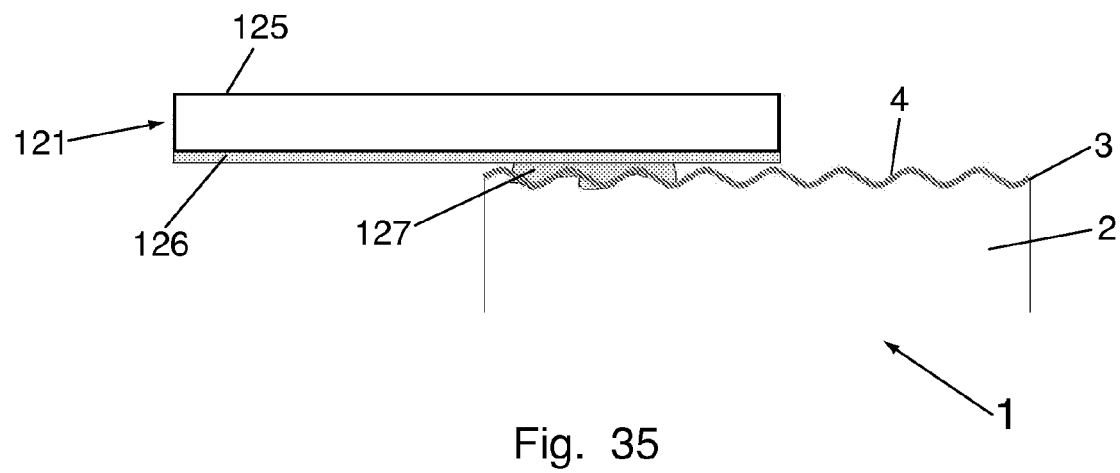

FIG. 35 shows a metal coated plastic connector 121 connected to a composite 1 via a layer of electrically conductive adhesive 127. As described above with reference to FIGS. 31 and 32, the layer of electrically conductive adhesive 127 is arranged between the metal layer 126 of the metal coated plastic connector 121 and the electrically conductive layer 4 of the composite 1, thereby providing electrical contact there between.

Figure 36A:
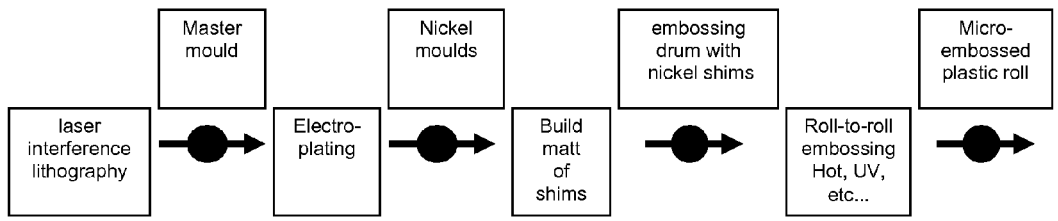
FIGS. 36a-36c is a process diagram describing a manufacturing process of a transducer according to an embodiment of the invention.
Figure 36B:
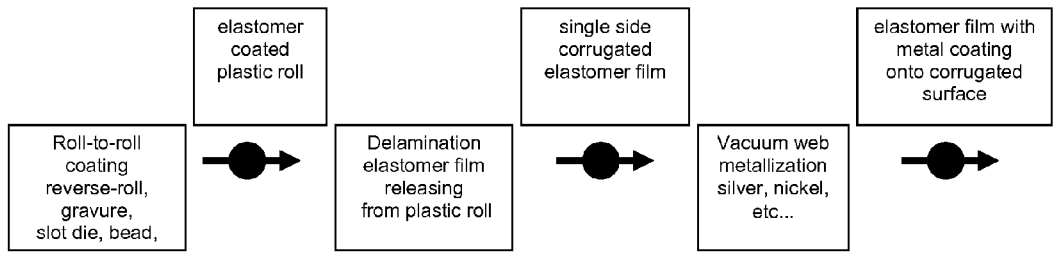
Figure 36C:
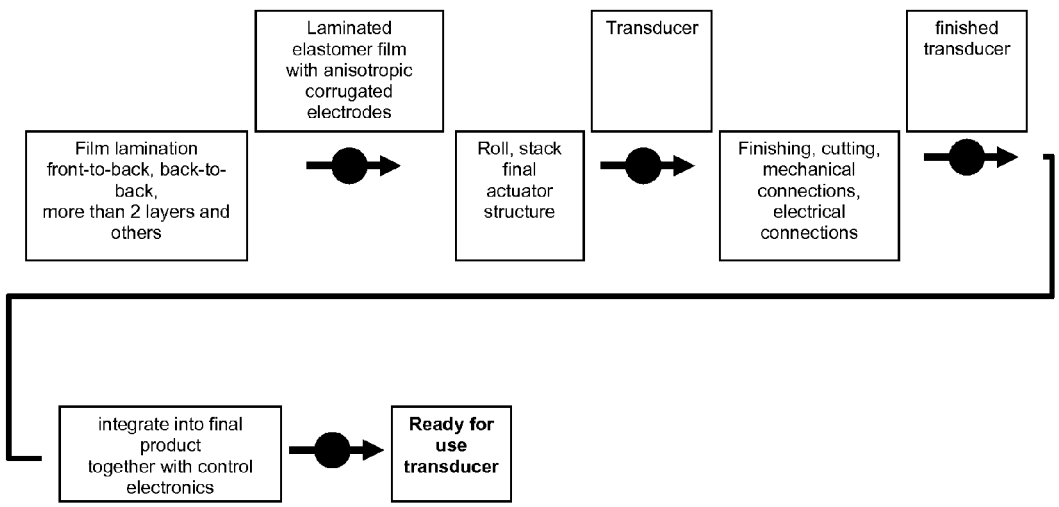

FIG. 36a illustrates the process of manufacturing a tool or mould for the process of making the composite, e.g. a composite 1 as illustrated in FIG. 1. FIG. 36b illustrates the process of manufacturing the composite by use of the tool, and FIG. 36c illustrates the process of making a transducer from the composite.

Thus, we start the process by making a master mould having the desired corrugation profile. We may fabricate the mould by laser interference lithography on photoresist coated glass, or by standard photolithography on silicon wafers.

For the standard photolithography on silicon wafers, the exposure mask is relatively simple and may preferably exhibit equally spaced and parallel lines, e.g. having a width of 5 μm and a spacing of 5 μm. Standard silicon micromachining recipes are then used to etch the silicon in order to form so-called V-grooves, i.e. grooves having a cross sectional shape resembling a 'V'. A series of oxidation and hydrofluoric acid etching steps are then performed to transform the V-grooved structures into quasi-sinusoidal corrugations, if this is the desired shape.

We can fabricate master moulds of a relatively large size, such as up to 32 cm×32 cm, by means of laser interference lithography. In laser interference lithography two laser beams, each with an expanded spot size and with uniform energy distribution across the beam cross section, are caused to interfere onto a photoresist coated glass substrate. Such a process does not require any exposure mask, and relies on the interference phenomenon known in the field of optics. The result of exposure, development and, finally, hard-baking, is a direct sinus waveform profile written onto the photoresist, where profile period and amplitude are determined by the laser beam wavelength, the incidence angles of the laser beams onto the photoresist, and the thickness of the photoresist.

In the next step of the process as illustrated in FIG. 36, we use standard stress-free electroplating processes to fabricate a sufficient number of nickel copies or moulds necessary in order to obtain replication of corrugated microstructures onto plastic rolls. These nickel replicas also called shims have a thickness in the 100 micrometer range. These shims are mechanically attached in a serial configuration to form a "belt" having a total length which is precisely set to match the circumference of the embossing drum. Use of thin shims facilitates bending them without building too much stress and subsequently rolling the "belt" around the drum circumference. Each shim is placed with respect to its neighbours in such a way that corrugation lines are adjusted with micrometer accuracy for minimising any angular misalignment between lines of neighbouring shims. Then the corrugated microstructures of the embossing drums, resulting from the nickel moulds, are accurately replicated onto plastic rolls. We may do so by means of roll-to-roll micro embossing (UV or heat curing). Roll-to-roll embossing allows for the production of rolls of micro-embossed plastic material having lengths in the range of hundreds of meters. We use the micro-embossed plastic rolls as carrier web, e.g. in the form of a belt or a mould, for the production of dielectric films having single-surface or double-surface corrugations, e.g. elastomer films having lengths in the range of hundreds of meters.

We fabricate corrugated elastomer films or sheets of limited size by well known spin coating. It is a discontinuous process, and the maximum size of the film or sheet is determined by the size of the mould. Alternative types of production processes are the kinds developed for the polymer industry, such as adhesive tapes, painting, etc., normally referred to as 'roll-to-roll coating' or 'web coating'. These production processes are large scale, large volume, and continuous processes.

In a subsequent step, we fabricate elastomer films using the micro-embossed plastic roll, e.g. using a roll-to-roll, reverse roll, gravure, slot die, bead or any other suitable kind of coating technique. As a result an elastomer coated plastic film is obtained. To this end reverse roll and gravure roll coating techniques are considered the most promising among other known techniques because they offer coatings which are uniform and have a relatively well defined thickness. We select the surface properties of the embossed plastic roll or mould and of the embossing resin in a manner which allows for wetting by the elastomer material. We carry out the production process of the elastomer film in a clean room environment in order to fabricate pinhole-free elastomer films of high quality.

We expose non-cured elastomer film formed onto the mould as described above to heat, ultraviolet light or any other source capable of initiating cross-linking, in order to cause the elastomer film to cure. The chosen source will depend on the type of elastomer material used, in particular on the curing mechanism of the used material.

Then we release the cured film from the mould in a delamination process. To this end appropriate release tooling is used. We may preferably choose mould material and elastomer material to facilitate the releasing process. Very weak adhesion of cured elastomer to the substrate mould is preferred. If very good adhesion occurs, the release process can fail and damage the film. A single-sided corrugated elastomer film roll is the product of this delamination process.

In the next step we deposit the metal electrode onto the corrugated surface of the elastomer film by means of vacuum web metallization. Accordingly, a metal coating, e.g. a coating of silver, nickel, gold, etc., is applied to the corrugated surface. Thus, a composite is formed.

The challenge in the large scale manufacturing of elastomer film having lengths in the range of kilometres is not in the production of flat films, but rather in the production of single-sided or double-sided corrugated film with precise and very well defined micro structures. Another challenge is in handling these very soft materials using controlled tension forces which are several orders of magnitude smaller than the control tension forces normally occurring in the polymer industry. Metallization of a corrugated elastomer film surface with reliable coating layers, when the thickness of a coating layer is only 1/100 of the depth of the corrugated pattern, is yet another challenging issue of the production process.

Next, we laminate the coated elastomer films, the composites, thereby forming a multilayer composite, as described above. Then we roll the multilayer composite to form the final rolled transducer structure. The rolled transducer undergoes finishing and cutting, and electrical connections are applied.

Finally, we may integrate the finished transducer into a final product along with control electronics, and the transducer is ready for use.

Although the present invention has been described with respect to discharge check valve assemblies for scroll compressors, the claimed invention may be easily adapted for used with any pressurized vessel. Further, although this invention has been shown and described with respect to the detailed embodiments thereof, it will be understood by those skilled in the art that various changes in form and detail thereof may be made without departing from the spirit and scope of the invention.

What is claimed is:

1. A composite comprising:
   a film made of a dielectric material and having a first surface and second surface, at least the first surface comprising a surface pattern of raised and depressed surface portions, and
   a first electrically conductive layer being deposited onto the surface pattern, the electrically conductive layer having a corrugated shape which is formed by the surface pattern of the film,
   wherein the raised and depressed surface portions have a shape and/or size which varies periodically along at least one direction of the first surface, the raised and depressed surface portions defining a repeated sub-pattern several wavelengths long.

2. The composite according to claim 1, wherein the electrically conductive layer has a modulus of elasticity being higher than a modulus of elasticity of the film.

3. The composite according to claim 1, provided as a web of having a length greater than 100 meters.

4. The composite according to claim 1, wherein the dielectric material is a polymer material.

5. The composite according to claim 1, wherein the dielectric material has elastomeric properties.

6. The composite according to claim 1, wherein the film has a largest thickness which is less than 110 percent of an average thickness of the film.

7. The composite according to claim 1, wherein the film has a smallest thickness which is at least 90 percent of an average thickness of the film.

8. The composite according to claim 1, wherein the first electrically conductive layer has a largest thickness which is less than 110 percent of an average thickness of the first electrically conductive layer.

9. The composite according to claim 1, wherein the first electrically conductive layer has a smallest thickness which is at least 90 percent of an average thickness of the first electrically conductive layer.

10. The composite according to claim 1, wherein the surface pattern comprises waves forming troughs and crests extending in essentially one common direction, each wave defining a height being a shortest distance between a crest and neighbouring troughs.

11. The composite according to claim 10, wherein the waves have a shape which is periodically repeated.

12. The composite according to claim 10, wherein an average height of the waves is between 1/3 and 20 µm.

13. The composite according to claim 12, wherein each wave defines, a largest wave having a height of at most 110 percent of the average wave height.

14. The composite according to claim 12, wherein each wave defines a smallest wave having a height of at least 90 percent of the average wave height.

15. The composite according to claim 10, wherein the film has an average thickness being between 10 and 200 µm.

16. The composite according to claim 10, wherein a ratio between an average height of the waves and an average thickness of the film is between 1/50 and 1/2.

17. The composite according to claim 10, wherein the waves have a wavelength defined as the shortest distance between two crests, and wherein a ratio between an average height of the waves and an average wavelength is between 1/30 and 2.

18. The composite according to claim 10, wherein a ratio between an average thickness of the first electrically conductive layer and an average height of the waves is between 1/1000 and 1/50.

19. The composite according to claim 1, wherein the first electrically conductive layer has a thickness in the range of 0.01-0.1 µm.

20. The composite according to claim 1 and being substantially longer in a lengthwise direction than in a perpendicular crosswise direction.

21. The composite according to claim 20, wherein the surface pattern defines a compliance direction in which the composite is mostly compliant, wherein the compliance direction forms an angle between 0 and 90 degrees to the lengthwise direction.

22. The composite according to claim 21, wherein the composite has a compliance in the compliance direction which is at least 50 times larger than its compliance in a direction being at least substantially perpendicular to the compliance direction.

23. The composite according to claim 20, wherein the surface pattern forms wave crests and troughs extending essentially in the lengthwise direction.

24. The composite according to claim 20, wherein the surface pattern forms wave crests and troughs extending essentially in the crosswise direction.

25. A transducer comprising a composite according to claim 1.

26. The composite according to claim 1, wherein the film has a surface with a shape which is essentially unaffected by its contact with the first electrically conductive layer.

27. The composite according to claim 26, wherein the composite has a shape which is essentially unaffected by an elastic modulus of the first electrically conductive layer.

28. The composite according to claim 26, wherein the film has a surface with a shape which is essentially unaffected by the thickness of the first electrically conductive layer.

29. The composite according to claim 1, wherein the film has a surface with a shape which is essentially unaffected by an elastic modulus of the film.

30. The composite according to claim 29, wherein the film has a surface with a shape which is essentially unaffected by the thickness of the film.

31. The composite according to claim 1 comprising a second electrically conductive layer arranged on an opposite surface of the film relative to the first electrically conductive layer to form an electroactive composite.

32. The composite according to claim 1, wherein the second surface comprises a surface pattern covered by an electrically conductive layer.

33. The composite according to claim 1, wherein the second surface is substantially flat.

34. The composite according to claim 1, wherein a resistivity of the dielectric material is larger than $10^{10}\Omega\cdot cm$.

35. The composite according to claim 1, wherein a resistivity of the electrically conductive material is less than $10^{-4}\Omega\cdot cm$.

36. A multilayer composite comprising at least two layers of composite, each composite layer comprising:
   a film made of a dielectric material and having a front surface and rear surface, the front surface comprising a surface pattern of raised and depressed surface portions, and
   a first electrically conductive layer being deposited onto the surface pattern, the electrically conductive layer having a corrugated shape which is formed by the surface pattern of the film,
   wherein the raised and depressed surface portions have a shape and/or size which varies periodically along at least one direction of the front surface, the raised and depressed surface portions defining a repeated sub-pattern several wavelengths long.

37. The multilayer composite according to claim 36, wherein the raised and depressed surface portions of the surface pattern of the film of each composite layer have a shape and/or a size which varies periodically along at least one direction of the front surface.

38. The multilayer composite according to claim 36, wherein the composite layers are arranged with the rear surfaces towards each other.

39. The multilayer composite according to claim 36, wherein the composite layers are adhesively bonded to each other.

40. The multilayer composite according to any claim 36, wherein the film of each composite layer comprises waves forming crests and troughs extending in one common direction.

41. The multilayer composite according to claim 40, wherein composite layers are arranged relative to each other with crests of one layer adjacent to crests of another layer.

42. The multilayer composite according to claim 40, wherein the composite layers are arranged relative to each other with crests of one layer adjacent to troughs of another layer.

43. A transducer comprising a multilayer composite according to claim 36.

* * * * *